(12) United States Patent
Morimoto et al.

(10) Patent No.: US 9,122,286 B2
(45) Date of Patent: Sep. 1, 2015

(54) INTEGRATED CIRCUIT APPARATUS, THREE-DIMENSIONAL INTEGRATED CIRCUIT, THREE-DIMENSIONAL PROCESSOR DEVICE, AND PROCESS SCHEDULER, WITH CONFIGURATION TAKING ACCOUNT OF HEAT

(71) Applicant: PANASONIC CORPORATION, Osaka (JP)

(72) Inventors: Takashi Morimoto, Osaka (JP); Kouji Kai, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/996,160

(22) PCT Filed: Oct. 22, 2012

(86) PCT No.: PCT/JP2012/006744
§ 371 (c)(1),
(2) Date: Jun. 20, 2013

(87) PCT Pub. No.: WO2013/080426
PCT Pub. Date: Jun. 6, 2013

(65) Prior Publication Data
US 2014/0059325 A1 Feb. 27, 2014

(30) Foreign Application Priority Data

Dec. 1, 2011 (JP) ................. 2011-263913
Dec. 1, 2011 (JP) ................. 2011-263919
Dec. 1, 2011 (JP) ................. 2011-263921

(51) Int. Cl.
*G11C 7/04* (2006.01)
*G05F 5/00* (2006.01)
(Continued)

(52) U.S. Cl.
CPC .............. *G05F 5/00* (2013.01); *G06F 12/0893* (2013.01); *G06F 15/80* (2013.01); *H01L 23/34* (2013.01);
(Continued)

(58) Field of Classification Search
USPC ............................................. 365/211; 712/42
See application file for complete search history.

(56) References Cited

U.S. PATENT DOCUMENTS 6,202,129 B1 * 3/2001 Palanca et al. ................ 711/133
6,493,855 B1 12/2002 Weiss et al.
(Continued)

FOREIGN PATENT DOCUMENTS

JP         10-83347        3/1998
JP      2001-291837       10/2001
(Continued)

OTHER PUBLICATIONS

International Preliminary Report on Patentability and Written Opinion of the International Searching Authority issued Jun. 12, 2014 in International (PCT) Application No. PCT/JP2012/006744.
(Continued)

*Primary Examiner* — Anthan Tran
(74) *Attorney, Agent, or Firm* — Wenderoth, Lind & Ponack, L.L.P.

(57) ABSTRACT

The present invention provides a three-dimensional integrated circuit wherein generation of hot spot which makes a high temperature part as a result of intensively generated heat can be suppressed in. The integrated circuit apparatus comprises: a first circuit made of a memory circuit, a second circuit made of an arithmetic circuit, and a control circuit. The first circuit is partitioned into a plurality of circuit blocks according to the distance from the arranged position of the second circuit, and the control circuit controls the partitioned respective circuit blocks separately.

5 Claims, 41 Drawing Sheets

(51) Int. Cl.
*H01L 25/065* (2006.01)
*G06F 12/08* (2006.01)
*H01L 27/02* (2006.01)
*H01L 27/105* (2006.01)
*H01L 27/11* (2006.01)
*G06F 15/80* (2006.01)
*H01L 23/34* (2006.01)
*H01L 23/00* (2006.01)
*H01L 25/18* (2006.01)

(52) U.S. Cl.
CPC ........ *H01L 25/0657* (2013.01); *H01L 27/0207* (2013.01); *H01L 27/105* (2013.01); *H01L 27/1052* (2013.01); *H01L 27/1116* (2013.01); *G06F 2212/601* (2013.01); *H01L 24/13* (2013.01); *H01L 24/16* (2013.01); *H01L 25/18* (2013.01); *H01L 2224/13025* (2013.01); *H01L 2224/16145* (2013.01); *H01L 2225/06513* (2013.01); *H01L 2225/06541* (2013.01); *H01L 2225/06562* (2013.01); *H01L 2225/06565* (2013.01); *H01L 2225/06589* (2013.01); *H01L 2924/1432* (2013.01); *H01L 2924/1434* (2013.01); *H01L 2924/15311* (2013.01)

(56) References Cited

U.S. PATENT DOCUMENTS

| | | |
|---|---|---|
| 6,584,547 B2 | 6/2003 | Palanca et al. |
| 6,983,388 B2 | 1/2006 | Kaxiras et al. |
| 7,472,302 B2 | 12/2008 | Hu et al. |
| 8,156,348 B2 | 4/2012 | Tani |
| 8,362,626 B2 | 1/2013 | Koike et al. |
| 8,391,040 B2 | 3/2013 | Suzuki et al. |
| 2002/0007441 A1 | 1/2002 | Palanca et al. |
| 2002/0049918 A1 | 4/2002 | Kaxiras et al. |
| 2003/0145241 A1 | 7/2003 | Hu et al. |
| 2005/0230682 A1 | 10/2005 | Hara |
| 2006/0041769 A1 | 2/2006 | Hu et al. |
| 2009/0057915 A1 | 3/2009 | Koike et al. |
| 2009/0138220 A1 | 5/2009 | Bell, Jr. et al. |
| 2009/0313490 A1 | 12/2009 | Tani |
| 2011/0173400 A1 | 7/2011 | Isono |
| 2011/0267864 A1 | 11/2011 | Suzuki et al. |
| 2011/0286274 A1* | 11/2011 | Chang et al. ............ 365/185.17 |
| 2012/0166824 A1 | 6/2012 | Tani |

FOREIGN PATENT DOCUMENTS

| | | |
|---|---|---|
| JP | 2002-510085 | 4/2002 |
| JP | 2004-240669 | 8/2004 |
| JP | 2005-167159 | 6/2005 |
| JP | 2005-328026 | 11/2005 |
| JP | 2007-317213 | 12/2007 |
| JP | 2009-54850 | 3/2009 |
| JP | 2009-134716 | 6/2009 |
| JP | 2011-216806 | 10/2011 |
| JP | 2011-233842 | 11/2011 |
| WO | 2006/117950 | 11/2006 |
| WO | 2010/035426 | 4/2010 |

OTHER PUBLICATIONS

International Search Report issued Jan. 22, 2013 in International (PCT) Application No. PCT/JP2012/006744.

Krisztian Flautner et al., "Drowsy Caches: Simple Techniques for Reducing Leakage Power", Proceedings of the 29th Annual International Symposium on Computer Architecture (ISCA'02), 2002, pp. 148-157.

* cited by examiner

Fig.1
(a)
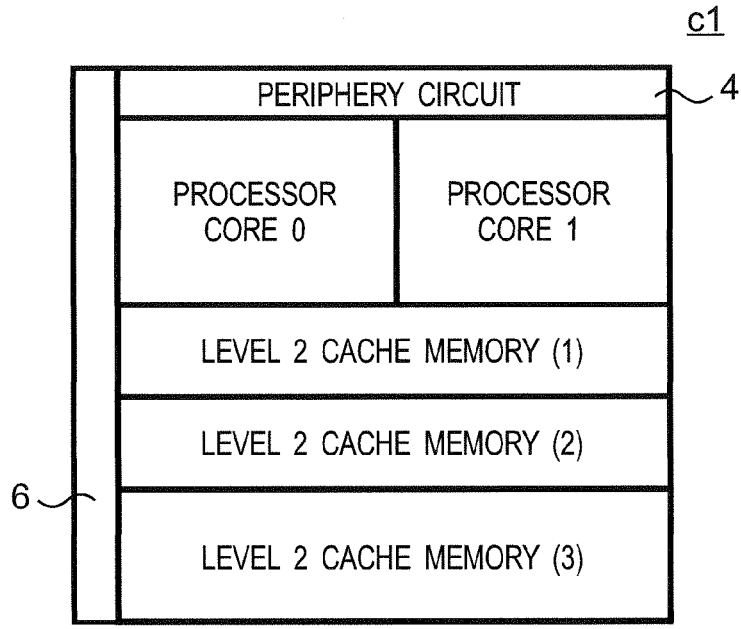
(b)
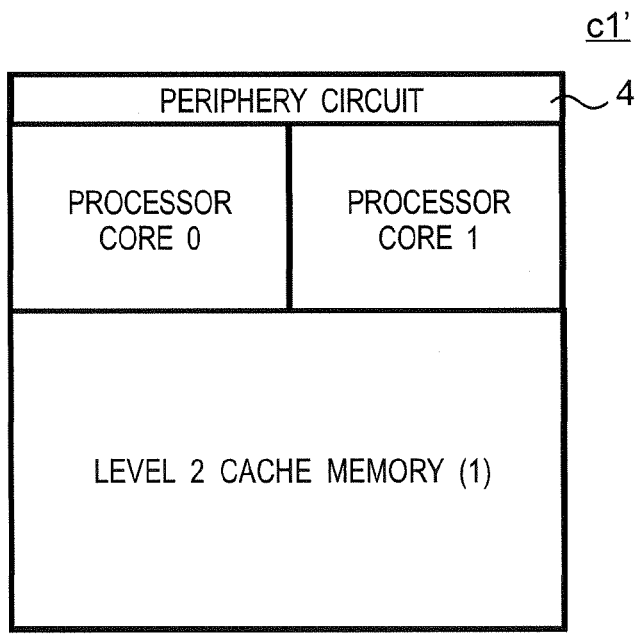

Fig. 2
(a)
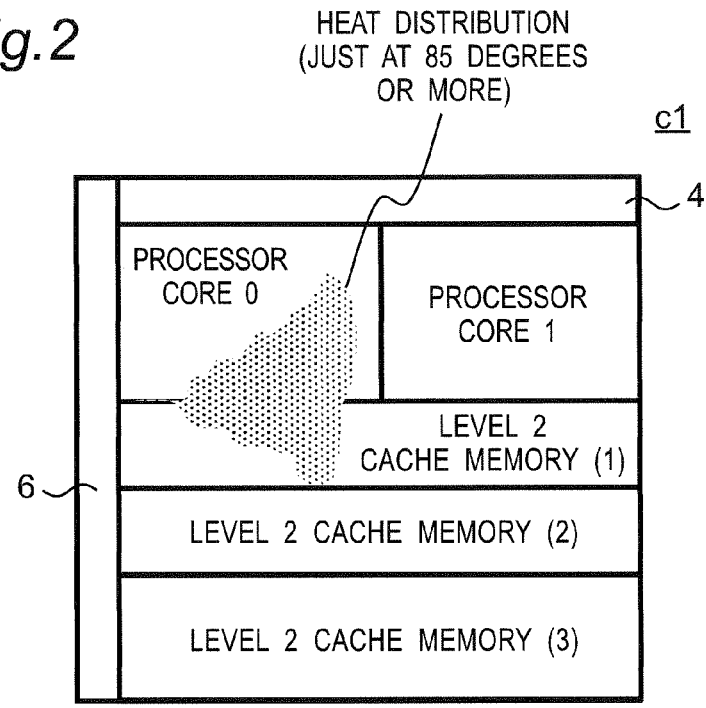
(b)
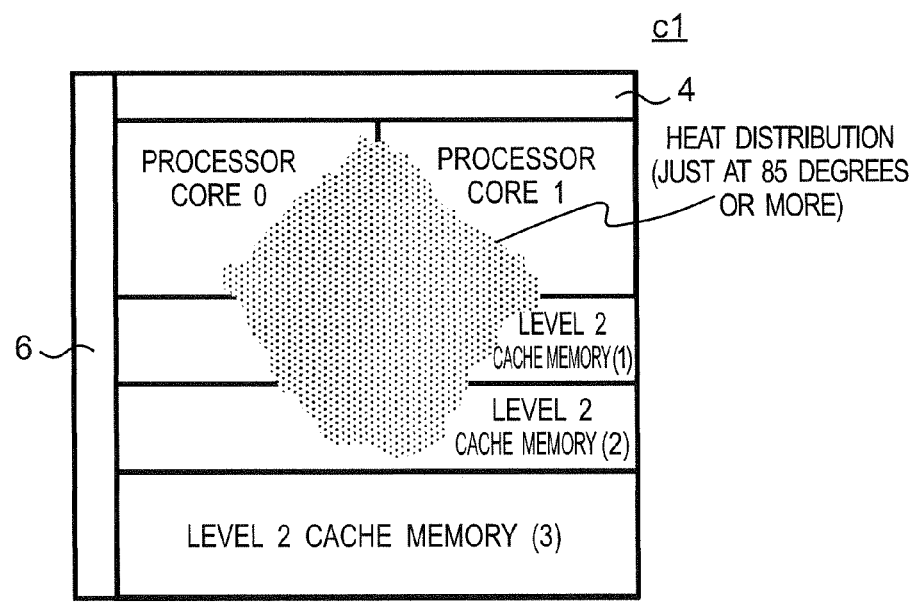

Fig.3
(a)
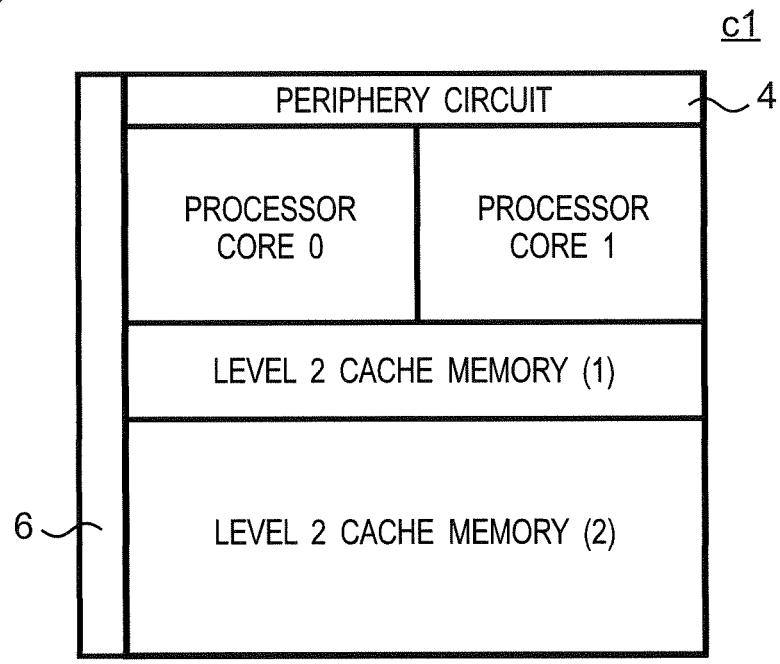
(b)
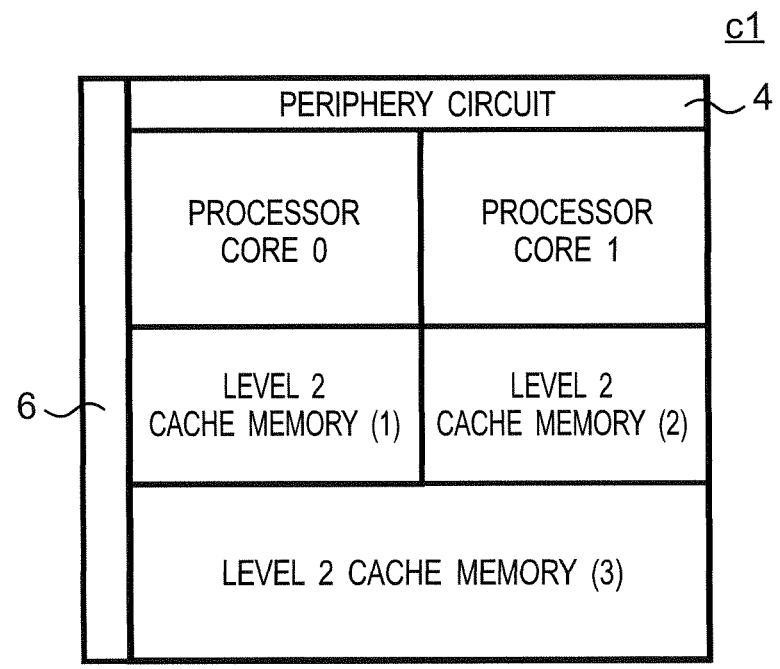

Fig.11
(a)
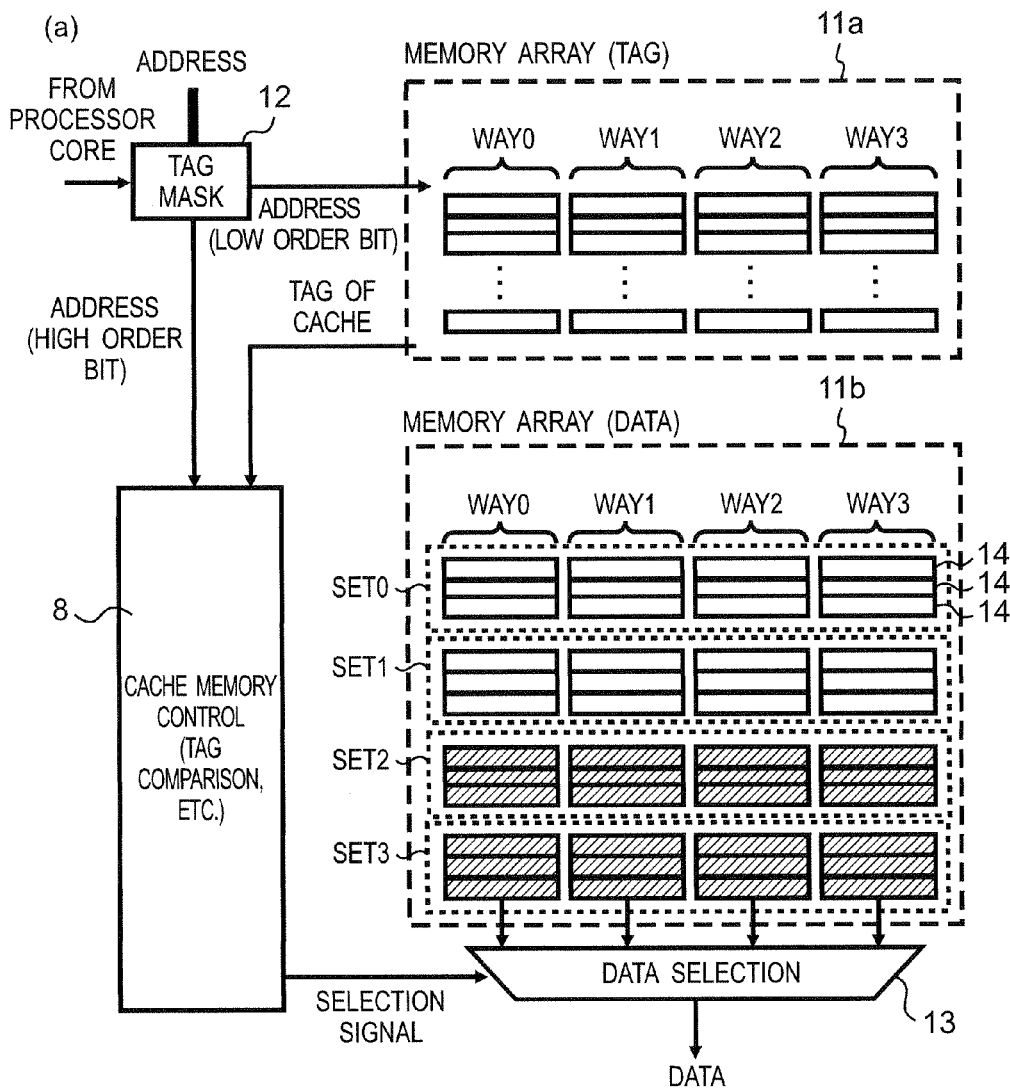
(b)
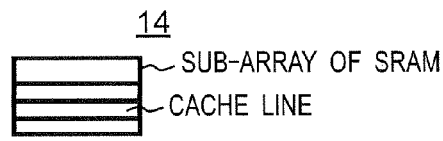

Fig. 25
(a)
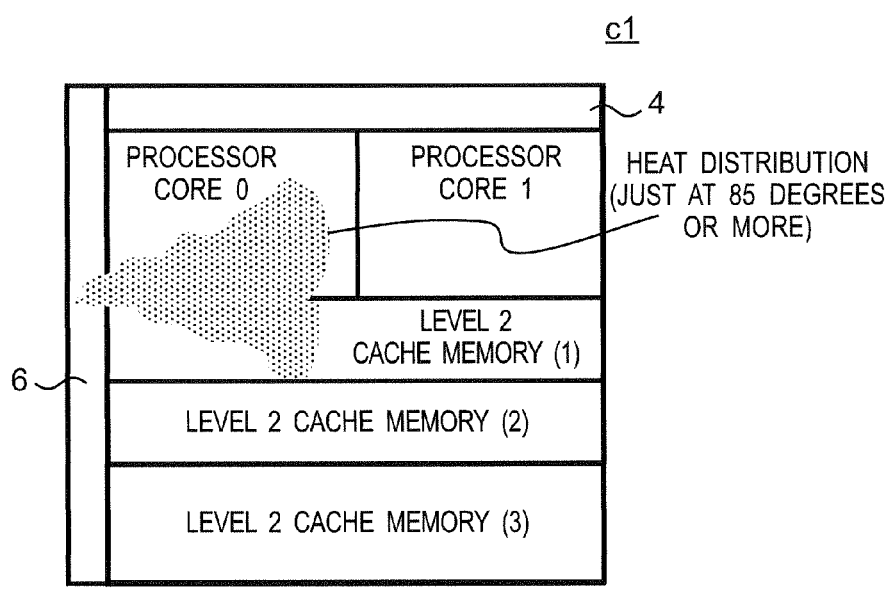
(b)
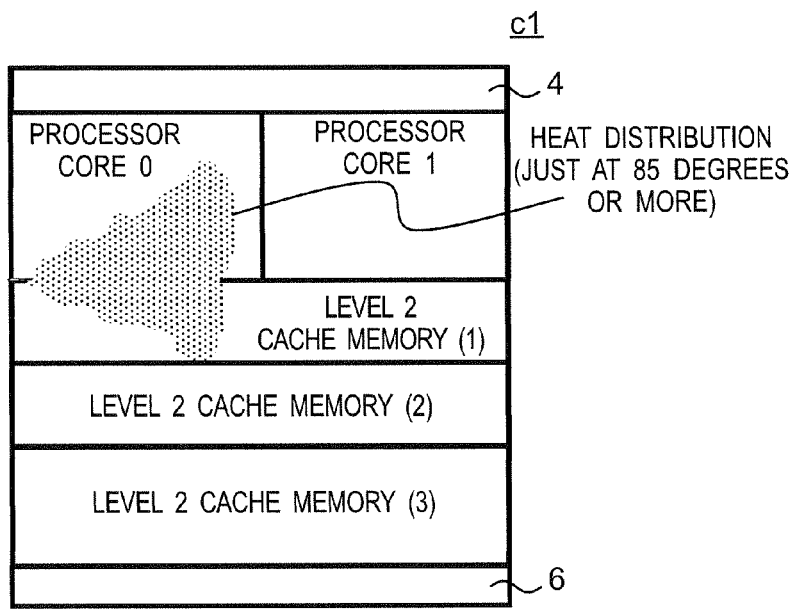

Fig.27
(a)
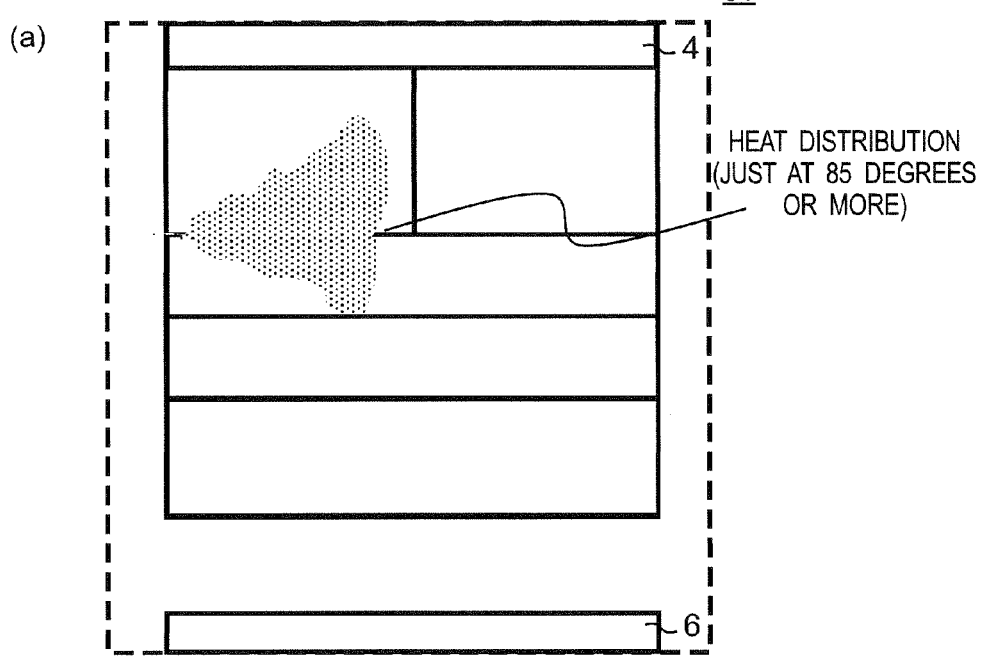
HEAT DISTRIBUTION (JUST AT 85 DEGREES OR MORE)
(b)
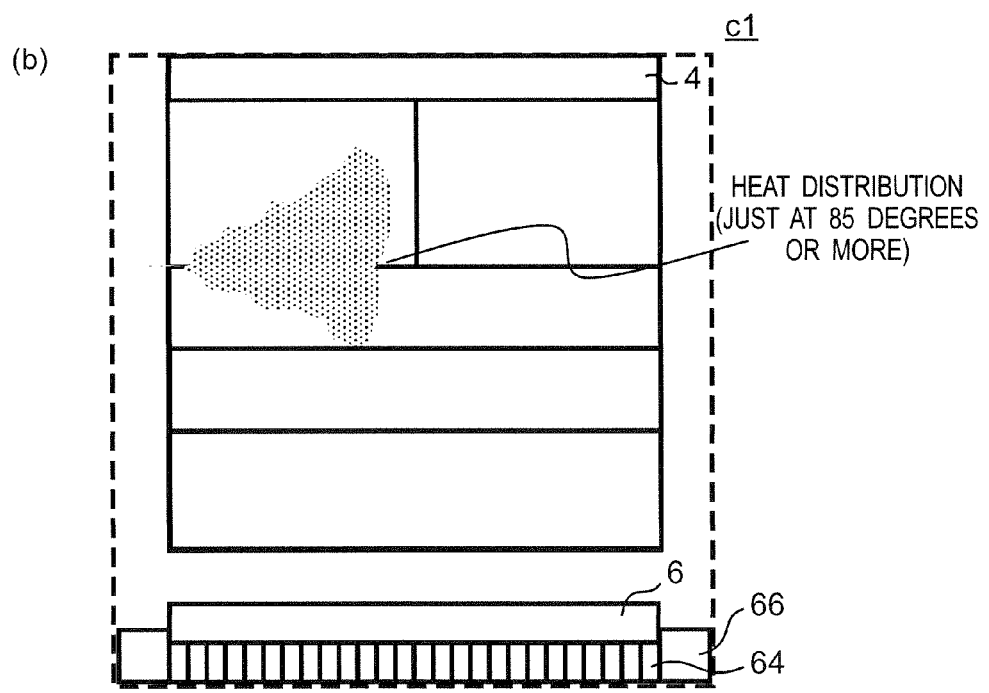
HEAT DISTRIBUTION (JUST AT 85 DEGREES OR MORE)

Fig.30
(a)
| PRODUCT RANGE | NUMBER OF STACKED CHIPS | NUMBER OF CORES |
|---|---|---|
| (b-1)LOW END | 1 | 4 |
| (b-2)MIDDLE RANGE | 2 | 8 |
| ((b-3)HIGH END | 4 | 16 |
(b-1) 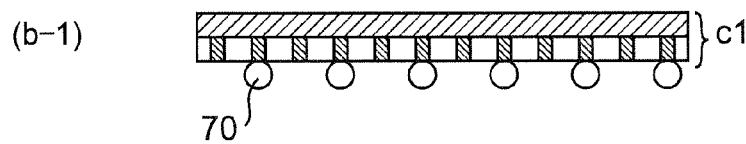
(b-2) 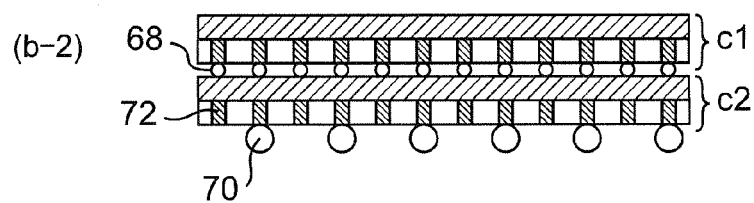
(b-3) 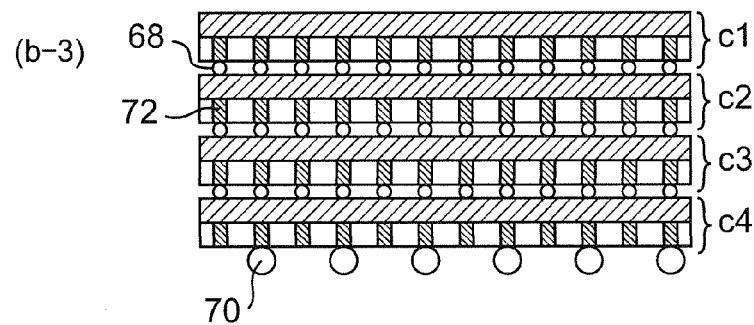

Fig.31
(a)
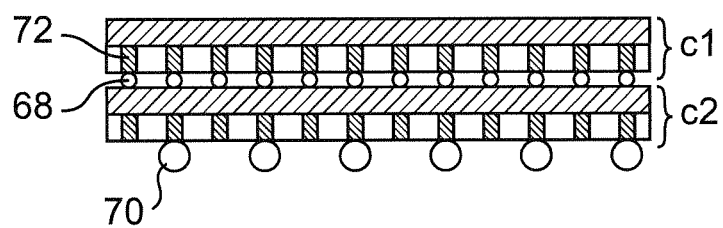
(b)
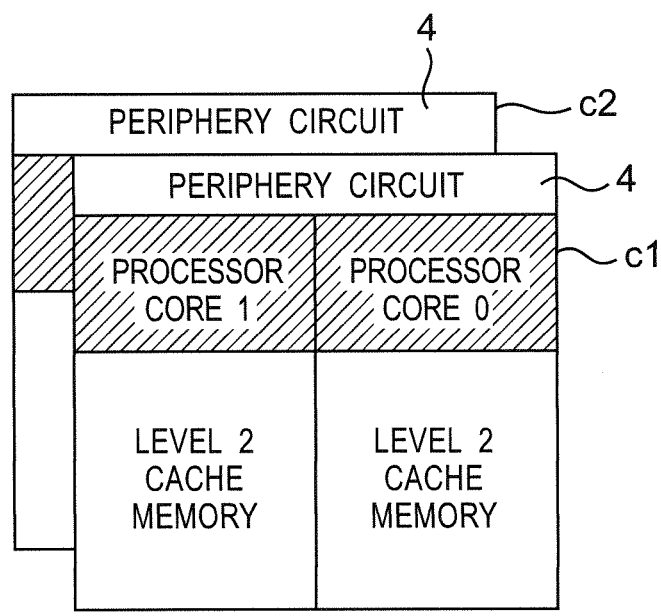

Fig.32
(a)
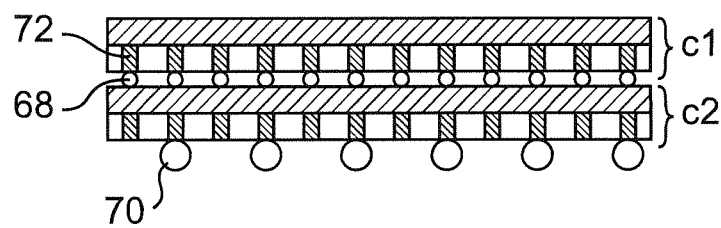
(b)
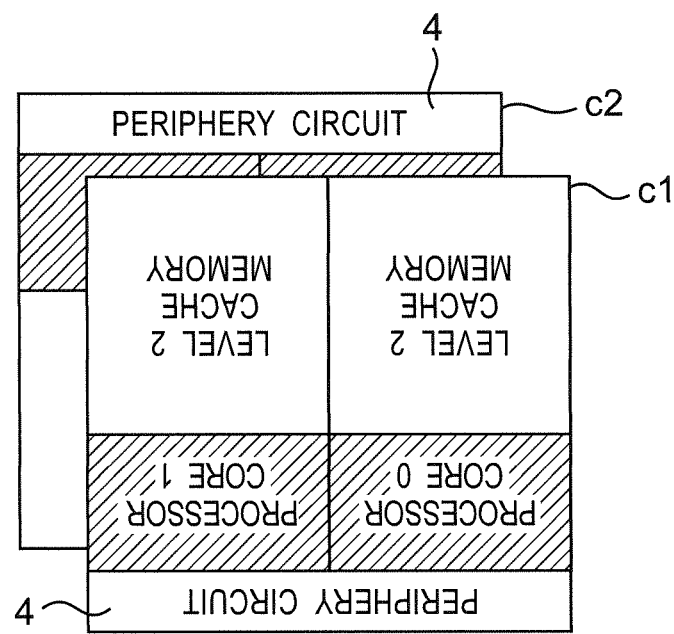

Fig.33
(a)
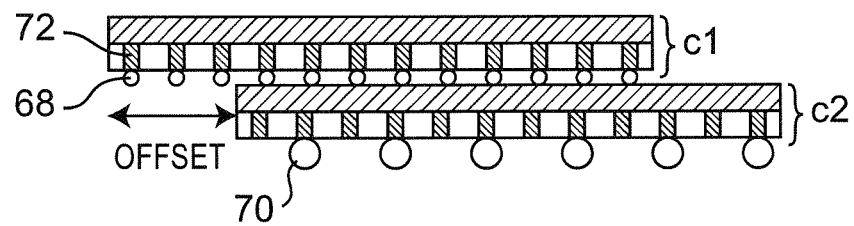
(b)
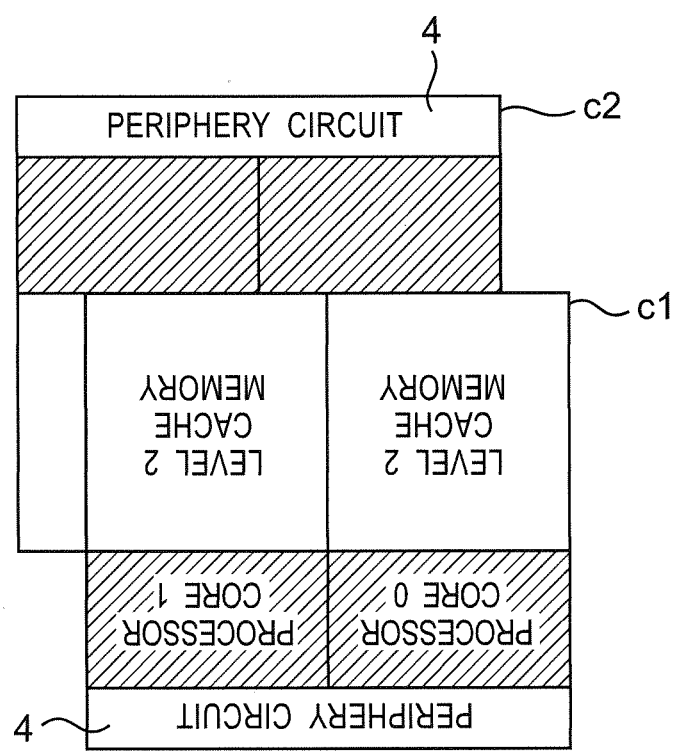

Fig.39
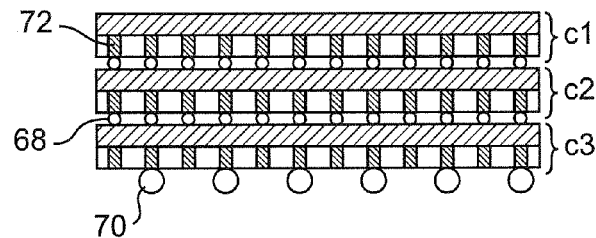
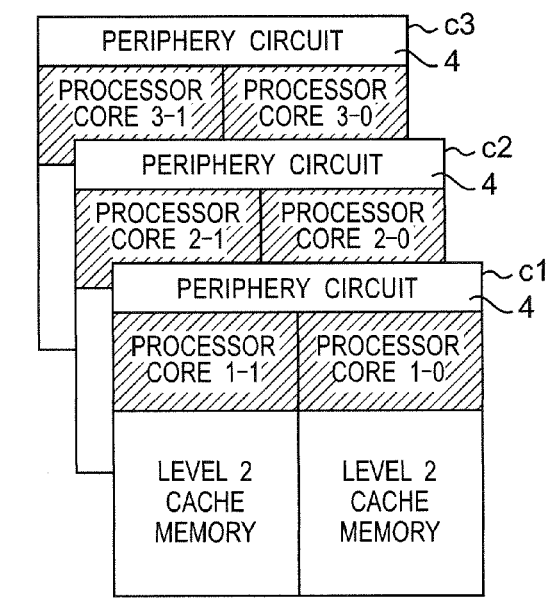
(c)
|  | CHIP c1 | CHIP c2 | CHIP c3 |
|---|---|---|---|
| OPERATION EXAMPLE 1 | PROCESSOR CORE 1-1 | PROCESSOR CORE 2-0 | PROCESSOR CORE 3-1 |
| OPERATION EXAMPLE 2 | PROCESSOR CORE 1-0 | PROCESSOR CORE 2-1 | PROCESSOR CORE 3-0 |
| OPERATION EXAMPLE 3 | PROCESSOR CORE 1-0 | NO OPERATION | PROCESSOR CORE 3-1 |

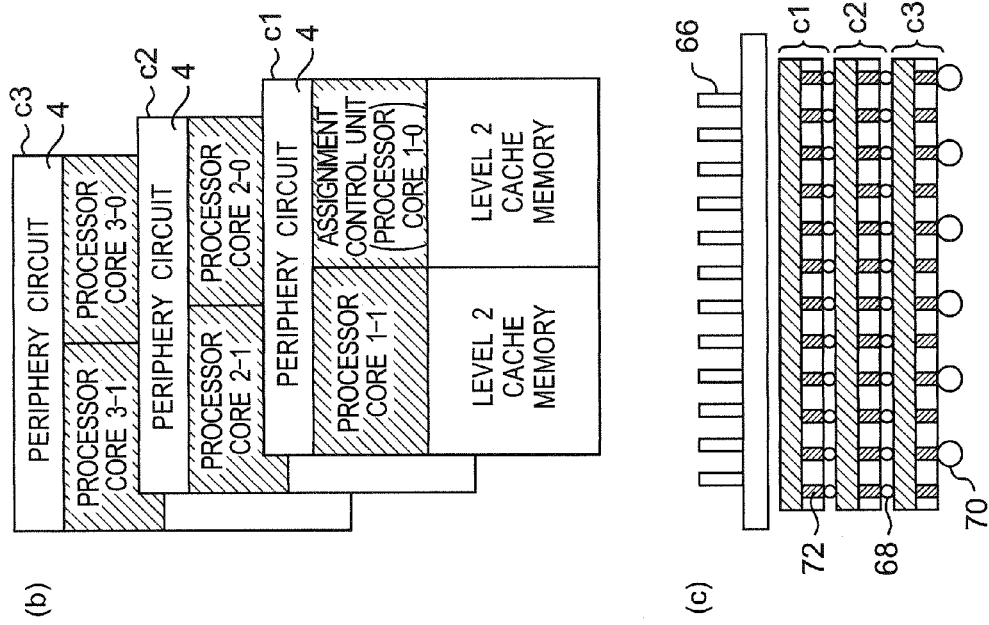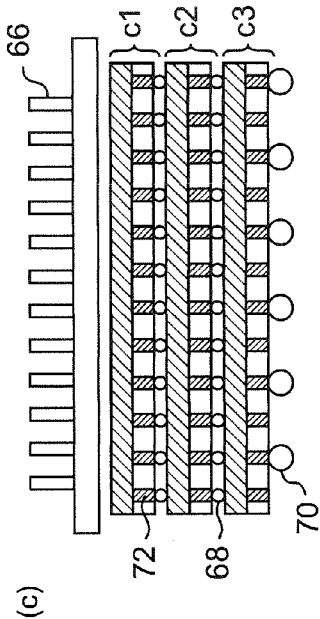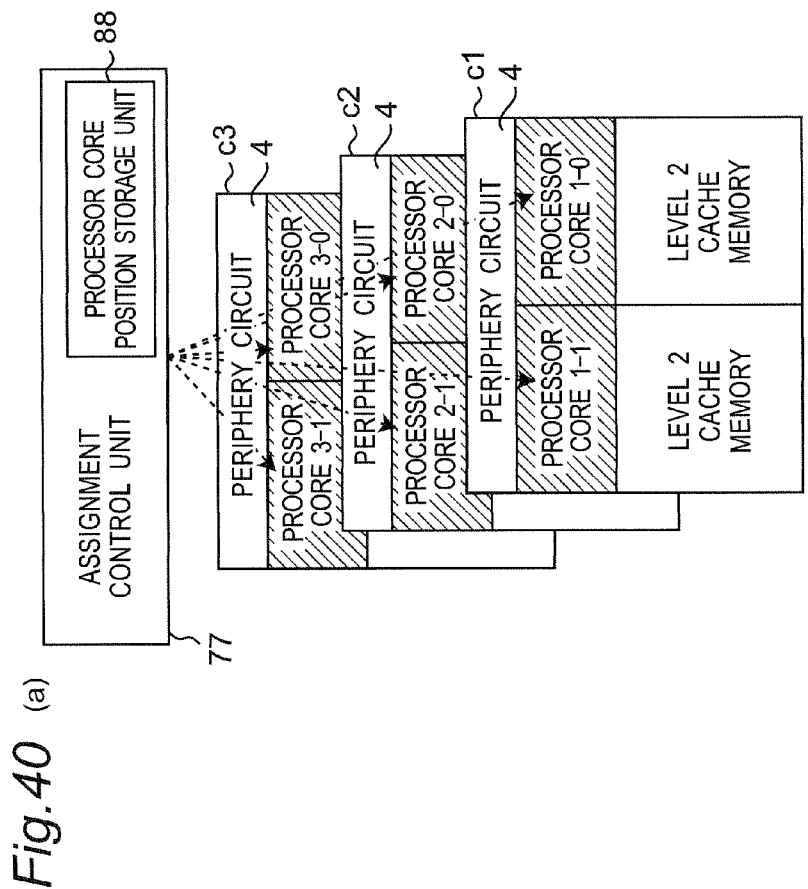
Fig.40

INTEGRATED CIRCUIT APPARATUS, THREE-DIMENSIONAL INTEGRATED CIRCUIT, THREE-DIMENSIONAL PROCESSOR DEVICE, AND PROCESS SCHEDULER, WITH CONFIGURATION TAKING ACCOUNT OF HEAT

TECHNICAL FIELD

The present invention relates to an integrated circuit apparatus, a three-dimensional integrated circuit, a three-dimensional processor device, and a process scheduler, each of which controls heat generation.

BACKGROUND ART

The three-dimensional integrated circuit is made of stacked chips which are connected with each other by through silicon via (hereinafter, referred to as "TSV") or micro bump. The three-dimensional integrated circuit has been expected as an advanced integrated circuit which realizes a faster circuit, a wider data communication band, and lower power consumption. An integrated circuit without three-dimensional stacking will be referred to as "two-dimensional integrated circuit" below.

PRIOR ART DOCUMENT

Patent Document

Patent Document 1: JP 2009-54850 A

DISCLOSURE OF INVENTION

Problems to be Solved by the Invention

In the three-dimensional integrated circuitry, the circuits are integrated not only in the two-dimensional surface directions but also in the three-dimensional directions, which causes a problem that heat generated in the circuitry easily builds up in the circuitry (difficult to escape from the circuitry) compared with the two-dimensional integrated circuitry. It is highly probable that persistency of a high temperature state caused by the generated heat may lead malfunction of the integrated circuit. The generated heat is easily built up because of two big causes.

The first cause is an event related with the source of heat generation. In the three-dimensional integrated circuit, the heat source may be laid on each other in the stacking direction. That is, not only the heat generated from a single circuit (chip) but the heat generated from vertically stacked chips may form the heat source. As an example, a three-dimensional processor with the same chips stacked will be described. Basically, peripheral areas of the computing elements in a processor are highly possible to be heated up, though it depends on the executed program. A result from the simulation with a structure of a plurality of chips stacked to arrange the computing elements in the same place on the two-dimensional surfaces shows that the temperature increases in the area in which the computing elements are layered in the stacking direction by 10 degrees or more higher than the other areas.

The second cause is an event related with cooling. In the three-dimensional integrated circuit, there may be a long distance between the heat source and the cooling system such as heat sink, which may prevent the heat source from being cooled. Silicon and metal wires forming the integrated circuit have high heat conductivity. However, materials of insulating films and the like which are disposed between the metal wires have low heat conductivity. Therefore, as the distance to the heat sink is longer, i.e., as the number of stacked chips is bigger, the heat more easily builds up.

Patent Document 1 describes a solution which prevents the heat generated from the vertically stacked chips from increasing the temperature in the structure of stacked chips. Patent document 1 discloses a SiP (System in Package) which is formed with driver chips and microcomputer chips stacked. In the SiP, driver chips which are easily heated up and circuit blocks which are vulnerable to heat are arranged so that they are not vertically layered. However, in the SiP a floor plan of the driver chips is designed to be adapted to the arrangement of microcomputer chips. In other words, the SiP is a technology which cannot be generally applied to various kinds of three-dimensional integrated circuit.

An object of the present invention is to provide a three-dimensional integrated circuit in which a hot spot to easily become a high temperature part is not made as a result of intensively generated heat.

Means for Solving the Problem

The present disclosure is directed to solving the foregoing problem. The integrated circuit apparatus according to the present disclosure comprises a first circuit made of a memory circuit, a second circuit made of an arithmetic circuit, and a control circuit. The first circuit is partitioned into a plurality of circuit blocks according to the distance from the arranged position of the second circuit, and the control circuit controls the partitioned respective circuit blocks separately.

According to the integrated circuit apparatus according to the present disclosure, only the area in the memory circuit inoperable under the influence of the generated heat may be stopped while leaving the operable area in the memory circuit continuously operating. As a result, the performance deterioration of the processor chip c1 due to the influence of the generated heat can be minimized.

Effects of the Invention

According to the present invention, generation of hot spot which makes a high temperature part as a result of intensively generated heat can be suppressed in a three-dimensional integrated circuit.

BRIEF DESCRIPTION OF DRAWINGS

FIG. 1(a) is a plan view of a processor chip (circuit) c1 according to a first embodiment of the present invention;

FIG. 1(b) is a plan view of a conventional processor chip c1;

FIGS. 2(a) and (b) are diagrams illustrating examples of distribution of parts of 85 degrees or more in the processor chip c1 in operation with the same configuration as that of the microchip c1 illustrated in FIG. 1(a);

FIGS. 3(a) and (b) are diagrams illustrating other examples of partitioning layout of a level 2 cache memory in the first embodiment;

FIG. 11(a) is a schematic diagram of a level 2 cache memory with 4 ways and 4 sets according to the third embodiment;

FIG. 11(b) is a diagram illustrating a configuration of sub-array;

FIG. 25(a) is a diagram illustrating a circuit layout of a processor chip to be compared with FIG. 5(b);

FIG. 25(b) is a diagram illustrating a circuit layout of a processor chip according to a sixth embodiment of the present invention;

FIGS. 27(a) and (b) are diagrams respectively illustrating yet other examples of the circuit layout of the processor chip c1 according to the sixth embodiment;

FIG. 30 is a side view of a typical three-dimensional integrated circuit;

FIG. 31(a) is a side view of a three-dimensional integrated circuit with two processor chips stacked;

FIG. 31(b) is a schematic diagram in a case of stacking two processor chips stacked;

FIG. 32(a) is a side view of a three-dimensional integrated circuit with two processor chips stacked according to a seventh embodiment of the present invention;

FIG. 32(b) is a schematic diagram in a case of stacking two processor chips in the three-dimensional integrated circuit according to the seventh embodiment;

FIG. 33(a) is a side view of another example of the three-dimensional integrated circuit with two processor chips stacked according to the seventh embodiment;

FIG. 33(b) is a schematic diagram in a case of stacking two processor chips in another example of the three-dimensional integrated circuit according to the seventh embodiment;

FIG. 39(a) is a side view of a three-dimensional integrated circuit with three processor chips stacked according to an eighth embodiment of the present invention;

FIG. 39(b) is a schematic diagram in a case of stacking three processor chips according to the eighth embodiment;

FIG. 39(c) is a table showing an example operation for the three-dimensional integrated circuit according to the eighth embodiment;

FIG. 40(a) is a block diagram illustrating relationship between a processor chip and an assignment control circuit in the three-dimensional integrated circuit according to the eighth embodiment of the present invention;

FIG. 40(b) is a block diagram illustrating relationship between a processor chip and an assignment control circuit in another example of the three-dimensional integrated circuit according to the eighth embodiment of the present invention;

FIG. 40(c) is a side view illustrating relationship between the processor chip and a heat sink in the three-dimensional integrated circuit according to the eighth embodiment of the present invention;

MODE FOR CARRYING OUT THE INVENTION

Figure 4:
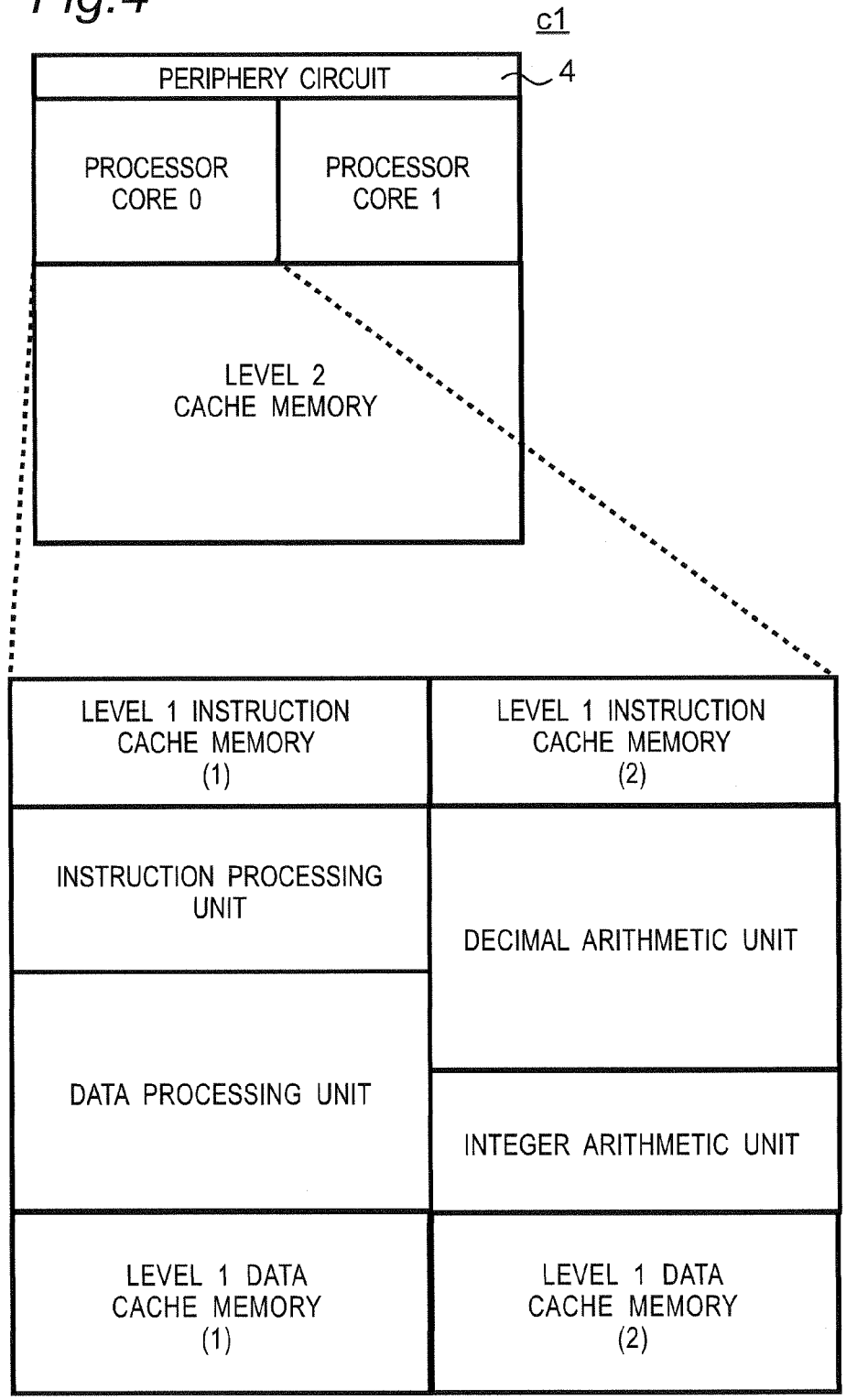
FIG. 4 is a diagram illustrating an example of a circuit layout in a case of applying the first embodiment to a processor core in a processor chip.

Preferred embodiments of the present invention will be described below with reference to the drawings. The preferred embodiments relate to a three-dimensional integrated circuit configured to control not to generate a hot spot which easily becomes a high temperature as a result of intensively generated heat.

The preferred embodiments can be divided into three groups as below.

First Embodiment to Sixth Embodiment

Embodiments related with circuitry and a control method for cooling the high temperature part of the processor chip.

Seventh Embodiment

Embodiment related with a chip layout and a circuitry layout arranged so as not to make circuits which would be heat sources layered in different chips.

Eighth Embodiment to Ninth Embodiment

Embodiments related with a method for controlling an operation of each circuit and process assignment so as not to make a high temperature place (hot spot) on a chip.

First Embodiment

1.1. Configuration of Processor Chip

FIG. 1(a) is a plan view of a processor chip (circuit) c1 according to the first embodiment. FIG. 1(b) is a plan view of a conventional processor chip c1'.

The processor chip c1 is largely divided into a circuit block referred to as processor core which performs operations, and a storage area referred to as level 2 cache memory. Inmost cases, multiple processor cores are equipped in one processor chip. The processor chip c1 illustrated in FIG. 1(a) includes two processor cores (processor core 0, processor core 1). Further, the processor core includes a level 1 cache, a register file, an integer arithmetic unit, a decimal arithmetic unit, an SIMD (Single Instruction Multiple Data) arithmetic unit, a load store unit, and the like. Further, the level 2 cache memory is a storage area made of a plurality of SRAM sub-arrays.

The processor chip c1 further includes a peripheral circuit 4 as well as an operation control circuit 6 which controls the processor core and the level 2 cache memory. The peripheral circuit 4 includes a clock control unit, a power source control unit, an external memory interface unit, a PCI-Express interface unit, and the like. The control operation of the operation control circuit 6 will be described later.

In the processor chip c1' illustrated in FIG. 1, the processor core heats up more than the level 2 cache memory. The reasons include that the level 2 cache memory has a large capacity and that the level 2 cache memory has the operating speed slower than the processor core. This may also be a reason that, although the processor core operates in a pipelined manner and, therefore, many parts of the circuit are operating at the same time, all of the storage area of the storage element such as the level 2 cache memory is not activated at the same time.

Therefore, much of the heat produced from the processor core goes into the level 2 cache memory. As the circuit is being used for a long time in the above described state, part of the processor core and the level 2 cache memory adjacent to the processor core may have the allowable temperature for the processor chip to operate exceeded. As a solution to the problem, the data may be purged from the level 2 cache memory into the external memory, then, the power source of the processor core and the level 2 cache memory which are heated may be cut off, and the heated part on the processor chip may be cooled. However, the part of the level 2 cache memory which is heated too much for the level 2 cache memory to operate is only the vicinity to the processor core, therefore, when the power source for the entire level 2 cache memory in the conventional configuration illustrated in FIG. 1(b) is cut off, even the part which is at a low temperature and remaining operable becomes unusable. In particular, in a multicore processor system, the level 2 cache memory is shared by a plurality of processor cores and used in many cases. As a result, when the power source for the entire level 2 cache memory is cut off, the other processor cores which do not produce heat become inoperable.

The processor chip c1 of the embodiment is for solving the above described problem, and, as illustrated in FIG. 1(a), contains a circuit block made of processor cores, and a storage area made of the level 2 cache memories, and further, the storage area is divided into three blocks (i.e., the level 2 cache memory (1), the level 2 cache memory (2), and the level 2 cache memory (3)). The three memory blocks are arranged according to the distances from the two processor cores, and it is adapted that each of the three memory blocks (the level 2 cache memory (1), the level 2 cache memory (2), and the level 2 cache memory (3)) can be controlled independently.

According to the processor chip c1 of the embodiment with the above described configuration, even when the temperature of the storage area (the level 2 cache memory) exceeds the operable range as a result of the heat from the processor core, it does not need to stop the entire level 2 cache memory for heat radiation, and only the memory in the area inoperable under the influence of the heat may be stopped while leaving the memories in the operable areas continuously operating. As a result, the performance deterioration of the processor chip c1 due to the influence of the heat can be minimized.

The effect of the embodiment will be described with reference to FIGS. 2(a) and (b). FIGS. 2(a) and (b) illustrate examples of distribution of parts of 85 degrees or more in the processor chip c1 illustrated in FIG. 1(a) in operation. Here, heat distribution in the processor chip including the processor core changes according to the processor architecture, the circuit block layout, the cache capacity, the device structure, the executive program, and the like.

FIG. 2(a) illustrates an example of distribution of parts of 85 degrees or more on the processor chip c1 in the case where a heavy load program is executed on the processor core 0 while a light load program is executed on the processor core 1. It can be seen that the area generating the heat at 85 degrees or more extends into the area of the level 2 cache memory (1). On the condition of continuously operating the processor chip c1, it can be assumed that the processor chip c1 is further heated up in the area of the processor core 0 and the level 2 cache memory (1) to have the heat exceed the tolerable operating temperature as the integrated circuit. Therefore, in the processor chip c1 according to the embodiment, it is adapted that operation of a minimum circuit blocks (here, the processor core 0 and the level 2 cache memory (1)) is stopped to keep the heat within the tolerable operating temperature as the integrated circuit. At this moment, it is possible to have the processor core 1, the level 2 cache memory (2), and the level 2 cache memory (3) continuously operating.

FIG. 2(b) illustrates an example of distribution of parts of 85 degrees or more on the processor chip c1 in the case where a heavy load program is executed on both of the processor core 0 and the processor core 1. It can be seen that when a heavy load program is executed on the two processor cores, the area in which the heat of 85 degrees or more is generated extends to the level 2 cache memory (1) and the level 2 cache memory (2). Also in this case, on the condition of continuously operating the processor chip c1, it can be assumed that the tolerable operating temperature as the integrated circuit is exceeded in the area of the processor core 0, the processor core 1, the level 2 cache memory (1), and the level 2 cache memory (2). Therefore, in the present embodiment, the parts of the processor core 0, the processor core 1, the level 2 cache memory (1), and the level 2 cache memory (2) are stopped so that the tolerable operating temperature as the integrated circuit is not exceeded. At this moment, it is possible to have the level 2 cache memory (3) continuously operating.

The partitioning layout of the level 2 cache memory is not limited to that illustrated in FIG. 1(a). FIGS. 3(a) and (b) are diagrams illustrating other examples of partitioning layout of the level 2 cache memory. Although the level 2 cache memory illustrated in FIG. 1(a) is partitioned into three areas, it may be partitioned into two areas as illustrated in FIG. 3(a) or may be partitioned into four areas or more even though not illustrated in the drawings, for example. Alternatively, by taking account of heat conduction from the respective processor cores, the areas partitioned according to the respective processor cores may be provided in the area near the processor core, and one area may be provided in the area at a distant from the processor core. Since the heat may not conduct concentrically, the level 2 cache memory may be partitioned unequally.

Although the idea of the embodiment is applied to the processor core and the level 2 cache memory in the processor chip c1 illustrated in FIG. 1 to FIG. 3, the idea of the embodiment can be applied to a circuit (chip) as far as it is a combination of a circuit such as an arithmetic unit that generates a large amount of heat and a circuit such as a cache memory that generates a little amount of heat and has the same configuration distributed evenly. For example, as illustrated in FIG. 4, the idea of the embodiment may be applied to the level 1 cache memory in the processor core.

Figure 5:
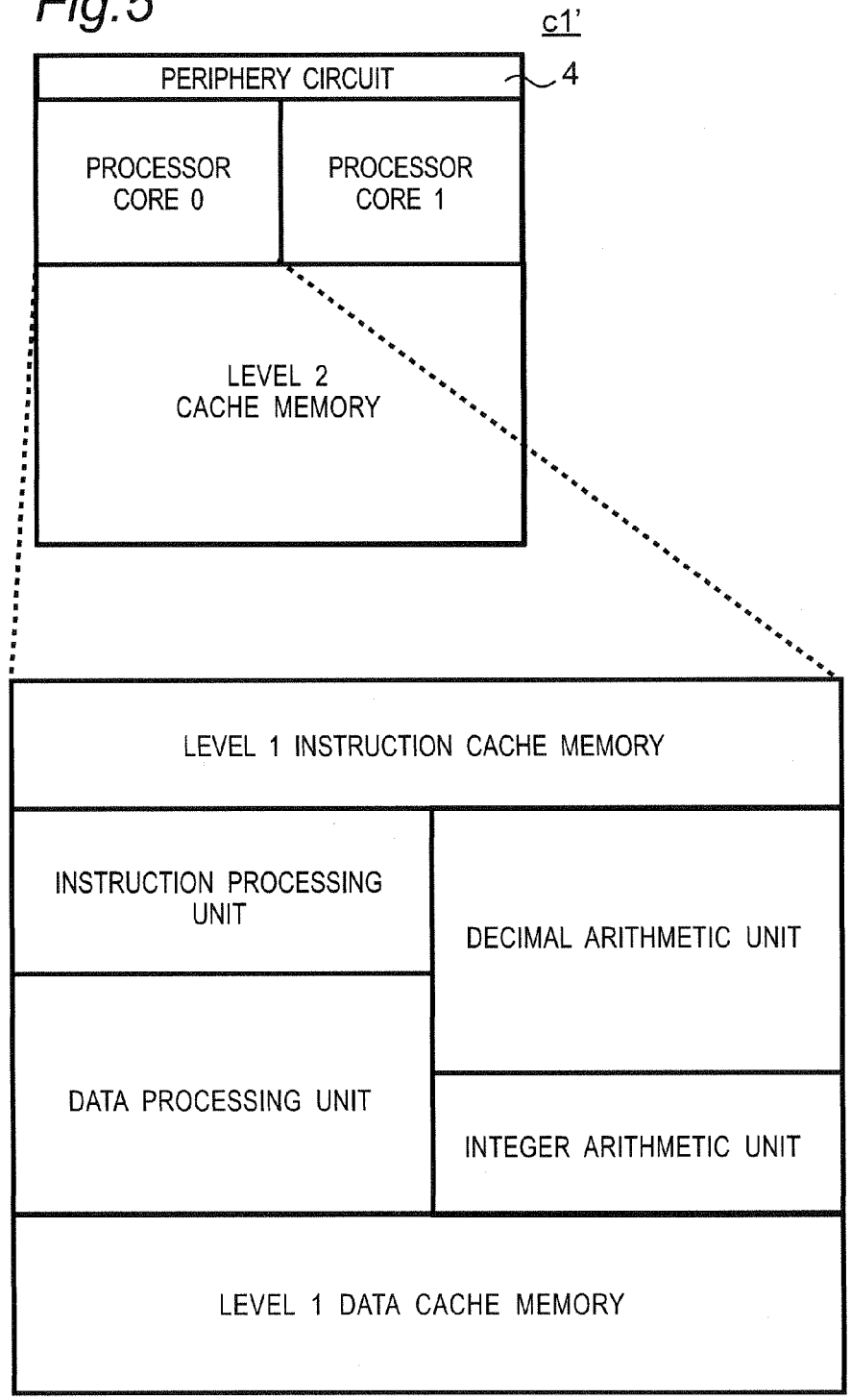
FIG. 5 is a diagram illustrating an example layout of circuits which are contained in a processor core in a conventional processor chip.

FIG. 5 illustrates an example layout of circuits which are contained in a processor core in a conventional processor chip c1'. The processor core c1' includes a level 1 instruction cache memory, a level 1 data cache memory, an instruction processing unit, a data processing unit, an integer arithmetic unit, and a decimal arithmetic unit on the whole. In the layout configuration illustrated in FIG. 5, the level 1 instruction cache memory is arranged at the top of the processor core and an instruction is transferred from there to the instruction processing unit which is arranged immediately below the level 1 instruction cache memory. Then, according to the instruction, the data arithmetic processing is performed in the level 1 data cache memory, the data processing unit, the integer arithmetic unit, and the decimal arithmetic unit.

FIG. 4 is an example of the circuit layout of the processor core in the processor chip c1 of the embodiment. The decimal arithmetic unit may be used frequently or may not be used at all, which depends on the program implemented in the processor core. Therefore, the level 1 instruction cache memory is partitioned into a part near to the decimal arithmetic unit (the level 1 instruction cache memory (2)) and a part near to the instruction processing unit (the level 1 instruction cache memory (1)). Each of the level 1 instruction cache memory (1) and the level 1 instruction cache memory (2) as a result of partitioning is controlled independently. For example, in the case where the temperature of the decimal arithmetic unit becomes high, the processor core 0 is operated with a switched program which does not need any decimal arithmetic operation. As a result, the temperatures of the decimal arithmetic unit and the level 1 instruction cache memory (2) do not exceed the tolerable operating temperature as the integrated circuit. At this moment, an instruction code for using the decimal arithmetic operation may be input to the level 1 instruction cache memory (2) side.

Like the decimal arithmetic unit, the integer arithmetic unit may be used frequently or may not be used at all, which depends on the program in the processor core. Therefore, the level 1 data cache memory may be partitioned into a part near to the integer arithmetic unit (the level 1 data cache memory (2)) and a part near to the data processing unit (the level 1 data cache memory (1)). At this moment, each of the level 1 data cache memory (1) and the level 1 data cache memory (2) as a result of partitioning is controlled independently.

1.2. Summarization

In the first embodiment, in a circuit (chip) which contains a circuit such as an arithmetic unit that generates a large amount of heat, and a circuit such as a cache memory that generates a little amount of heat and has the same configuration distributed evenly, the memory circuit is partitioned as required and each of the circuit blocks as a result of partitioning is controlled independently. With that configuration, it is possible to stop only the area of the memory circuit which becomes inoperable as a result of the generated heat while leaving the operable area of the memory circuit continuously operating. As a result, the performance deterioration of the processor chip due to the influence of the generated heat can be minimized. Although the circuit including an arithmetic unit and a cache memory is taken in the description of the embodiment, the embodiment is not limited to that circuit and may be applied to a circuit which includes a circuit block of a large heat value and a circuit block of a small heat value.

Second Embodiment 2.1. Configuration of Processor Chip

Figure 6:
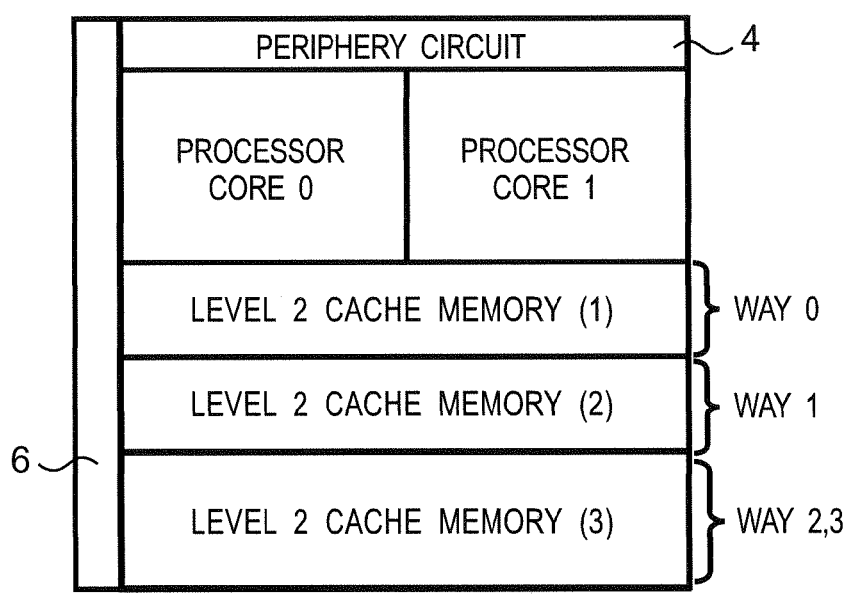
FIG. 6 is a plan view of a processor chip according to a second embodiment of the present invention.

FIG. 6 is a plan view of a processor chip c1 according to the second embodiment. In the processor chip c1 illustrated in FIG. 6 according to the second embodiment, the level 2 cache memory is partitioned into a plurality of blocks as in the processor chip illustrated in FIG. 1(a) according to the first embodiment; though, each block of the level 2 cache memory illustrated in FIG. 6 is adapted to be used by the unit of way.

In the processor chip c1 illustrated in FIG. 6, the level 2 cache memory includes 4 ways (way 0 to way 3) with "way 0" using the area of the level 2 cache memory (1), "way 1" using the area of the level 2 cache memory (2), and "way 2" and "way 3" using the area of the level 2 cache memory (3).

Figure 7:
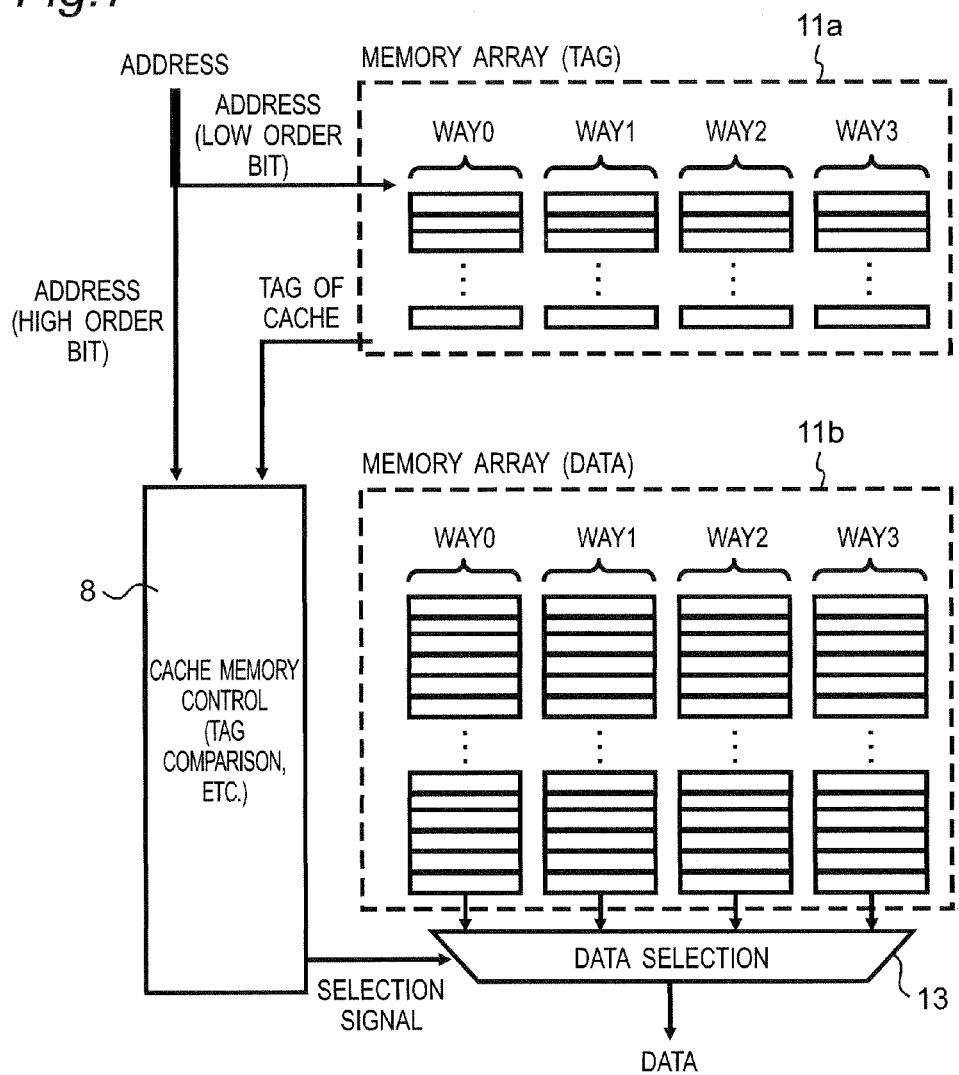
FIG. 7 is a schematic diagram of a level 2 cache memory with 4 ways.

First, the configuration of a conventional level 2 cache memory will be described. FIG. 7 is a schematic diagram of the level 2 cache memory with 4 ways. The level 2 cache memory includes a memory array 11a which retains a tag and a memory array 11b which retains data. The memory arrays 11a, 11b are assigned to the respective 4 ways.

In the level 2 cache memory illustrated in FIG. 7, a tag for each way (i.e., each of the all 4 ways) is drawn to the cache memory control circuit 8 from the low order bit of address. Then, when the value stored in each of the tags and the high order bit of the address are compared with each other and agreed, it is considered as hit, and when they disagree, it is considered as miss. In the case of hit, a data selection circuit 13 selects the way for the hit tag to read the data and outputs the data to the processor core. In the case of miss, the data selection circuit 13 acquires data from the external memory (not shown).

Figure 8:
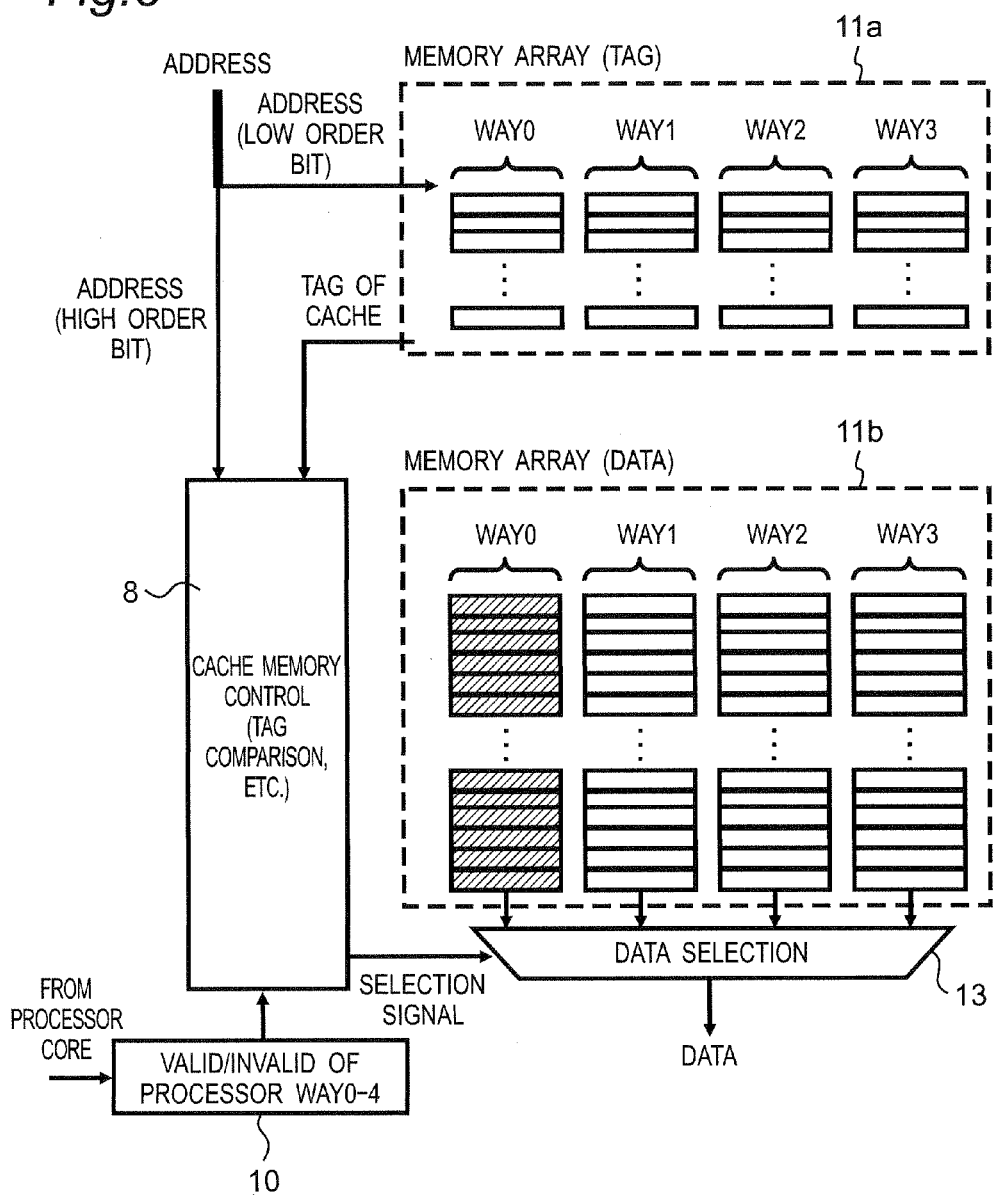
FIG. 8 is a diagram illustrating an example of assigning each way to a partitioned block of the level 2 cache memory.

Now, the configuration of the level 2 cache memory of the embodiment will be described. FIG. 8 is an example of assigning each way to a partitioned block (area) of the level 2 cache memory. The level 2 cache memory of FIG. 8 has a bit flag 10 indicating valid/invalid of ways 0 to 4 in addition to the configuration of the conventional cache memory illustrated in FIG. 7. The bit flag 10 is used for invalidating each way.

The bit flag 10 is written from the processor core or the operation control circuit 6 of the processor core and the cache memory. The bit flag 10 is prepared for each way, and when the value of the flag is ON, the way of the flag becomes wholly invalidated. For example, as illustrated in FIG. 9(a), when the area of the level 2 cache memory (1), i.e., the way 0, undergoes such control as power source cut-off for heat radiation, the valid/invalid flag 10 of the way 0 is changed to the value indicating invalid so that the part corresponding to the way 0 is invalidated.

Figure 9:
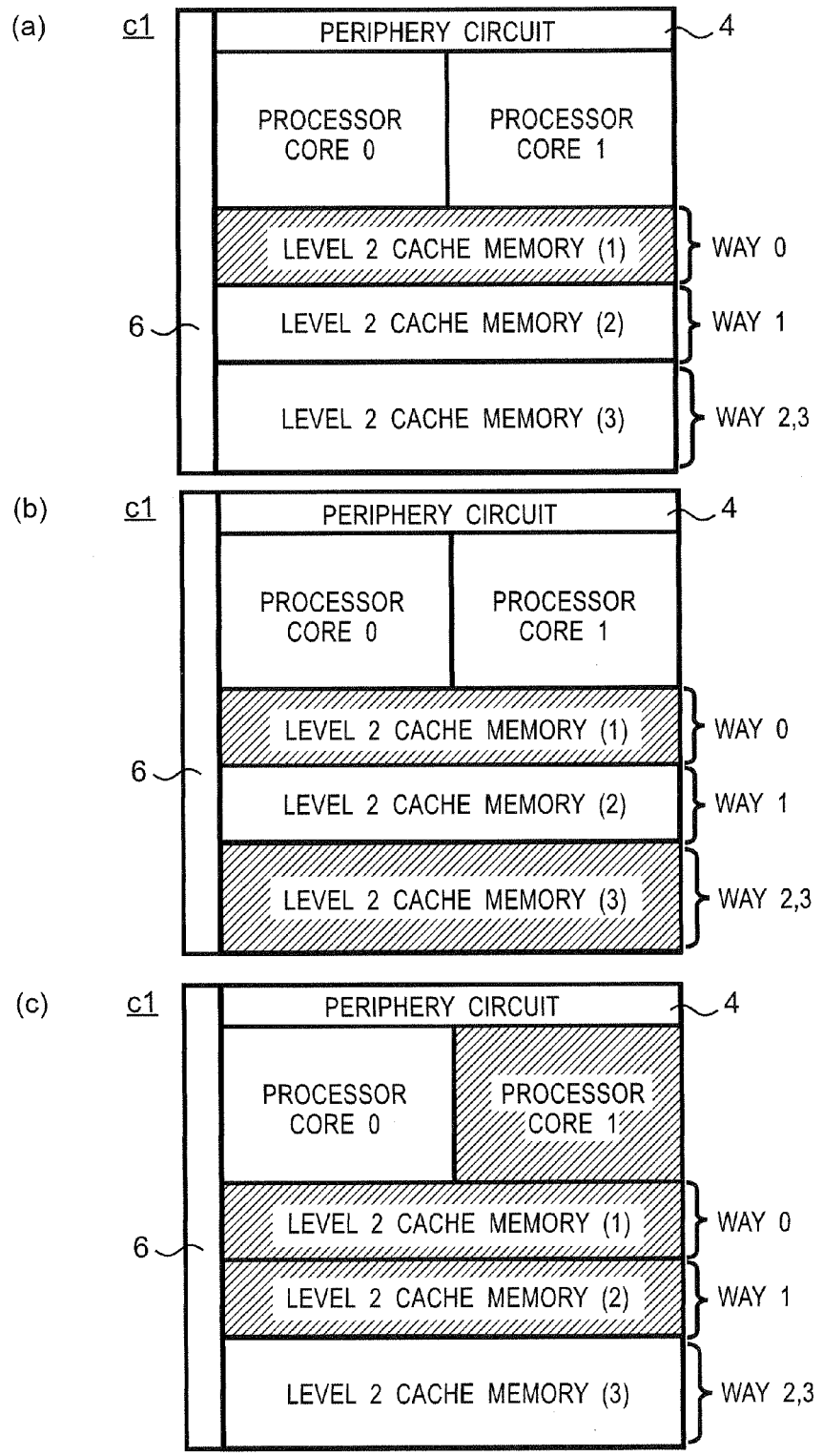
FIG. 9 is a diagram illustrating various controls performed in the processor chip according to the second embodiment.

Meanwhile, the areas for which the control such as power source cutoff is independently performed may be at a distance from each other like the level 2 cache memories (1), (3) illustrated in FIG. 9(b). At this moment, since the level 2 cache memory (2) which is at a distance from the processor core is used, the cache memory to which the heat from the processor core is hard to be conducted is to be used. Also, it is possible that the power sources for the successive two areas (way 0: the level 2 cache memory (1), way 1: the level 2 cache memory (2)) are cut off, and at the same time, the power source for one of the processor cores is cut off so that the embodiment may be used as a single core processor chip as illustrated in FIG. 9(c). For a program which does not cause so many cache miss even though the capacity of the cache memory is small, the processor core itself influences the effective performance at a program run time, therefore, the areas of the farthest processor core and the level 2 cache memory are combined with each other for operation so as not to cause the hot spot to occur.

Although the present embodiment has been described by using the 4 way set associative method, the other number of ways may be used. For example, the 2 way set associative method may be used or the 8 way set associative method may be used.

2.2. Summarization

In the second embodiment, in the processor chip in which the processor core and the level 2 cache memory are partitioned as required, the circuit block of the level 2 cache memory after partitioning is used by the unit of way, and such use by the unit of way is controlled by the valid/invalid flag 10. With that configuration, it is possible to stop only the circuit block related with the use by the unit of way which becomes inoperable as a result of the generated heat while leaving the operable range continuously operating. As a result, the performance deterioration of the processor chip due to the influence of the generated heat can be minimized.

Third Embodiment

3.1. Configuration of Processor Chip

Figure 10:
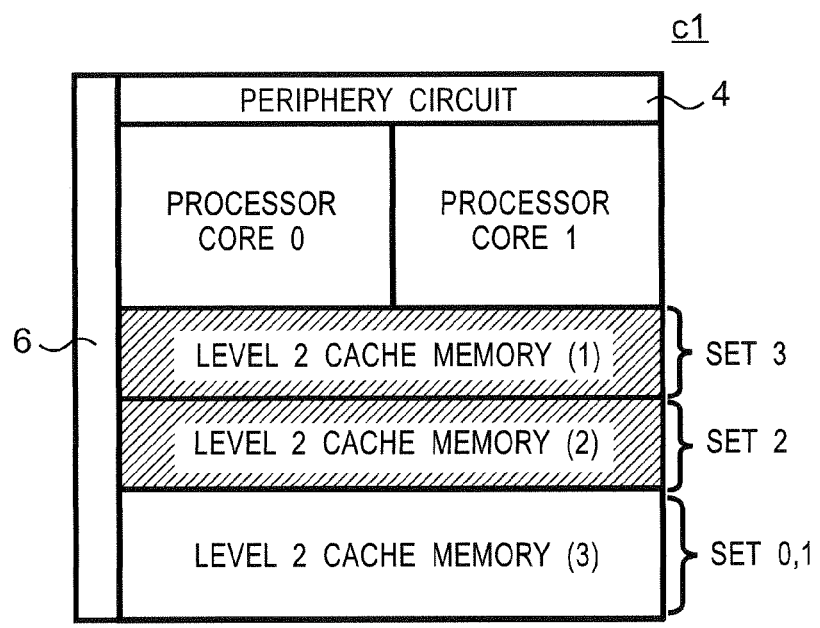
FIG. 10 is a plan view of a processor chip according to a third embodiment of the present invention.

FIG. 10 is a plan view of a processor chip c1 according to the third embodiment. In the processor chip c1 according to the third embodiment illustrated in FIG. 10, the level 2 cache memory is partitioned into a plurality of blocks as in the processor chip according to the first embodiment illustrated in FIG. 1(a); though, each block of the level 2 cache memory illustrated in FIG. 10 is adapted to be used by the unit of set.

In the processor chip c1 illustrated in FIG. 10, the level 2 cache memory includes 4 sets (set 0 to 3). The "set 0" and "set 1" use the area of the level 2 cache memory (3), the "set 2" uses the area of the level 2 cache memory (2), and the "set 3" uses the area of the level 2 cache memory (1). FIG. 10 illustrates the state in which the power source is cut off for the set 2 and the set 3.

FIG. 11(a) is a schematic diagram of a level 2 cache memory with 4 ways and 4 sets according to the embodiment. Unlike the conventional level 2 cache memory, a tag mask circuit 14 is provided for the address input part and the capacity (number of sets) of the memory array (data) is changeable. Here, the set is a parameter related with the capacity for one way.

For speeding up the cache memory, the cache memory is implemented as partitioned into sub-arrays 14 as illustrated in FIG. 11 (b). A bunch of the sub-arrays 14 is referred to as "set". The sub-array 14 has one or more cache lines. When the number of sets is changed, bits used for index and tag are changed in the bit field of address. The tag mask circuit 14 is implemented in order to adjust the change.

Now, the operation of the processor chip c1 according to the third embodiment will be described. Here, for simplicity of the description, the configuration in which only two lines of cache line are provided for one set with the power source supplied only for one set (for example, set 0) and the power source cut off for the remaining sets is taken below as an example (this configuration is different from that illustrated in FIG. 11). Incidentally, the configuration in which "only two lines of cache line are provided for one set" includes the configuration in which two sub-arrays 14 are provided for each set and one cache line is provided for each sub-array 14, and the configuration in which one sub-array 14 is provided for each set and two cache lines are provided for each sub-array 14. Here, only two cache lines are provided for one set. The value of the least significant bit of address identifies either of the two lines. The values of the remaining high order bits in address are compared with the value stored in the tag so that the way is identified.

When the number of sets to which the power is supplied is doubled, the set and the cache line is searched for and identified based on the value which is two bits from the least significant bit of address, and the values of the remaining high order bits of address are compared with the value stored in the tag so that the way is identified.

Figure 12:
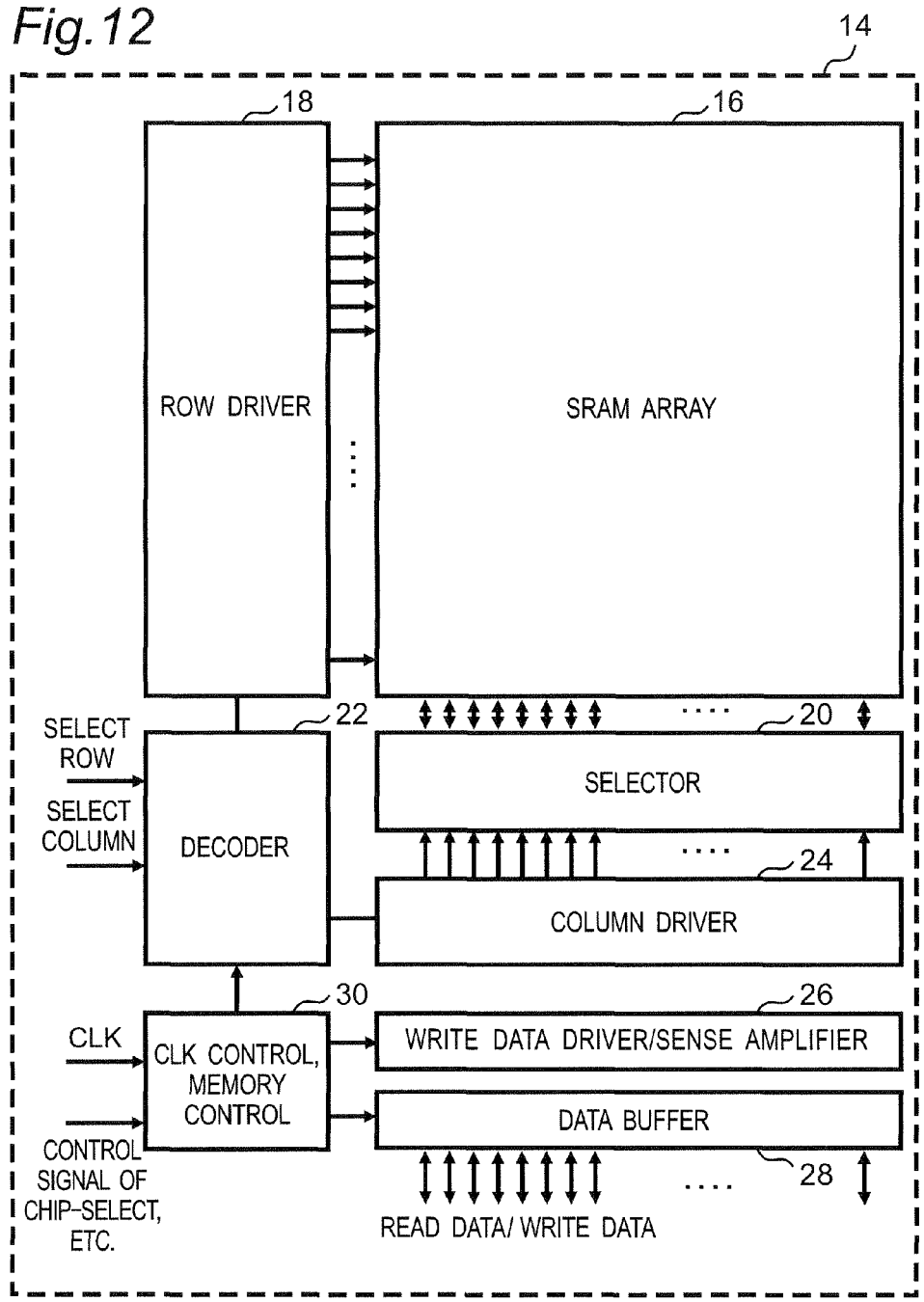
FIG. 12 is a block diagram illustrating a configuration of sub-array.

Now, a configuration of the sub-array will be described with reference to FIG. 12. Incidentally, the block diagram illustrated in FIG. 12 also relates to the clock control of the memory circuit to be described later. The sub-array 14 of the SRAM illustrated in FIG. 12 has an SRAM array 16 which is an array of storage element. A control system circuit includes a row driver 18 for selecting a row in the array, a column driver 24 for selecting a column in the array, and a decoder circuit 22 for generating selection signals for the drivers. A data system path includes a data buffer 26 which buffers data from outside and a write data driver/sense amplifier 26 which drives the write data into the array and amplifies the data read out from the array. Further, a CLK control/memory control circuit 30 which distributes a control signal and a clock signal over these circuits controls over the entire circuit.

Meanwhile, although the cache memory is partitioned according to each of the ways and sets in the second embodiment and the third embodiment, it may be partitioned according to the other basis. For example, the area of the cache memory may be partitioned by combining the ways and sets.

3.2. Summarization

In the third embodiment, in the processor chip in which the processor core and the level 2 cache memory are partitioned as required, the circuit block (memory block) of the level 2 cache memory after partitioning is used by the unit of set, and the use is controlled by the unit of set. With that configuration, it is possible to stop only the circuit block related with the use by the unit of set which becomes inoperable as a result of the generated heat while leaving the operable range continuously operating. As a result, the performance deterioration of the processor chip due to the influence of the generated heat can be minimized.

Fourth Embodiment

4.1. Control flow of Heat Radiation from the Partitioned Level 2 Cache Memory The partitioning structure of the cache memory has been described from the first embodiment to the third embodiment. The fourth embodiment relates to the control of heat radiation from the partitioned level 2 cache memory. In the embodiment, the circuit block under the influence of heat is partitioned and finely controlled for heat radiation. In order to radiate the heat from the heated circuit, it is preferable to cut off the power voltage.

4.1. (1) First Processing Flow

Figure 13:
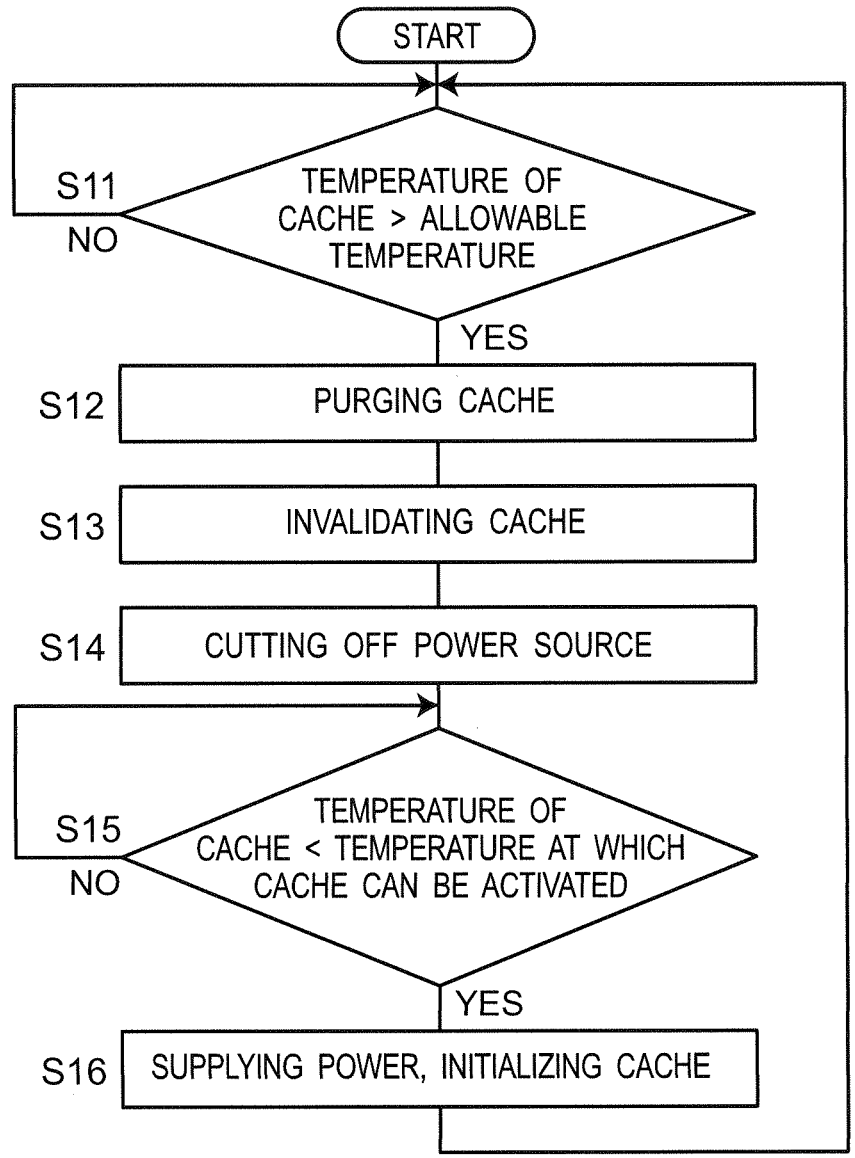
FIG. 13 is a processing flow of cutting off the power source for a cache memory according to a fourth embodiment of the present invention.

FIG. 13 is a first processing flow of cutting off the power source for the level 2 cache memory (hereinafter, simply referred to as "cache memory") of the fourth embodiment. Incidentally, in the cache memory to which control is performed according to the processing flow described in FIG. 13, a temperature detection circuit for monitoring the temperature of each of the partitioned circuit blocks (memory block) is provided. The temperature detection circuit 34 illustrated in FIG. 20 to be described later may be used as the temperature detection circuit. That is also the case in the cache memory to which control is performed according to the processing flows described in FIG. 14 to FIG. 18.

First, in the processing flow described in FIG. 13, it is determined whether the temperature of the monitored cache memory has exceeded the allowable temperature (S11). The allowable temperature here needs to be decided also by taking account of a difference in the monitoring circuit which measures the temperature inside the cache memory, an operating condition of the peripheral circuit, and the like. When the temperature of the cache memory is at the allowable temperature or more (S11 YES), the operation proceeds to a cooling process. When the power voltage of the cache memory is to be cut off, for the data which disagree with the contents of the external memory, the data inside the cache memory needs to be written back to the external memory (write back). However, when the control is performed in the write through method, that process may be omitted because write back is unnecessary. For that purpose, the contents of the level 2 cache memory in the area to which the power source is cut off is purged (write back) (S12), and each of the purged cache lines is invalidated (S13). Then, the power source is cut off (S14). After the power source is cut off, the temperature of the processor chip decreases. The monitoring circuit monitors the cache memory until the heat decreases to the temperature or less at which the cache memory can be activated (S15). The temperature at which the cache memory can be activated also needs to be decided by taking account of a difference in the monitoring circuit and the like as the above described allowable temperature does. When the temperature of the cache memory has lowered to the temperature at which the cache memory can be activated (S15 YES), the power is supplied to the cache memory and the cache memory is initialized (S16). At this moment, since all of the values in the cache memory immediate after starting the power supply are uncertain values, they are invalidated in initialization. Thereafter, the cache memory is used as a general cache memory with the temperature being monitored (S11).

4.1. (2) Second Processing Flow

Figure 14:
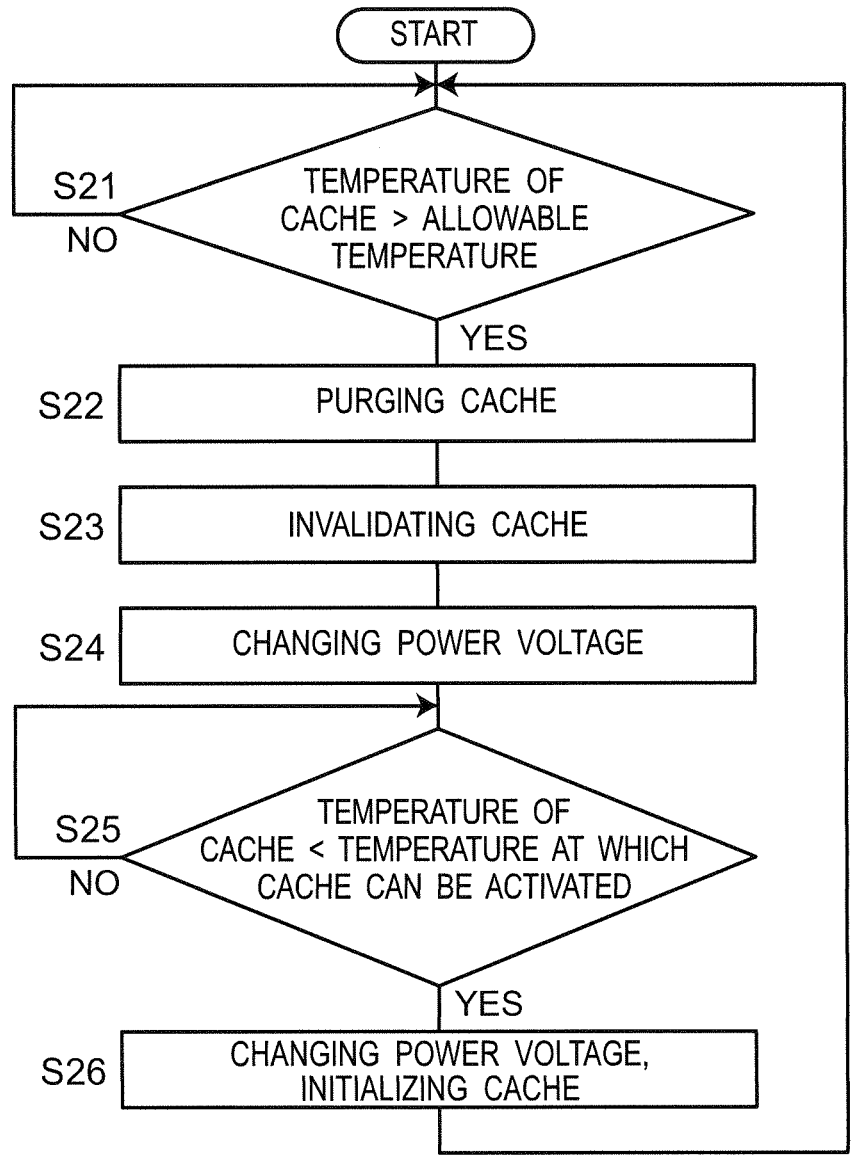
FIG. 14 is a processing flow of controlling the cache memory according to the fourth embodiment.

FIG. 14 is a second processing flow according to the fourth embodiment. The processing in steps S21 to S26 described in FIG. 14 is almost the same as that in steps S11 to S16 described in FIG. 13, except that the power voltage is changed (decreased) without cutting off the power source in the processing flow described in FIG. 14 (S24). The consumed power of leak current and the like in the integrated circuit is proportional to the power voltage. Therefore, decreasing the power voltage can also lower the generated heat, and thus, also provide the cooling effect. Further, when the voltage is decreased within the range in which the cache memory can maintain the data, neither purging (S22) nor invalidating (S23) of the cache memory is needed. Since the memory circuit has generally its capability of maintaining data lowered under the condition of high temperature, it is preferable to determine which of the processing flow of cutting off the power source described in FIG. 13 and the processing flow of changing (decreasing) the power voltage described in FIG. 14 is suitable by taking account of an application software program to run.

4.1. (3) Third Processing Flow

Figure 15:
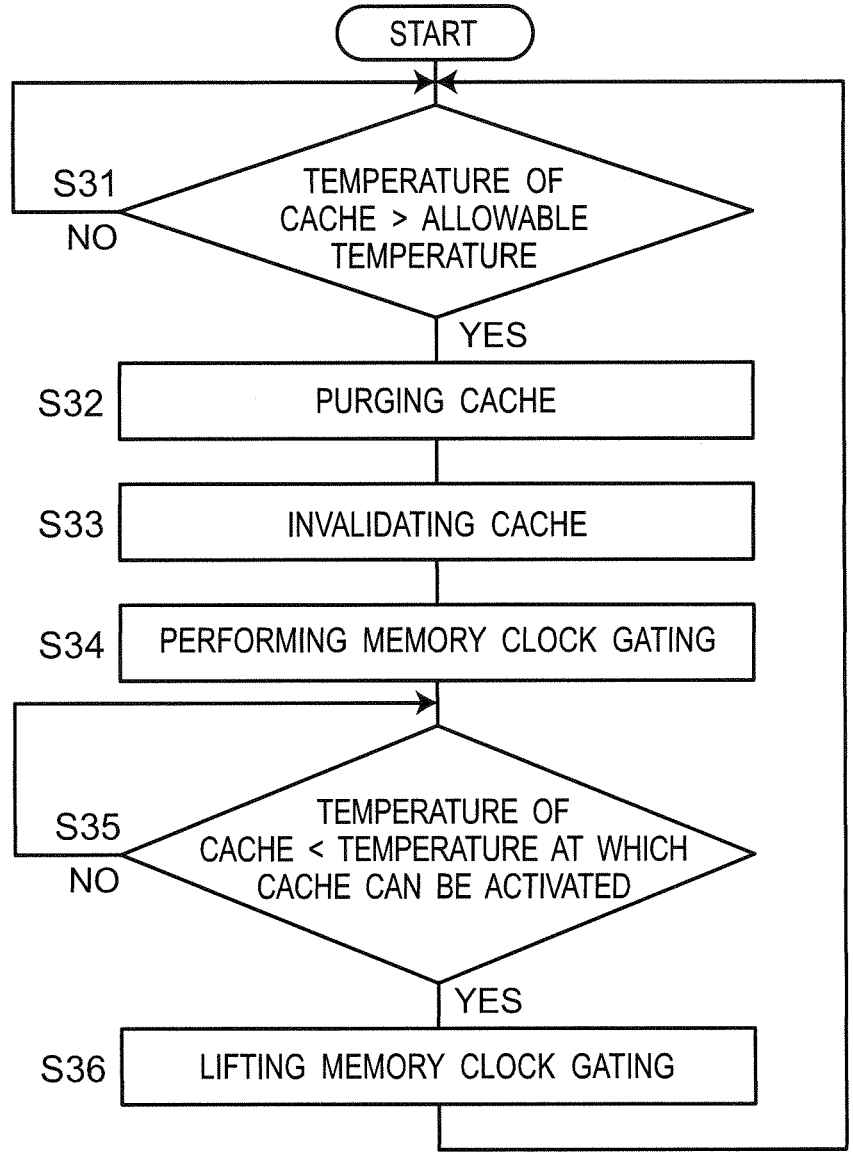
FIG. 15 is another processing flow of controlling the cache memory according to the fourth embodiment.

FIG. 15 is a third processing flow according to the fourth embodiment. The processing in steps S31 to S36 described in FIG. 15 is almost the same as that in steps S11 to S16 described in FIG. 13, except that the clock gating is performed without cutting off the power source in the processing flow described in FIG. 15 (S34). Unlike the processing of the power source cut-off, data does not volatilize in the processing of clock gating. Therefore, when the temperature of the cache memory decreases lower than the temperature at which the cache memory can be activated (S35 YES), the cache memory needs not to be initialized in recovering the gated cache memory, i.e., in lifting the gating of the gated cache memory (S36). The gating of the cache memory is performed by gating an input clock to the CLK control/memory control circuit 30 in the block diagram of the sub-array of the SRAM illustrated in FIG. 12.

4.1. (4) Fourth Processing Flow

Figure 16:
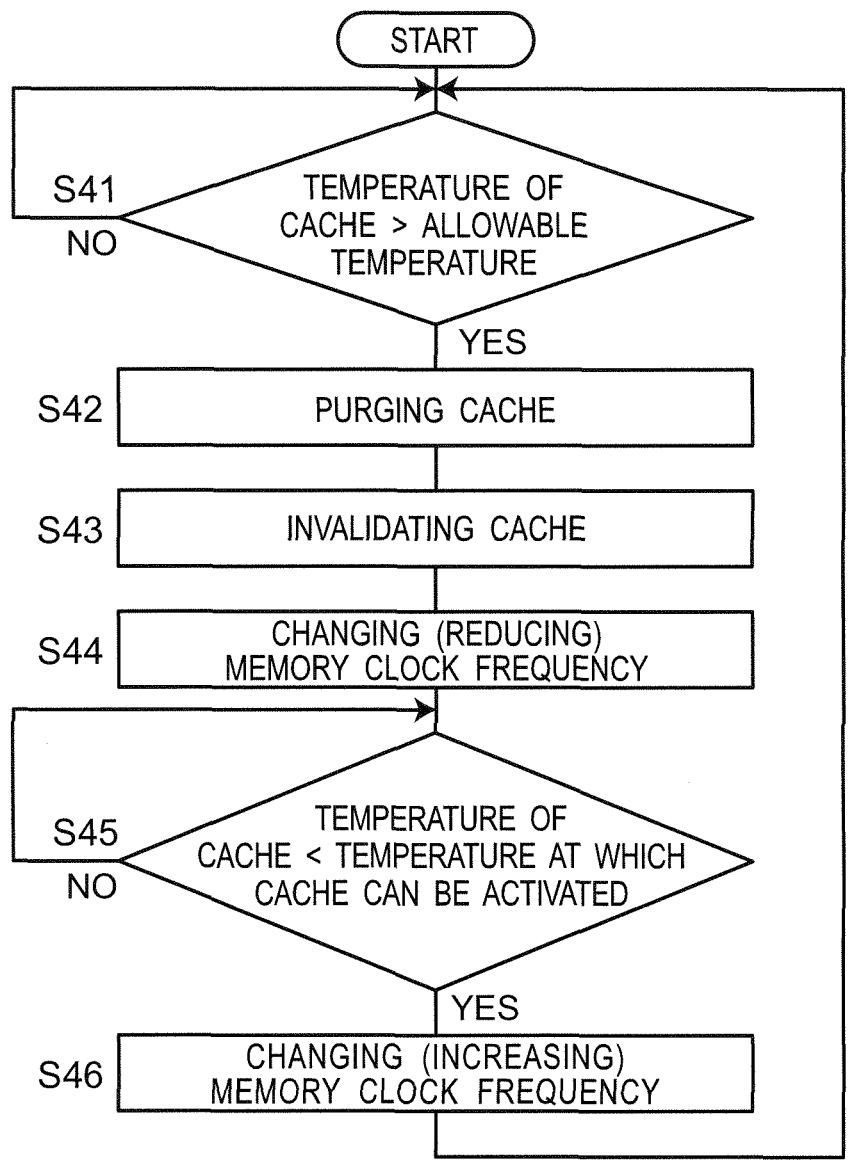
FIG. 16 is yet another processing flow of controlling the cache memory according to the fourth embodiment.

FIG. 16 is a fourth processing flow according to the fourth embodiment. The processing in steps S41 to S46 described in FIG. 16 is almost the same as that in steps S11 to S16 described in FIG. 13, except that the frequency of the memory clock is changed (reduced) without cutting off the power source in the processing flow described in FIG. 16 (S44). Unlike the processing of the power source cut-off, data does not volatilize in the processing of changing the frequency of the memory clock either. Therefore, when the temperature of the cache memory decreases to lower than the temperature at which the cache memory can be activated (S45 YES), the cache memory needs not to be initialized in recovering the frequency of the cache memory of which the frequency of the memory clock has been reduced (S46). The change of the frequency of the memory clock for the cache memory is performed by changing the input clock to the CLK control/memory control circuit 30 in the block diagram of the sub-array of the SRAM illustrated in FIG. 12. Here, the change (reduction) of the frequency of the memory clock for the cache memory may be performed at the same time as decreasing of the power voltage like the DVFS (Dynamic Voltage and Frequency Scaling).

4.1. (5) Fifth Processing Flow

Figure 17:
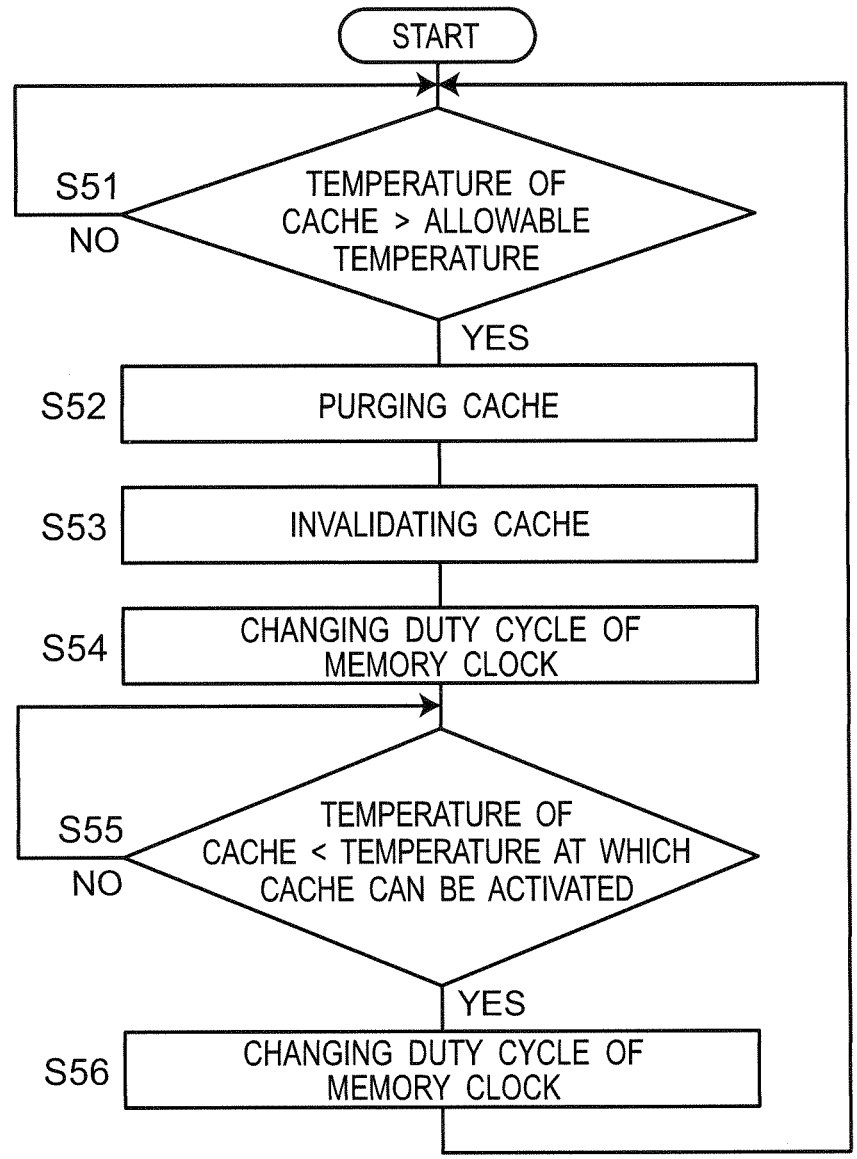
FIG. 17 is yet another processing flow of controlling the cache memory according to the fourth embodiment.

FIG. 17 is a fifth processing flow according to the fourth embodiment. The processing in steps S51 to S56 described in FIG. 17 is almost the same as that in steps S11 to S16 described in FIG. 13, except that the duty cycle of the memory clock is changed (reduced) without cutting off the power source in the processing flow described in FIG. 17 (S54). Unlike the processing of the power source cut-off, data does not volatilize in the processing of changing the duty cycle of the memory clock either. Therefore, when the temperature of the cache memory decreases to lower than the temperature at which the cache memory can be activated (S55 YES); the cache memory needs not to be initialized in recovering the duty cycle of the memory clock (S56).

4.1. (6) Sixth Processing Flow

Figure 18:
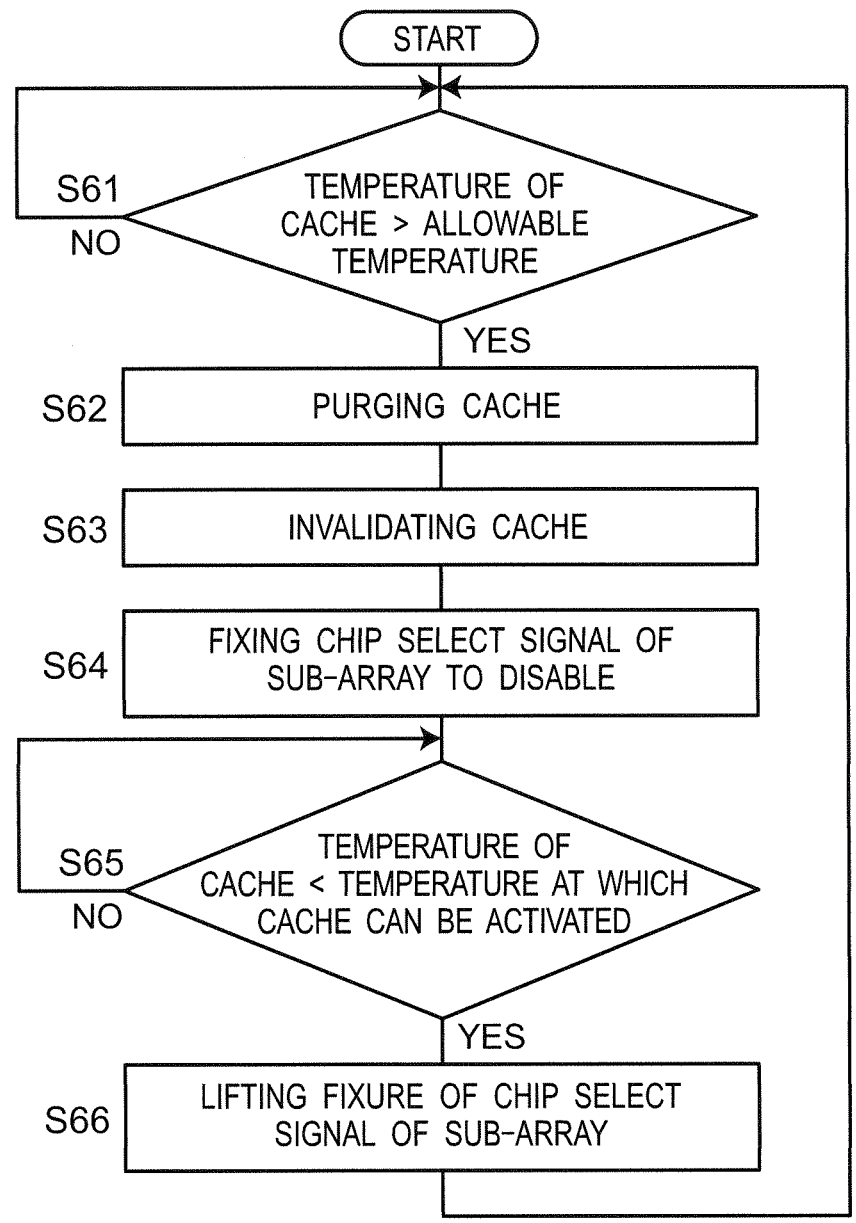
FIG. 18 is yet another processing flow of controlling the cache memory according to the fourth embodiment.

FIG. 18 is a sixth processing flow according to the fourth embodiment. The processing in steps S61 to S66 described in FIG. 18 is almost the same as that in steps S11 to S16 described in FIG. 13, except that a chip select signal of the sub-array in the cache memory (see FIG. 12) is fixed to disable (here, "1") without cutting off the power source in the processing flow described in FIG. 18 (S64). Unlike the processing of the power source cut-off, data does not volatilize in the processing of fixing the chip select signal of the sub-array to disable either.

Therefore, when the temperature of the cache memory decreases to lower than the temperature at which the cache memory can be activated (S65 YES); the cache memory needs not to be initialized in lifting the fixing of the chip select signal of the sub-array (S66). The chip select signal of the sub-array is fixed to disable by changing an input control signal to the CLK control/memory control circuit 30 in the block diagram of the sub-array of the SRAM illustrated in FIG. 12.

Meanwhile, the control method described in FIG. 13 to FIG. 18 may be combined to control the heat radiation from the partitioned cache memory. For example, the change of power voltage and the clock gating may be combined, or the change of power voltage and the change of the clock frequency may be combined.

Figure 19:
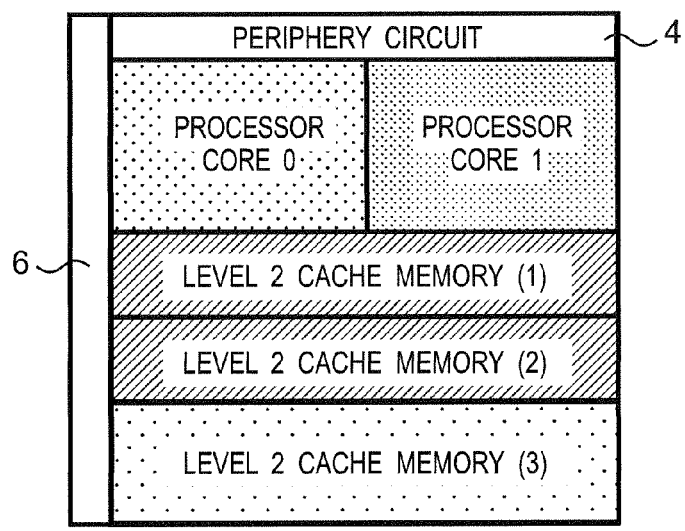
FIG. 19 is a plan view of a processor chip according to the fourth embodiment.

Further, when the temperature of the entire processor chip c1 increases as high as more than the allowable temperature for operation, a different control for the heat radiation may be performed for each block. For example, as illustrated in FIG. 19, the program may be executed with the power voltage and the operation frequency decreased in the processor core 0 and the level 2 cache memory (3). The heat radiation may be performed with the gating performed on the memory clock in the processor core 1 and the power source cut off in the level 2 cache memories (1) (2). With the configuration, when the temperature of the entire processor chip has increased, the processor chip can operate in a low speed mode by using the processor core 0 and the level 2 cache memory (3).

4.2. Summarization

In the fourth embodiment, the control for the heat radiation is performed on each of the partitioned circuit blocks of the cache memory based on the generated heat under monitoring. The control for the heat radiation includes the power source cut-off, the power voltage decrease, the clock gating, the memory clock frequency reduction, the reduction of the duty cycle of the memory clock, the fixing of the chip select signal of the sub-array of the SRAM, and the like.

Fifth Embodiment 5.1. Configuration for Controlling the Heat Radiation from the Partitioned Level 2 Cache Memory The fifth embodiment relates to a specific configuration for controlling the heat radiation from the partitioned cache memory. Unlike the fourth embodiment in which the temperature is all of the triggers for starting the control of the heat radiation, in the apparatus according to the fifth embodiment, something other than the temperature is the trigger for starting the control of the heat radiation. Incidentally, although the controlled object is the power voltage in the apparatus according to the fifth embodiment below, the controlled object may be something another (for example, the memory clock frequency) as described in the processing flow of the fourth embodiment.

5.1. (1) First Example

Figure 20:
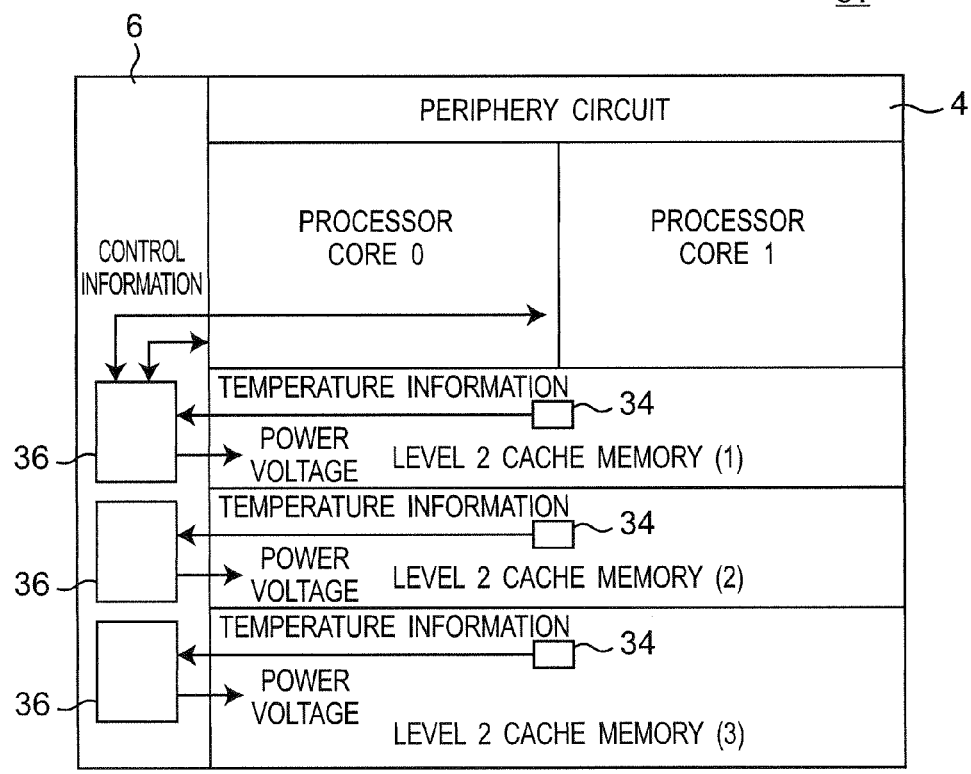
FIG. 20 is a diagram illustrating an example of circuitry of a processor chip according to a fifth embodiment.

FIG. 20 is a diagram illustrating a first example of circuitry of the processor chip c1 according to the fifth embodiment. In the processor chip c1 illustrated in FIG. 20, the power voltage of each of the level 2 cache memories (1) (2) (3) is controlled based on the temperature information of each block included in the level 2 cache memory, i.e., each of the level 2 cache memories (1) (2) (3). The temperature detection circuit 34 is arranged in each center of the level 2 cache memories (1) (2) (3) to sense the temperature inside each block of the level 2 cache memories (1) (2) (3). The temperature detection circuit 34 is made of a thermal diode, for example. The thermal diode is an element, the temperature of which part is determined by measuring the voltage with the current flown. The temperature information detected by the temperature detection circuit 34 is sent to the operation control circuit 6 arranged outside of the cache memory. A cache block power source control circuit 36 for controlling each power voltage for each block of the level 2 cache memory is provided in the operation control circuit 6. The purge processing of the cache memory is performed in the case where the temperature of each block of the level 2 cache memory increases not less than the allowable temperature for operation. That is, information on starting of decrease (or cut-off) of the power voltage is notified to the processor core side and the purge processing and the invalidation processing are performed. After these kinds of processing are completed in the processor core side, the cache block power source control circuit 36 performs the processing of decreasing (or cutting off) the power voltage.

5.1. (2) Second Example

Figure 21:
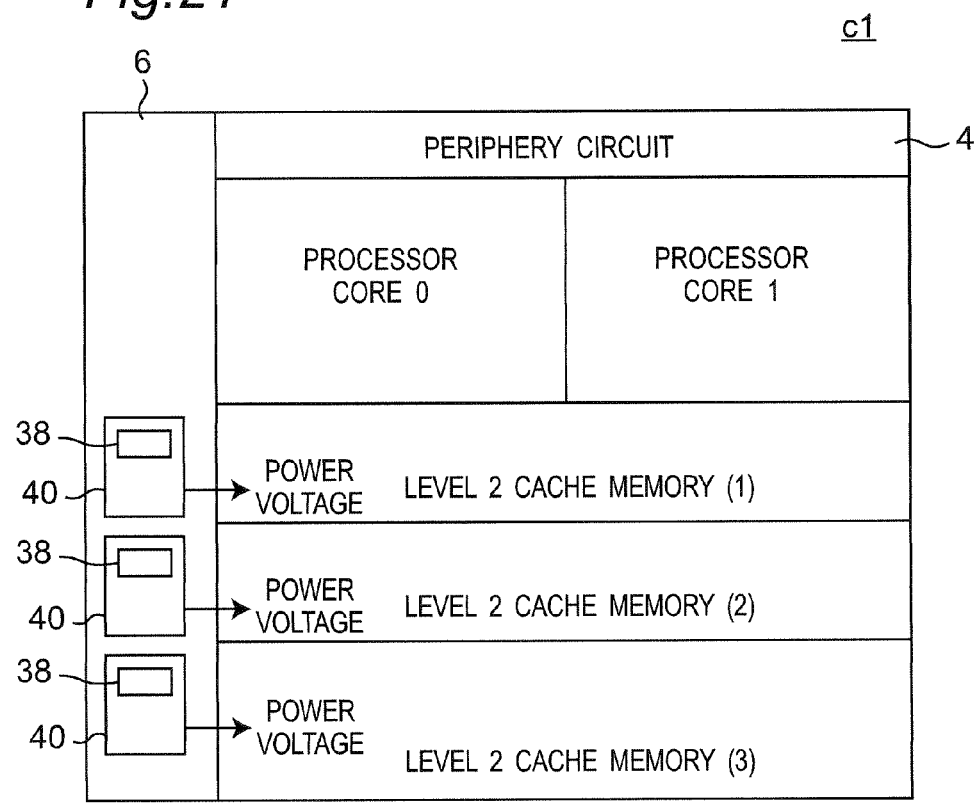
FIG. 21 is a diagram illustrating another example of circuitry of the processor chip according to the fifth embodiment.

FIG. 21 is a diagram illustrating a second example of circuitry of the processor chip c1 according to the fifth embodiment. In the processor chip c1 illustrated in FIG. 21, the operation control circuit 6 includes a cache block power source control circuit 40 for controlling each power voltage for each block of the level 2 cache memory, and each cache block power source control circuit 40 has a timer circuit 38. In the form illustrated in FIG. 21, the cache block power source control circuit 40 starts decreasing (or cutting off) the power voltage after a certain time period measured by the timer circuit 38. For example, when a predetermined processing is cyclically performed in a built-in processor, the processor chip may cause the cache block power source control circuit 40 to cut off the power source for the block of the level 2 cache memory by measuring a certain time period by the timer circuit 38. When the cycle changes according to the external temperature, the processor chip may be adapted to change the cycle of the timer circuit 38 according to the external temperature by inputting the external temperature in the timer circuit 38.

5.1. (3) Third Example

Figure 22:
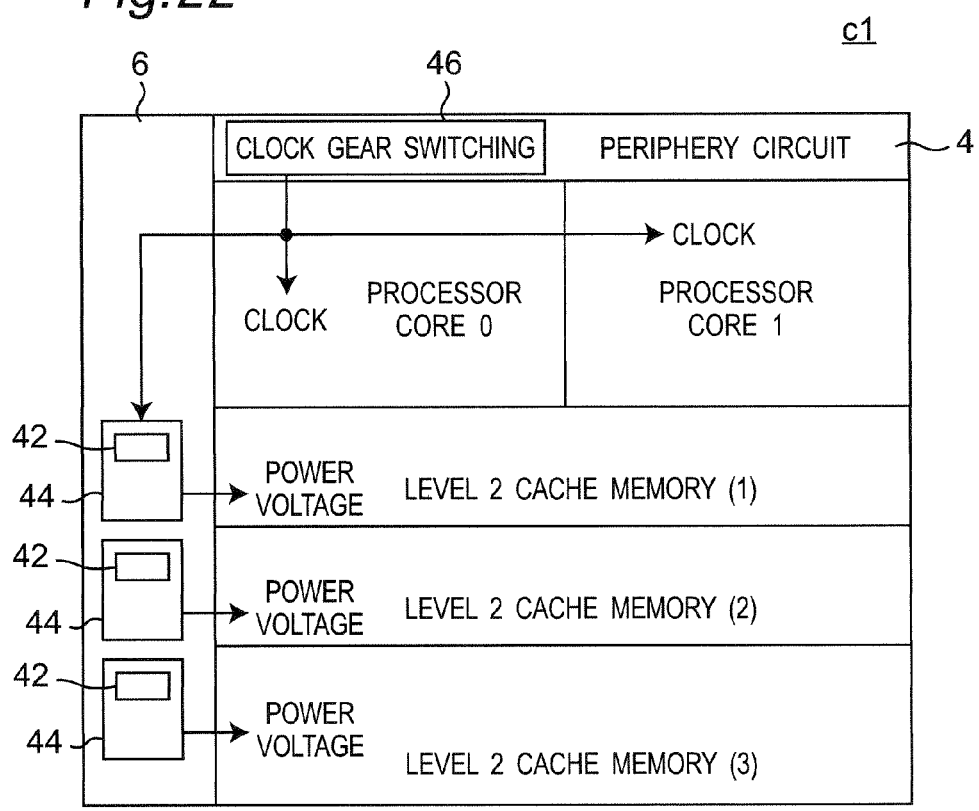
FIG. 22 is a diagram illustrating yet another example of circuitry of the processor chip according to the fifth embodiment.

FIG. 22 is a diagram illustrating a third example of circuitry of the processor chip c1 according to the fifth embodiment. The cache block power source control circuit 44 included in the operation control circuit 6 of the processor chip c1 illustrated in FIG. 22 causes the power voltage to be changed (or cut off) based on the clock signal supplied to the processor core. A clock gear switching circuit 46 included in the peripheral circuit 4 switches the frequency of the clock signal given to the processor cores (processor core 0, processor core 1). A clock monitor circuit 42 provided in each of the cache block power source control circuits 44 monitors the frequency of the clock signal supplied to the processor core. The cache block power source control circuit 44 controls to change (or cut off) the power voltage based on the monitor information of the clock monitor circuit 42.

Recently, a system of DVFS (Dynamic Voltage and Frequency Scaling) in which the supplied frequency and the voltage are changed according to the load to the processor is used. Therefore, tendency of heat generation in the processor core can be recognized as a result of monitoring the frequency of the clock signal to the processor core. For example, it is assumed that there is a processor which has the frequency of 1.8 GHz for a light load and the frequency of 3.8 GHz for a heavy load. In that case, for example, it might be possible that three steps of frequency (1.8 GHz, 3.0 GHz, 4.5 GHz) are previously assumed and the area of the cache memory to be used by the respective clock frequency is changed. As an example, it is assumed that, in the case of 1.8 GHz, only the level 2 cache memory (3) is used, in the case of 3.0 GHz, the level 2 cache memories (1) (2) (3) are used, and in the case of 4.5 GHz, the level 2 cache memories (2) (3) are used. Here, the case of 4.5 GHz is the case of instantly increasing the frequency and it is assumed that the cache memory near the processor core (i.e., the level 2 cache memory (1)) is not used by taking account of the heat influence. Although the clock monitor circuit 42 of the embodiment is for monitoring the clock frequency, it may incorporate a timer circuit according to the fifth embodiment illustrated in FIG. 21 to have a timer function in the clock monitor circuit 42 and cyclically perform the decrease (or cut-off) of the power voltage.

5.1. (4) Fourth Example

Figure 23:
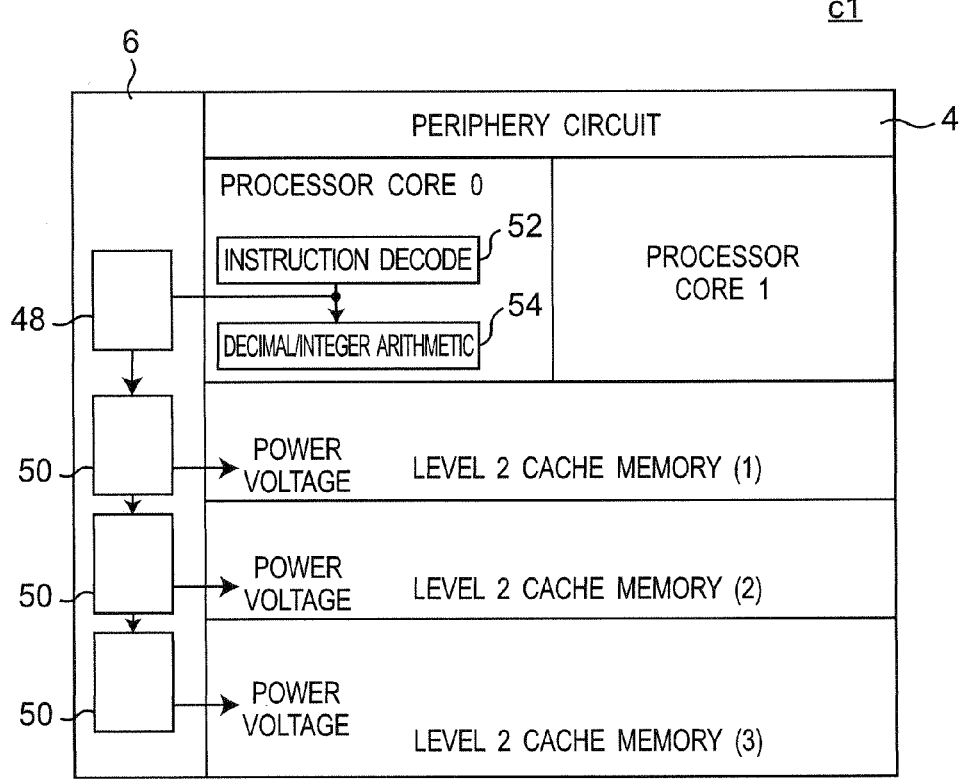
FIG. 23 is a diagram illustrating yet another example of circuitry of the processor chip according to the fifth embodiment.

FIG. 23 is a diagram illustrating a fourth example of circuitry of the processor chip c1 according to the fifth embodiment. The cache block power source control circuit 50 included in the operation control circuit 6 of the processor chip c1 illustrated in FIG. 23 causes the power voltage to be changed (or cut off) based on the rate of operation of the arithmetic unit in the processor core calculated by a rate of operation calculation circuit 48 which is also provided for the operation control circuit 6. Generally, the heat generation in the processor core is largely influenced by the frequency of use of the arithmetic unit. For example, in some processors, the integer arithmetic unit and the decimal arithmetic unit tend to generate the heat. By taking advantage of that tendency, the rates of operation of the decimal arithmetic unit and the integer arithmetic unit are calculated from instructions in the processor core. The rate of operation calculation circuit 48 illustrated in FIG. 23 calculates the rate of operation of the decimal/integer arithmetic circuit (arithmetic unit) based on an instruction supplied from the instruction decode unit 52 included in the processor core to the decimal/integer arithmetic unit 54. When the rate of operation calculated by the rate of operation calculation circuit 48 exceeds a certain baseline, the cache block power source control circuit 50 starts decreasing (or cutting off) the power voltage of the cache memory. Since the operation frequency of the decimal/integer arithmetic circuit also influences the heat generation, the rate of operation calculation circuit 48 may be adapted to calculate the rate of operation not only based on an instruction supplied from the instruction decode unit 52 to the decimal/integer arithmetic unit 54 but also based on the operation frequency of the processor core.

5.1. (5) Fifth Example

Figure 24:
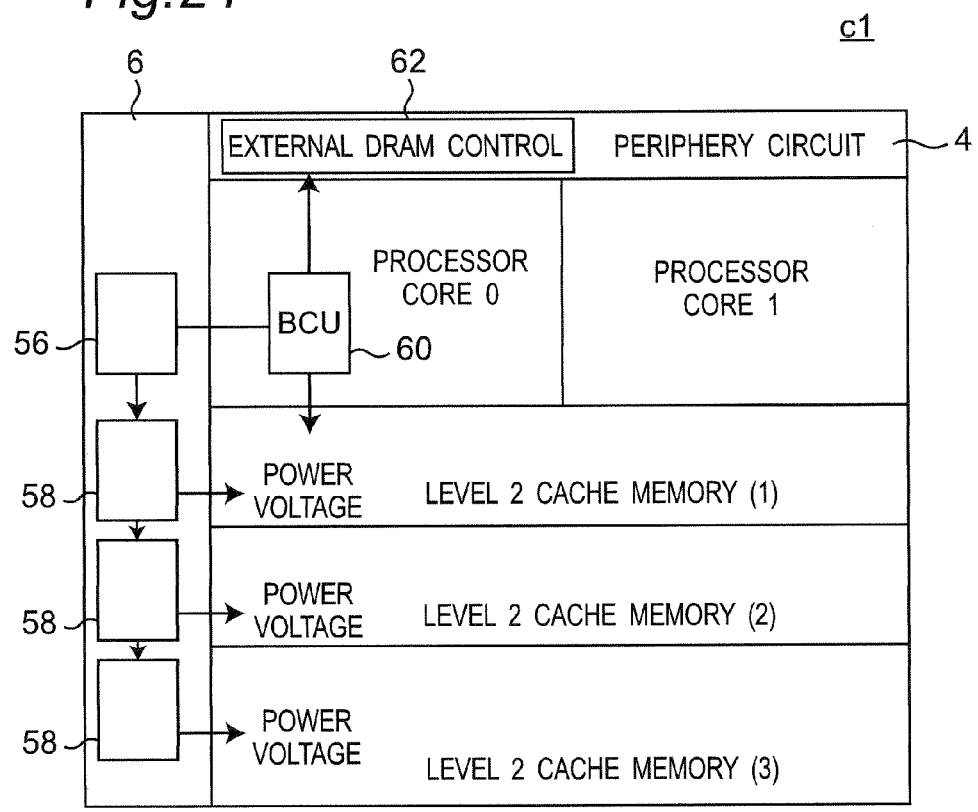
FIG. 24 is a diagram illustrating yet another example of circuitry of the processor chip according to the fifth embodiment.

FIG. 24 is a diagram illustrating a fifth example of circuitry of the processor chip c1 according to the fifth embodiment. The cache block power source control circuit 58 included in the operation control circuit 6 of the processor chip c1 illustrated in FIG. 24 causes the power voltage to be changed (or cut off) based on the miss rate of the cache memory calculated by the cache miss rate calculation circuit 56 which is also provided for the operation control circuit 6. When the cache miss frequently occurs, the processor core usually stops the processing without performing arithmetic operation. In other words, the processor core which frequently has cache miss is mostly suspended without performing so many arithmetic operations, therefore, it does not generate the heat. By taking advantage of that, the power voltage of each block of the level 2 cache memory is changed according to the scale of the cache miss rate. In the processor chip c1 illustrated in FIG. 24, in the case of the cache miss, an access occurs from the BCU (Bus Control Unit) 60 inside the processor core to an external memory via an external DRAM control unit 62 of the peripheral circuit 4. The cache miss rate calculation circuit 56 calculates the cache miss rate based on the access signal to an external memory via the BCU 60. When the cache miss rate calculated by the cache miss rate calculation circuit 56 decreases to a value below a predetermined threshold value for a predetermined time period, the cache block power source control circuit 58 starts decreasing (or cutting off) the power voltage of the cache memory.

5.2. Summarization

In the fifth embodiment, the control for the heat radiation is performed on the partitioned circuit blocks of the cache memory based on the trigger for starting control of the heat generation. The trigger for controlling the heat radiation includes temperature information in the partitioned circuit blocks of the cache memory, cycle, the frequency of the clock signal supplied to the processor core, the rate of operation of the arithmetic unit in the processor core, the miss rate of the cache memory and the like.

Sixth Embodiment

6.1. Arrangement of the Operation Control Circuit in the Processor Chip

The sixth embodiment relates to the arranged position of the operation control circuit 6 which controls the heat radiation from the cache memory or the processor core. When the temperature of the operation control circuit 6 increases higher than the allowable temperature for operation under the influence of surrounding heat, the heat radiation from the cache memory or the processor core is not appropriately performed. Therefore, generation of the surrounding heat needs to be taken into account with respect to the arranged position of the operation control circuit 6.

6.1. (1) First Example

For example, as illustrated in FIG. 25(*a*), when the operation control circuit 6 is arranged near to the processor core (processor core 0, processor core 1), the temperature of the operation control circuit 6 itself may be higher than the allowable temperature for operation under the influence of the heat. Therefore, in the processor chip in which the processor core is likely to generate the heat, the operation control circuit 6 is preferably arranged at a distance from the processor core. FIG. 25(*b*) is a diagram illustrating a first example of the circuit layout of the processor chip c1 according to the sixth embodiment. The shaded part indicates the area in which the heat at 85 degrees or more is likely to be generated. As illustrated in FIG. 25(*b*), the operation control circuit 6 is arranged near to the level 2 cache memory and farthest from the processor core in the processor chip c1. With that arrangement, the operation control circuit 6 is almost insusceptible to the heat generated from the other parts, as a result, the temperature of the operation control circuit 6 itself does not increase to the acceptable range or more. Further, with the cache memory interposed between the operation control circuit 6 and the processor core, the cooling operation such as the power source cut-off in the cache memory may be started before the heat is conducted from the processor core to the operation control circuit 6. As a result, the operation control circuit 6 easily maintains the low temperature.

6.1. (2) Second Example

Figure 26:
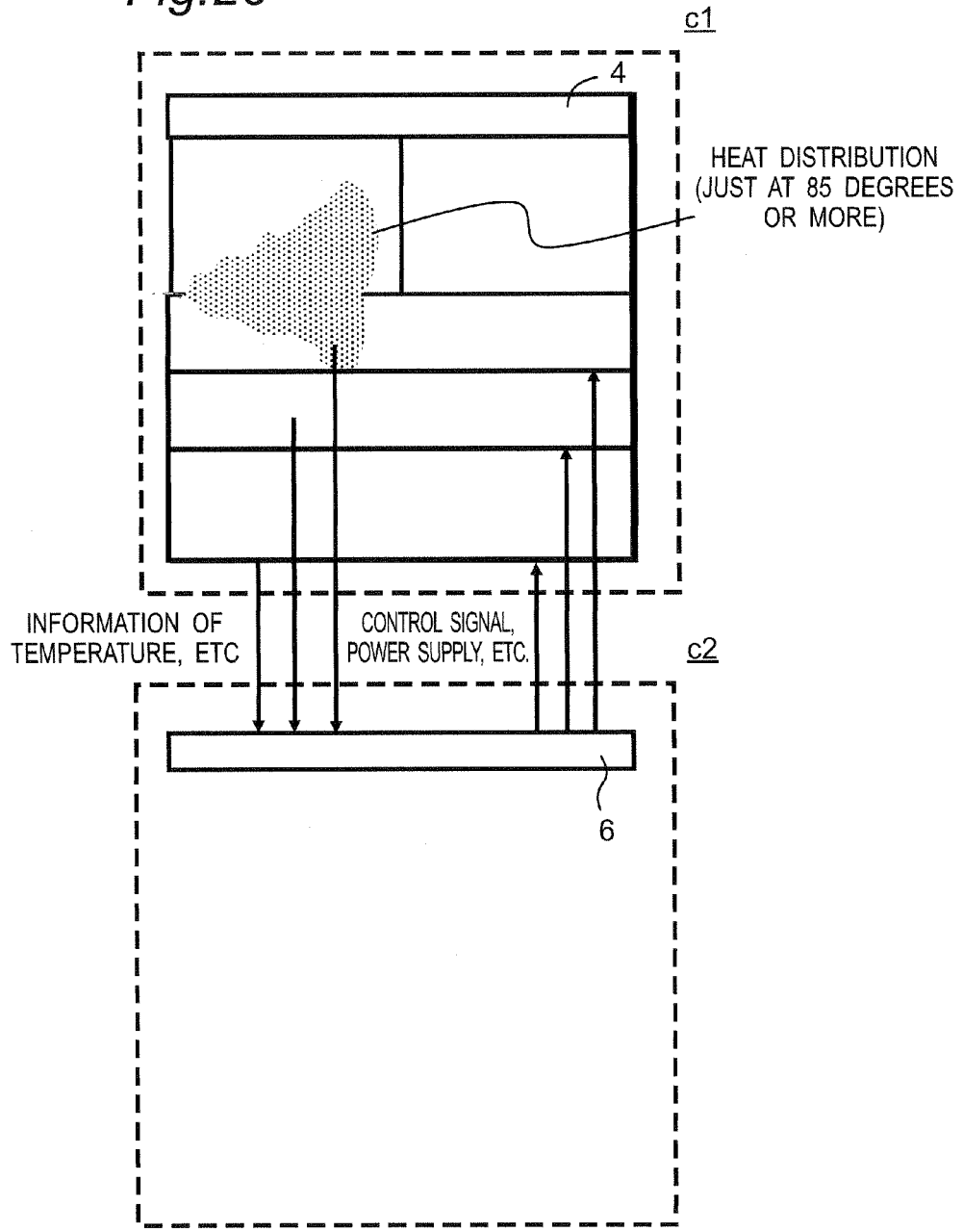
FIG. 26 is a diagram illustrating another example of a circuit layout of the processor chip according to the sixth embodiment.

FIG. 26 is a diagram illustrating a second example of the circuit layout of the processor chip c1 according to the sixth embodiment. The operation control circuit 6 illustrated in FIG. 26 is arranged on another chip c2. When the operation control circuit 6 is arranged on another chip c2 like that, the heat is not conducted via the silicon substrate or the metallic wire. That is, the heat that would otherwise be conducted to the operation control circuit 6 is cut off more surely than in the case where the operation control circuit 6 is formed on the same chip as the processor core and the cache memory.

6.1. (3) Third Example

FIG. 27(*a*) is a diagram illustrating a third example of the circuit layout of the processor chip c1 according to the sixth embodiment. In the circuit layout illustrated in FIG. 27(*a*), the operation control circuit 6 is arranged on the periphery of the processor chip c1. With the operation control circuit 6 arranged on the periphery of the processor chip c1 like that, the heat of the operation control circuit 6 easily escapes. Particularly, in case that a three-dimensional stack is applied, cooled air and liquid may be sent not only from the top surface and the bottom but also from the sides of the processor chip c1, the temperature of the processor chip c1 may be lower on the periphery than in the center of the processor chip c1. When an IO cell 64 is disposed on the periphery of the processor chip c1, however, the operation control circuit 6 is arranged inner side than the IO cell 64.

6.1. (4) Fourth Example

Figure 28:
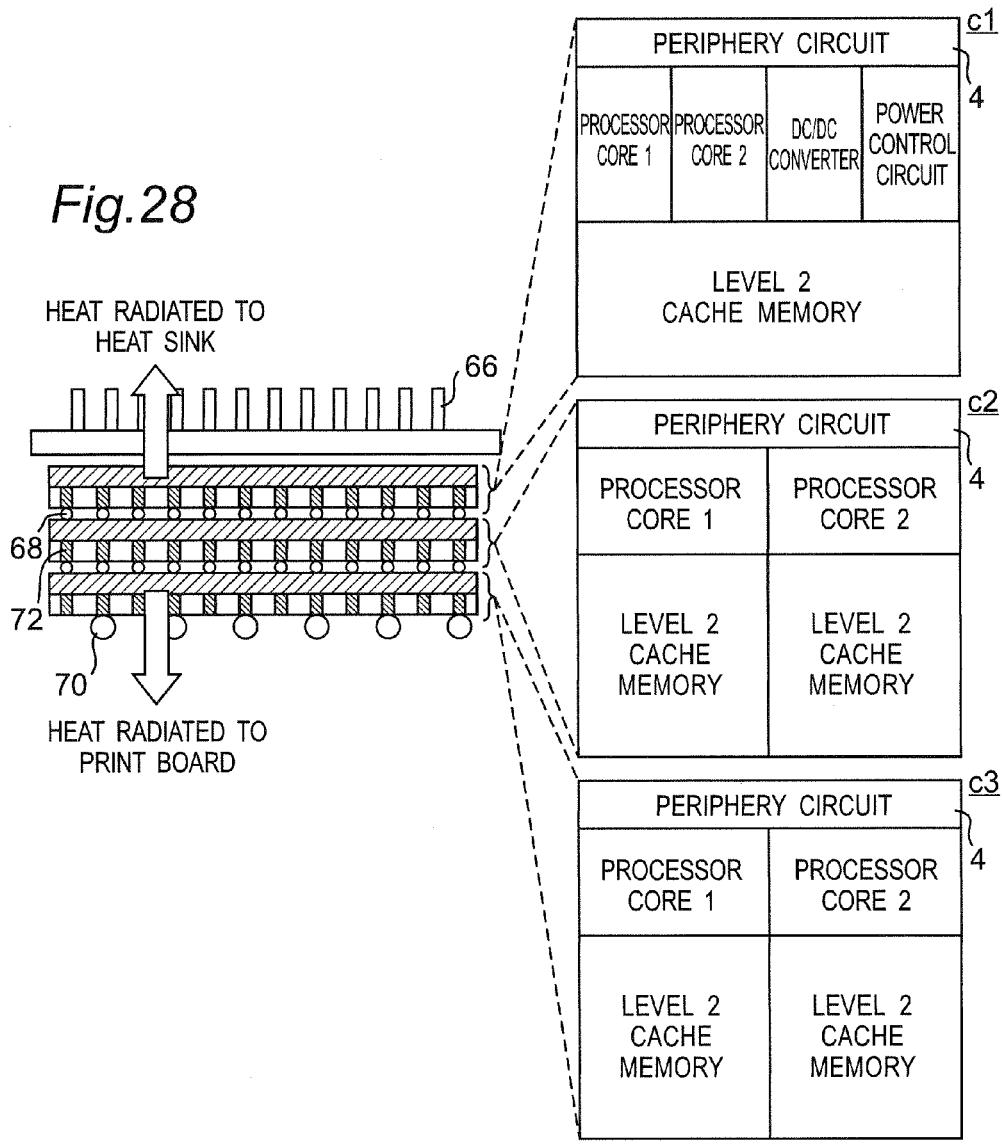
FIG. 28 is a diagram illustrating yet another example of the circuit layout of the processor chip according to the sixth embodiment.

FIG. 28 is a diagram illustrating a fourth example of the circuit layout of the processor chip c1 according to the sixth embodiment. The circuit illustrated in FIG. 28 is a three-dimensional stacked three processor chips c1, c2, c3 with a heat sink 66 provided on the top surface of the top processor chip c1. In the three dimensional stacked circuit illustrated in FIG. 28, the operation control circuit 6 is arranged in the top processor chip c1 which is nearest to the heat sink 66.

Since the heat generated in the three dimensional stacked circuit illustrated in FIG. 28 is radiated from the heat sink 66 on the top of the three dimensional stacked circuit and a printed circuit board on the bottom of the three dimensional stacked circuit, the processor chip c2 in the middle tends to have the highest temperature. Next to the temperature of the processor chip c2, the temperatures of the processor chip c3 on the printed circuit board side and the processor chip c1 on the heat sink 66 side increase to higher in the order. Since the temperature of the processor chip c1 which is near to the heat sink 66 is the lowest and easily becomes stable in the above described structure, the operation control circuit 6 is preferably implemented to that part. That implementation of the operation control circuit 6 can prevent the operation control circuit 6 from exceeding the allowable temperature for operation.

With the configuration of cooling the heat by flowing liquid through the processor chip c2 of the middle layer, the operation control circuit 6 may be arranged on the processor chip c2 which contacts the coolant, or the operation control circuit 6 may be arranged on the processor chip which is adjacent to the cooling mechanism. Since a large amount of heat escapes to the printed circuit board side too, the operation control circuit 6 may be arranged in the processor chip c3 which is nearest to the printed circuit board.

6.2. Summarization

In the sixth embodiment, in the processor chip in which the processor core and the level 2 cache memory are partitioned as required, the operation control circuit which controls the heat radiation from the processor core and the cache memory is arranged at the position at which low temperature can be maintained low. That arrangement prevents the temperature of the operation control circuit from becoming higher than the allowable temperature for operation.

Seventh Embodiment

7.1. Configuration of a Conventional Three-Dimensional Integrated Circuit

The seventh embodiment relates to a three-dimensional integrated circuit which is made of a plurality of processor chips stacked. First, a general three-dimensional integrated circuit made of a plurality of processor chips will be described.

Figure 29:
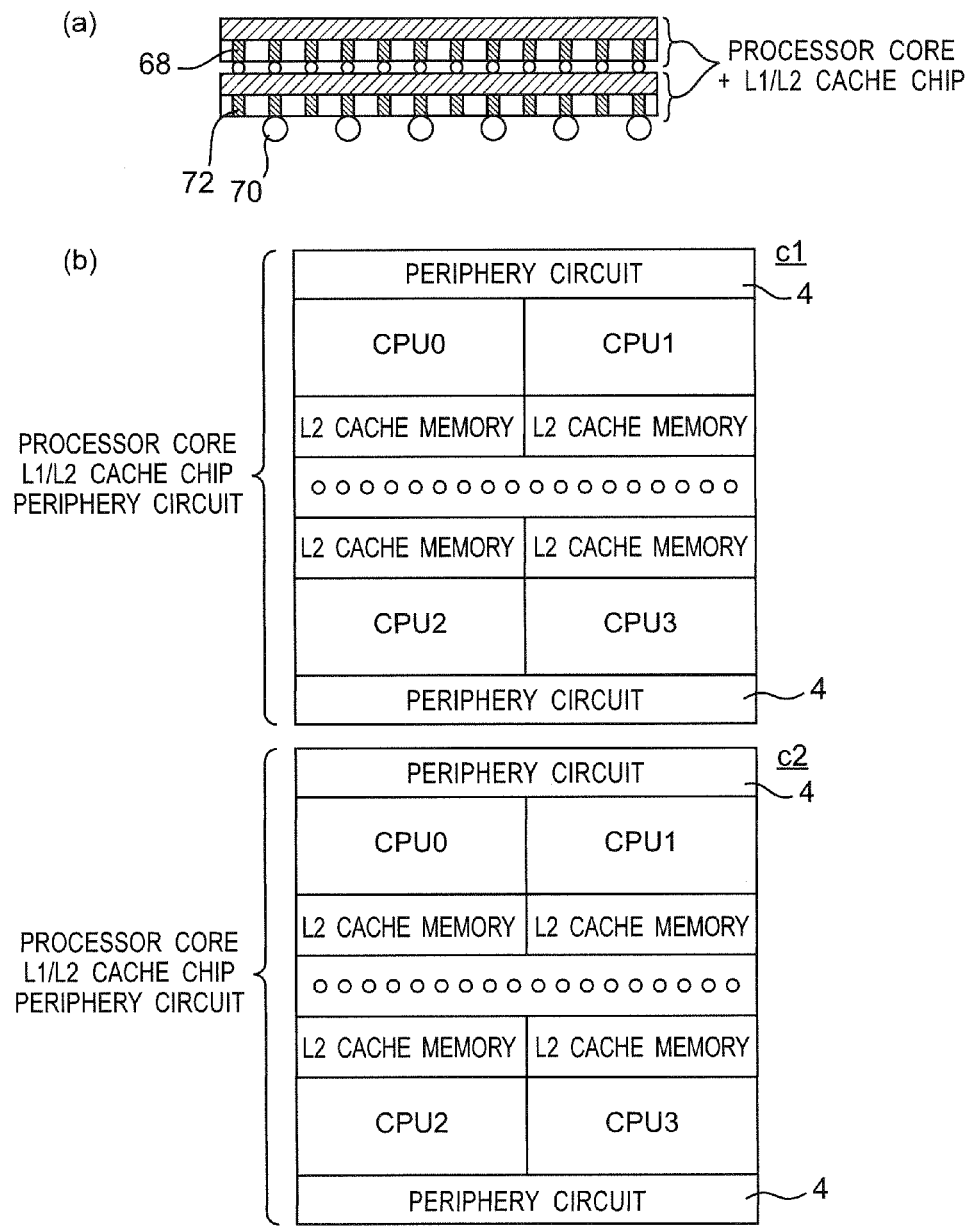
FIG. 29(a) is a side view of a three-dimensional integrated circuit with two processor chips stacked as illustrated in FIG. 29(b)
FIG. 29(b) is a circuit diagram of a processor chip.

FIG. 29(*a*) is a side view of a three-dimensional integrated circuit with two processor chips, each of which includes the processor core, the level 1 cache memory, and the level 2 cache memory illustrated in FIG. 29(*b*), stacked. Each of the processor chips is designed to operate by itself with four processor cores as well as the level 1 cache memory and the level 2 cache memory implemented in the same processor chip. The peripheral circuit 4 for accessing a graphics circuit and an external memory is implemented on the periphery. A three-dimensional multi-processor is realized by a processor chip c1 of such a basic configuration as described above and another processor chip c2 connected via a bump 68 which is arranged in the central part of the processor chip.

It is also possible to realize the configuration of the multi-processor on a board, but the processor chips directly connected via the bump 68 make a circuit which operates in a wider-band, consumes smaller power, and operates at a higher speed.

In the three-dimensional integrated circuit stacked like that, the number of processor core(s) can be varied according to the product grade. For example, as illustrated in FIG. 30(a) and (b-1), (b-2), (b-3), a multicore processor system can be built as a configuration of four cores for one chip for the low end, a configuration of eight cores for two chips for the middle range, and a configuration of 16 cores for four chips for the high end. Since such a three-dimensional integrated circuit can be manufactured by stacking the same chips produced in large quantities, the cost of the chip mask can be suppressed, and further, the production line in the production plant can be effectively used.

Generally, the larger the area of the integrated circuit, the lower the efficiency percentage, the three-dimensional integrated circuit is advantageous also in terms of the yield rate and the cost. Particularly as a measure of yield rate of chip as big as more than hundreds $mm^2$ such as the processor chip, it is effective to divide the chip into small chips and stack them three-dimensionally.

7.2. Issue of the Heat in Stacking the Same Chips

When a plurality of the same processor chips are stacked, the generation of heat becomes an issue. FIG. 31(a) is a side view of a three-dimensional integrated circuit with two processor chips c1, c2 stacked, and FIG. 31(b) is a schematic diagram of stacking the two processor chips c1, c2. Each of the processor chips illustrated in FIGS. 31(a) (b) has two areas of processor core and two areas of the level 2 cache memory.

In the processor chip, the temperature inside the processor core is more likely to increase than that of the level 2 cache memory. In the processor chips c1, c2 illustrated in FIG. 31(b), the parts which have a large heat value are the processor core 0 and the processor core 1. Since the level 2 cache memory is a storage element and not the all of the cells forming the memory are activated at the same time, the level 2 cache memory has a small heat value. When these processor chips are simply stacked, the processor core parts in the two processor chips c1, c2 are layered as illustrated in FIG. 31(b). Since the heat sources are layered in the vertical direction, the temperatures of the processor core parts of the two processor chips c1, c2 increase to quite high values.

The inventor has confirmed by a simulation that the temperatures increase to 10 degrees or more than in the case of operating the processor chip as a single unit. In the configuration illustrated in FIG. 31(b), the performance decreases more than in the configuration of operating the processor chip as a single unit.

7.3. Stacking Structure

The seventh embodiment is for solving the above described problem. The three-dimensional integrated circuit according to the embodiment is a three-dimensional integrated circuit made of two or more processor chips stacked, characterized in that at least two processor chips among the stacked processor chips have the same circuit block layout and are stacked in different orientation among layers. "The same circuit block layout" here means that the processor chips are the same in the transistor layer other than the wire layer in the mask. In other words, the processor chips are the same in the mask used in the FEOL (Front End of Line) process.

7.3. (1) First Example

FIG. 32(a) is a side view of the three-dimensional integrated circuit according to the seventh embodiment with two processor chips c1, c2 stacked, and FIG. 32(b) is a schematic diagram of stacking the two processor chips c1, c2 in the three-dimensional integrated circuit according to the seventh embodiment. In the seventh embodiment, the processor chip c1 and the processor chip c2 are stacked in the different orientations by 180 degrees. By stacking the processor chips c1, c2 in the different orientations by 180 degrees like that, the processor core of a large heat value and the cache memory of a small heat value can be layered. With that configuration, parts of a large heat value are not layered, therefore, a hot spot which would occur when the processor cores are layered in the configuration illustrated in FIG. 31 does not occur. Therefore, when the configuration illustrated in FIG. 32 is used, it can be expected that the cost of the cooling mechanism is suppressed and that the performance of the circuits is enhanced.

In the configuration illustrated in FIG. 32, two processor chips c1, c2 are stacked in the different orientations by 180 degrees like that. Herein, the angle between the processor chips stacked may not be 180 degrees. The angle may be 45 degrees or 90 degrees. The processor chips may be stacked as they are shifted to each other with an offset instead of being stacked in different orientations, as far as the parts of a large heat value, such as processor cores, are not layered. Alternatively, as illustrated in FIG. 33 (a) (b), the processor chips may be stacked with an offset and also in different orientations.

The idea of the invention according to the seventh embodiment is not realized only by the two processor chips of the same circuit layout. The idea of the invention according to the seventh embodiment can be realized in the three-dimensional integrated circuit which is made by staking two or more chips each of which includes a plurality of circuit blocks, even though the circuit block layout is different between the two or more chips.

That is, the idea of the invention according to the seventh embodiment is realized by the three-dimensional integrated circuit of the configuration below. First, the three-dimensional integrated circuit includes a first chip, and a second chip which is directly stacked on the first chip. The first chip includes a circuit block with a relatively large heat value and a circuit block with a relatively small heat value. The second chip also includes a circuit block with a relatively large heat value and a circuit block with a relatively small heat value. In that case, it is only needed that the first chip and the second chip are arranged to each other so that the circuit block with a relatively large heat value in the first chip is not layered on the circuit block with a relatively large heat value in the second chip in the vertical direction.

The idea of the invention according to the seventh embodiment can also be realized in the case where the first chip and the second chip are arranged to each other and stacked so that the overlapping layered area of the circuit block with a relatively large heat value in the first chip and the circuit block with a relatively large heat value in the second chip is minimized. Meanwhile, "the circuit block with a relatively large heat value" and "the circuit block with a relatively small heat value" here are the circuit blocks (1) to (3) below, for example.

(1) The circuit block with the heat value larger than a predetermined value and the circuit block with the heat value smaller than a predetermined value.
(2) The circuit block with the largest heat value and the other circuit blocks.
(3) The block with the heat value larger than the mean value of the heat values of the circuit blocks of the entire chip and the block with the heat value smaller than the mean value of the heat values of the circuit blocks of the entire chip.

By configuring the three-dimensional integrated circuit as described above, the parts of large heat values are hardly layered, therefore, the hot spot does not occur. As a result, it can be expected that the cost of the cooling mechanism in the three-dimensional integrated circuit is suppressed and that the performance of the three-dimensional integrated circuit is enhanced.

7.3. (2) Second Example

Figure 34:
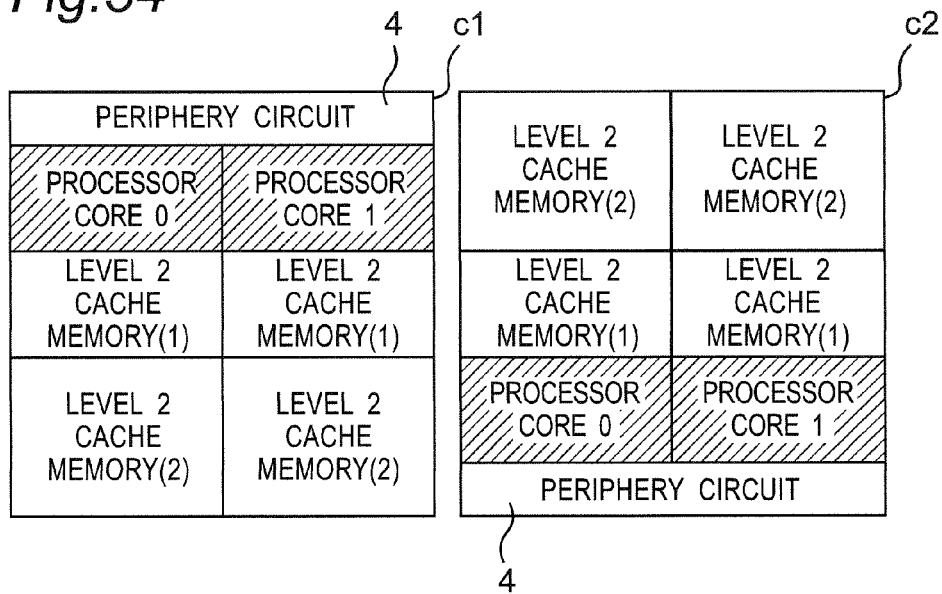
FIG. 34 is a diagram illustrating yet another example of the three-dimensional stacked circuit according to the seventh embodiment.

FIG. 34 illustrates a second example of the three-dimensional stacked circuit according to the seventh embodiment, where an area in which the parts of small heat values are layered is further divided. That is, the level 2 cache memories are divided into the area in which the processor cores and the level 2 cache memories are layered and the area in which the level 2 cache memories are layered on each other in the processor chip c1 and the processor chip c2. With that configuration, even though the heat conducted from a processor core of a certain processor chip causes the temperature of the level 2 cache memory (2) of the other processor chip to exceed the allowable temperature for operation, it is supposed that the heat is not conducted so much to the remaining level 2 cache memories (1) of the other processor chip. That configuration can minimize the performance degradation caused by the partial stop of the cache memory.

Figure 35:
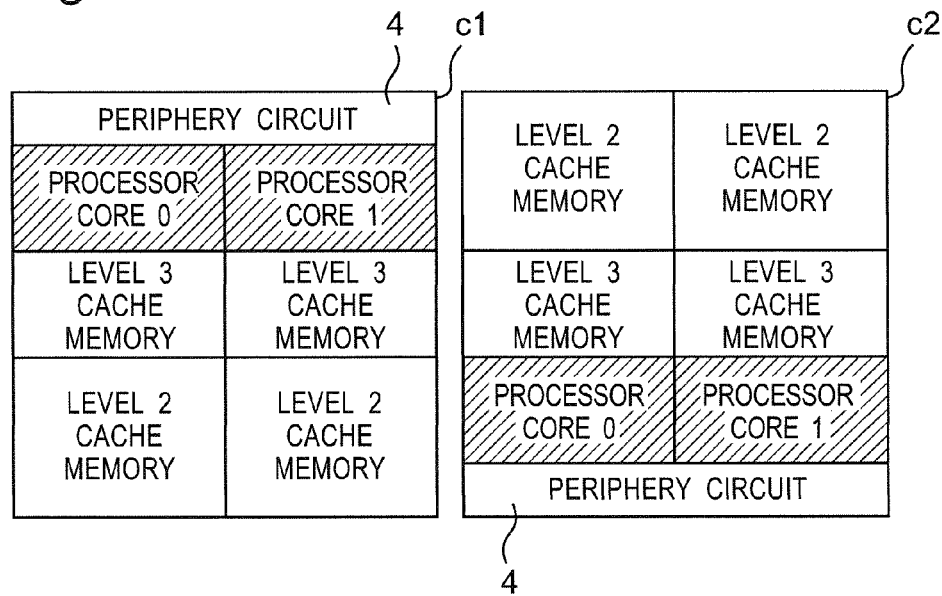
FIG. 35 is a diagram illustrating yet another example of the three-dimensional stacked circuit according to the seventh embodiment.

Alternatively, the configuration illustrated in FIG. 34 may be further modified to make the central part of each of the processor chips c1, c2 to be a level 3 cache memory as illustrated in FIG. 35. Meanwhile, since the central area of each processor chip is not easily influenced by the heat, the central area of each processor chip may be configured as a cache memory which can be shared by the respective cores of each processor chip.

7.3. (3) Third Example

Figure 36:
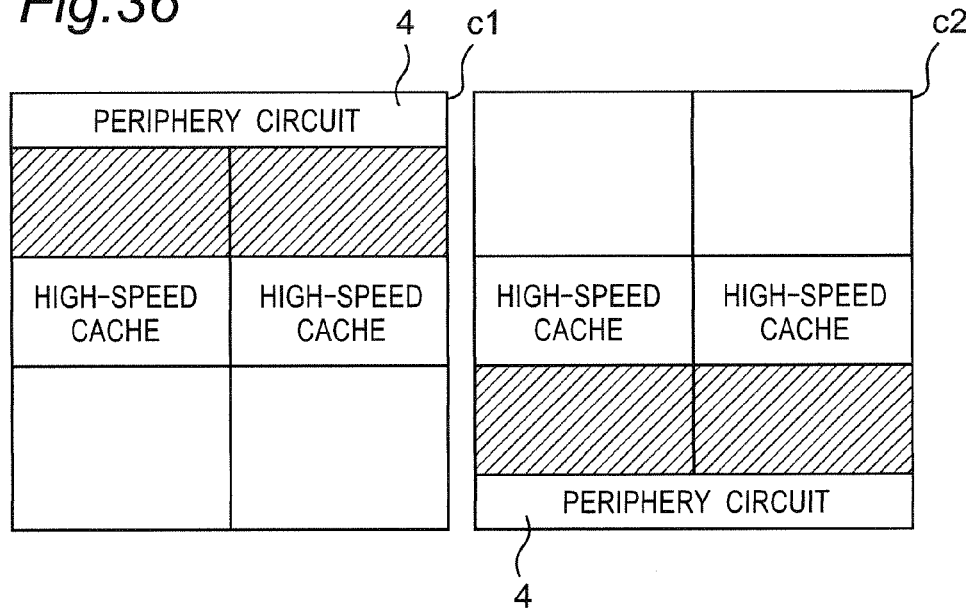
FIG. 36 is a diagram illustrating yet another example of the three-dimensional stacked circuit according to the seventh embodiment.

FIG. 36 is a diagram illustrating a third example of the three-dimensional stacked circuit according to the seventh embodiment. The area in which the parts of small heat values are layered has the temperature lower than those of the other parts on average. By taking advantage of that feature, high-speed cache memories may be mounted to the area in which the parts of small heat values are layered as the three-dimensional stacked circuit illustrated in FIG. 36. A high-speed cache memory operates fast, but on the other hand, it tends to have the consumption current increased, and accordingly, tends to generate larger heat. However, since the area in which the cache memories in the central parts of the respective processor cores are layered has a relatively low temperature, the heat does not make a big problem even though a high-speed cache memory is arranged. Especially the area in which the cache memories are layered often becomes near to the processor cores, therefore, performance of the high-speed cache memory is to be made use of in the arrangement illustrated in FIG. 36.

Figure 37:
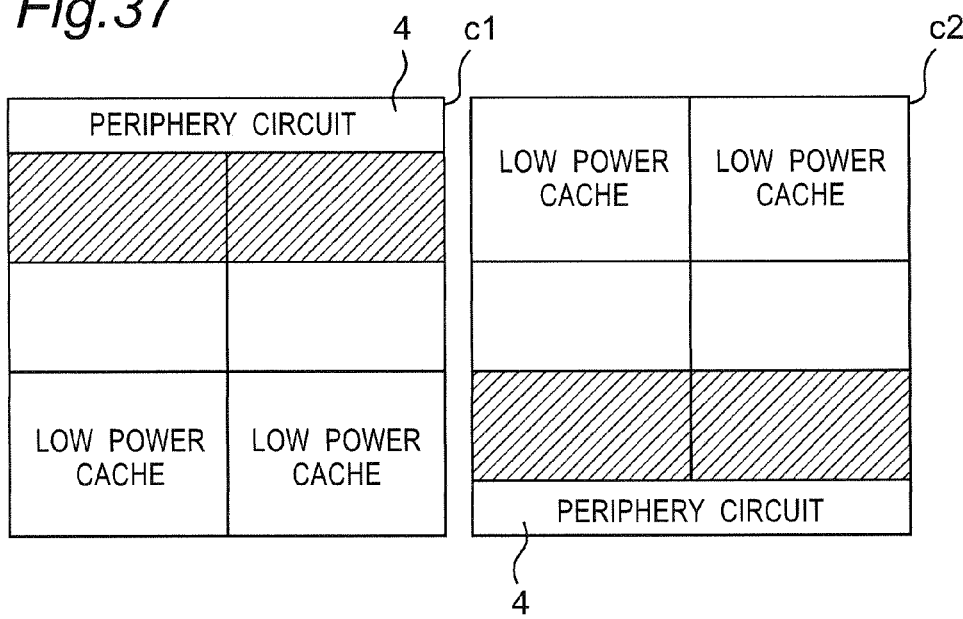
FIG. 37 is a diagram illustrating yet another example of the three-dimensional stacked circuit according to the seventh embodiment.

Further, a low power cache memory can be mounted to the area which is layered with the part of a large heat value as illustrated in FIG. 37, other than the configuration illustrated in FIG. 36. When a memory of large power consumption is arranged in the area of the level 2 cache memory which layers on the part of a large heat value (i.e., the part of processor core, for example), the heat value becomes large. As a result, when a cache memory of small power consumption such as a low power cache memory is arranged, the heat generation can be suppressed.

7.3. (4) Fourth Example

Figure 38:
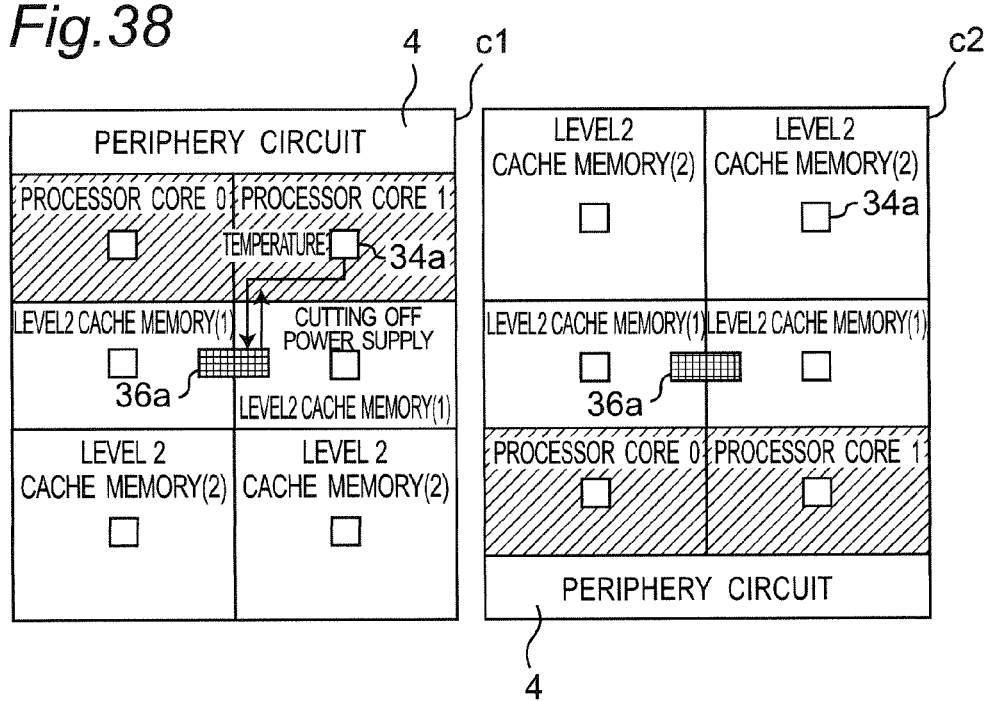
FIG. 38 is a diagram illustrating yet another example of the three-dimensional stacked circuit according to the seventh embodiment.

FIG. 38 is a diagram illustrating a fourth example of the three-dimensional stacked circuit according to the seventh embodiment. It is preferable not to arrange the control circuit and the like of the entire processor in the part which is layered on the part of large heat value (for example, the processor core) in stacking. In the circuit illustrated in FIG. 38, the power control circuit 36a which controls the power source for the entire processor chip is arranged in the area in which the cache memories are layered. Here, each of the power source control circuits 36a in FIG. 38 controls the power source for the entire processor chip based on the temperatures detected by the temperature sensors 34a provided for the processor cores on the same processor chip.

7.4. Summarization

The three-dimensional integrated circuit according to the seventh embodiment is a three-dimensional integrated circuit made of two or more processor chips stacked, characterized in that at least two processor chips among the stacked processor chips have the same circuit block layout and are stacked in different orientation among layers. With that arrangement, it is more easily to prevent the hot spot from occurring in the three-dimensional integrated circuit.

Eighth Embodiment

8.1. Control on the Operation of the Processor Core

8.1. (1) First Example

FIG. 39(a) is a diagram illustrating a configuration of a first example of the three-dimensional integrated circuit in the eighth embodiment. The three-dimensional integrated circuit of the first example is a three-dimensional integrated circuit with three processor chips c1, c2, c3 stacked. FIG. 39(b) is a schematic diagram in a case of stacking the three processor chips c1, c2, c3 according to the eighth embodiment. The three-dimensional integrated circuit according to the eighth embodiment builds a multiprocessor system. This system (three-dimensional integrated circuit) is built by three processor chips of the same circuit layout layered. With two processor cores mounted to each chip, the multiprocessor system has six processor cores in total. The software program recognizes such a three-dimensional multicore processor as a processor chip with six processor cores arranged on one chip, i.e., a six-core multiprocessor.

As previously described, a three-dimensional integrated circuit which is made of processor chips stacked has a problem of heat radiation. For example, when the parts of circuit blocks which generate the heat are layered as a result of stacking and also when they operate at the same time, the more heat is generated than that from a single-layered processor chip. For that reason, it is preferable to execute the program by taking account of the heat generation in the multiprocessor system.

First, in the three-dimensional integrated circuit illustrated in FIG. 39, an assignment control unit provided for the three-dimensional integrated circuit controls the circuit not to layer the processor cores which execute the program in the upper layer and the lower layer. That is, as illustrated in FIG. 39(c), the assignment control unit assigns a process (i.e., the program) to a processor core so as not to layer the processor cores which operate in the respective processor chips in the three-dimensional direction.

FIG. 40(a) is a block diagram illustrating relationship between the three processor chips c1, c2, c3 and an assignment control unit 77 in the three-dimensional integrated circuit according to the eighth embodiment. The assignment control unit 77 includes a processor core position storage unit 88. The processor core position storage unit 88 stores data on a position (position data) of each processor core (the processor core 1-0, the processor core 1-1, the processor core 2-0, the processor core 2-1, the processor core 3-0, the processor core 3-1) in the three-dimensional integrated circuit.

The assignment control unit 77 is included in each peripheral circuit 4 of the processor chips c1, c2, c3, for example. Alternatively, one of the processor cores may operate as the assignment control unit 77. That is, one of the processor cores may include the assignment control unit 77. FIG. 40(b) illustrates a configuration of the three-dimensional integrated circuit according to the eighth embodiment which includes three processor chips c1, c2, c3 in which the processor core 1-0 of the processor chip c1 includes the assignment control circuit.

FIG. 39(c) is a table showing an example operation for the three-dimensional integrated circuit according to the eighth embodiment to operate the processor cores in the respective processor chips under the control of the assignment control unit 77. In the example operation 1, for example, of the table shown in FIG. 39(c), the processor core 1-1 of the processor chip c1, the processor core 2-0 of the processor chip c2, and the processor core 3-1 of the processor chip c3 operate.

That is, the processor cores are controlled so that the processor cores in the vertically layered parts in the adjacent processor chips do not operate. Since the processor cores in the adjacent vertically layered parts do not operate at the same time, i.e., since the processor cores are not layered as the heat source, under the process (program) assignment like that, generation of the high-temperature hot spot can be prevented.

In the example operation in the table of FIG. 39(c), the assignment control unit 77 assigns the process (program) based on the position data in the three-dimensional integrated circuit of each processor core stored in the processor core position storage unit 88 so that the processor cores which execute the program are not vertically layered.

The assignment control unit 77 can control the process (program) assignment in various manners by assuming the heat generation based on the position data in the three-dimensional integrated circuit of each processor core stored in the processor core position storage unit 88. First, the assignment control unit 77 may control the assignment of the program to each processor core so that the processor cores adjacently arranged in the right-left direction do not execute the program at the same time. In the examples of FIG. 40(a) (b), for example, the program assignment would be controlled so that the processor core 2-0 and the processor core 2-1 do not execute the program at the same time.

Further, the assignment control unit 77 may control the assignment of the program to each processor core so that, when a certain processor core is executing a program, the processor core farthest from the certain processor core executes the program subsequently to the certain processor core. In the examples of FIG. 40 (a) (b), for example, the program assignment would be controlled so that, when the processor core 1-1 is executing a program, the processor core 3-0 which is the farthest from the processor core 1-1 executes the program subsequently to the processor core 1-1.

Further, the assignment control unit 77 may control the assignment of the program to each processor core so that, when a heat sink is provided for the three-dimensional integrated circuit, the processor cores near to the heat sink take priority of executing the program. For example, in the three-dimensional integrated circuit in which the processor chips c1, c2, c3 illustrated in FIG. 40(b) are stacked as illustrated in FIG. 40(c) and the heat sink 66 is further arranged on the processor chip c1, the program assignment is controlled so that the processor core 1-0 and the processor core 1-1 in the processor chip c1 have priority over the other processor cores in the program assignment.

Further, when one of the processor cores includes the assignment control unit 77 as illustrated in FIG. 40(b), the assignment control unit 77 may control the assignment of the program to each processor core so that the processor cores other than the processor core including the assignment control unit 77 execute the program by avoiding the processor core including the assignment control unit 77. In the example of FIG. 40(b), since the processor core 1-0 includes the assignment control unit 77, the program assignment would be controlled so that the processor cores other than the processor core 1-0 (the processor core 1-1, the processor core 2-0, the processor core 2-1, the processor core 3-0, and the processor core 3-1) execute the program.

Further, when the assignment control unit 77 is included in any of the peripheral circuits 4 of the processor chips c1, c2, c3, the assignment control unit 77 may control the assignment of the program to each processor core so that the processor cores other than the processor core near to the assignment control unit 77 execute the program by avoiding the processor core near to the assignment control unit 77. In the example of FIG. 40(a), for example, when the assignment control unit 77 is arranged in the peripheral circuit 4 part near to the processor core 2-1 in the processor chip c2, the program assignment would be controlled so that the processor cores other than the processor core 2-1 (the processor core 1-0, the processor core 1-1, the processor core 2-0, the processor core 3-0, and the processor core 3-1) execute the program.

As described above, the assignment control unit 77 controls assignment of the program to each processor core by taking account of the position data of each processor core stored in the processor core position storage unit 88 in the three-dimensional integrated circuit of the eighth embodiment. The assignment of the program to each processor core by taking account of the position data suppresses the generation of the high-temperature hot spot.

8.1. (2) Second Example

Figure 41:
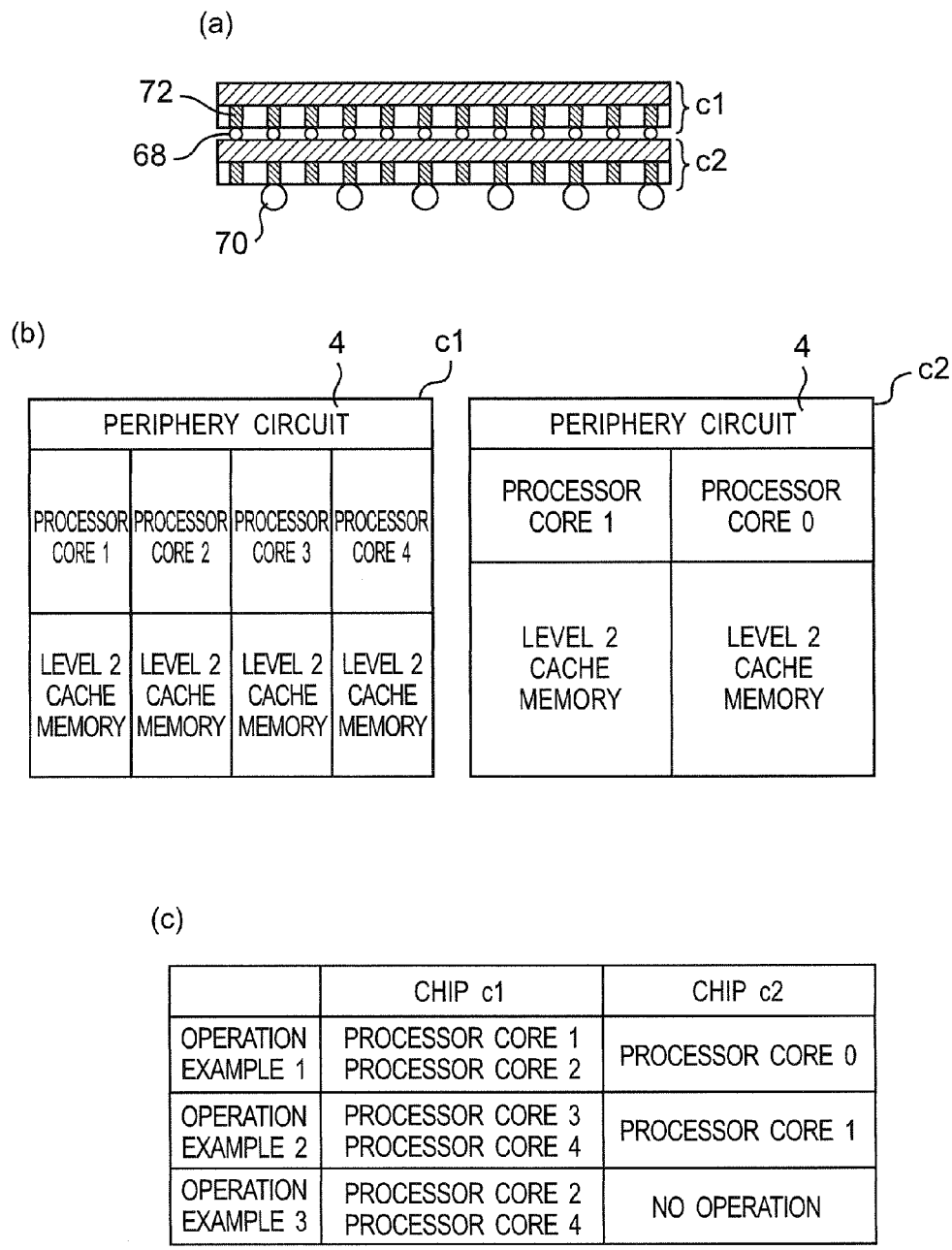
FIG. 41(a) is a side view of another example of a three-dimensional integrated circuit with two processor chips stacked according to the eighth embodiment.
FIG. 41(b) is a schematic diagram of two processor chips according to the eighth embodiment.
FIG. 41(c) is a table showing an example operation for a second example of the three-dimensional integrated circuit according to the eighth embodiment.

FIG. 41(a) is a diagram illustrating a second example of the three-dimensional integrated circuit in the eighth embodiment. The three-dimensional integrated circuit of the second example is a three-dimensional integrated circuit with two processor chips c1, c2 stacked. FIG. 41(b) is a schematic diagram of two processor chips c1, c2 according to the eighth embodiment. The processor chips with the same circuit layout are stacked in the three-dimensional integrated circuit illustrated in FIG. 39; though, the processor chips c1, c2 with different circuit layouts are stacked in the three-dimensional integrated circuit illustrated in FIG. 41. The three-dimensional integrated circuit illustrated in FIG. 41($b$) is a three-dimensional integrated circuit of six multiprocessor cores with the processor chip c1 having four processor cores and the processor chip c2 having two processor cores stacked.

Since the circuit layout is different between the processor chip c1 and the processor chip c2 in the example illustrated in FIG. 41($b$), the processor core of the processor chip c1 and the processor core of the processor chip c2 are not completely layered. In the above case, when the part inside the processor core of one of the processor chips which has larger heat value than periphery is layered on the processor core of the other processor chip, it may be determined that the parts of large heat value are vertically layered. For example, the decimal arithmetic unit or the integer arithmetic unit easily reaches a high temperature, therefore, when such a circuit block of the processor core is layered on the processor core of the other processor chip, it is considered that the processor cores are vertically layered.

When the processor cores 1, 2 of the processor chip c1 are executing the program as in the example operation 1 illustrated in the table of FIG. 41($c$), the assignment control unit 77 provided for the three-dimensional integrated circuit controls to use the processor core 0 of the processor chip c2 instead of using the processor core 1. When the assignment control unit 77 controls like that, the processor cores which generate the heat are not vertically layered, therefore, increase of the temperature of the hot spot can be suppressed.

Further, the assignment control unit 77 can control the assignment of the program to each processor core by taking account of the position data of each processor core stored in the processor core position storage unit 88 also in the second example of the three-dimensional integrated circuit of the eighth embodiment. For example, the assignment control unit 77 controls the assignment of the program to each processor core as illustrated in (1) to (4) below.

(1) Controls so that the processor cores adjacently arranged in the right-left direction do not execute the program at the same time.
(2) Controls so that, when a certain processor core is executing a program, the processor core farthest from the certain processor core executes the program subsequently to the certain processor core.
(3) Controls so that as many as the processor cores near to the heat sink execute the program.
(4) Controls so that the processor cores other than the processor core near to the assignment control unit 77 execute the program by avoiding the processor core near to the assignment control unit 77.

8.2. Summarization

The eighth embodiment relates to the three-dimensional integrated circuit with a plurality of processor chips stacked, in which the process (program) assignment is controlled by taking account of the physical relationship among individual processor cores in the three-dimensional integrated circuit. For example, the process (program) assignment is controlled so that the processor cores in the layered parts of the processor chips in the adjacent layers do not operate. Since the processor cores in the adjacent layered parts are neither layered nor concentrated as the heat source under the process (program) assignment like that, generation of the spot can be prevented.

Ninth Embodiment 9.1. Process Scheduling 9.1. (1) First Example

Figure 42:
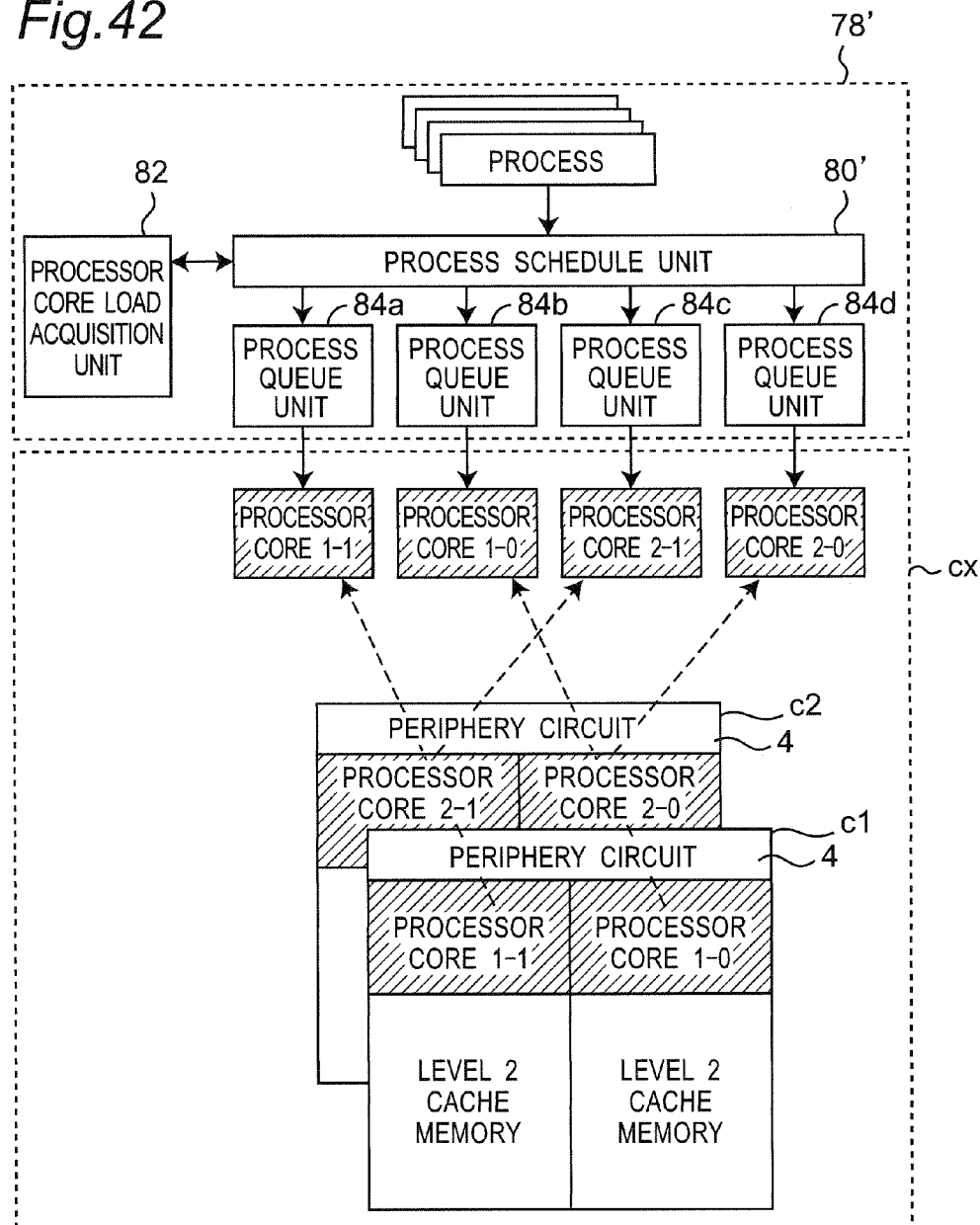
FIG. 42 is a diagram illustrating relationship between a block diagram of a conventional process scheduler and each processor chip in the three-dimensional integrated circuit with two processor chips stacked.
Figure 43:
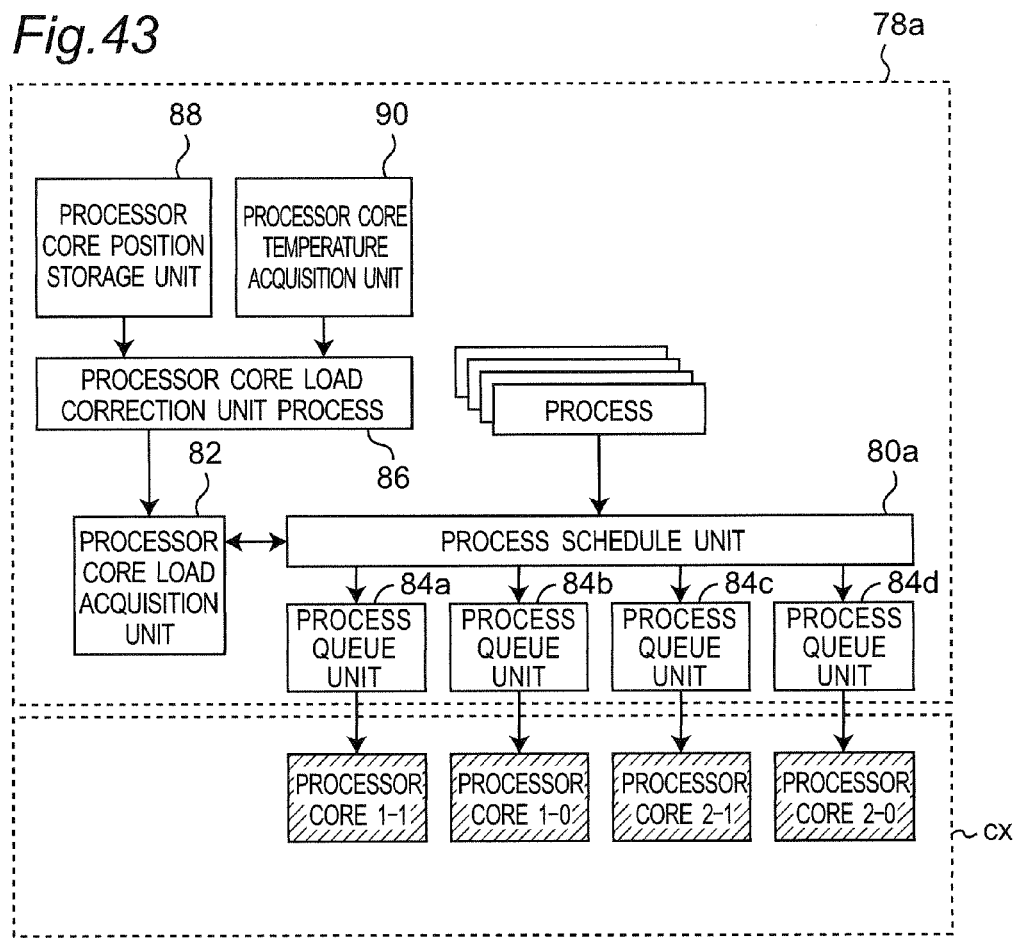
FIG. 43 is a block diagram of a process scheduler according to a ninth embodiment of the present invention.

FIG. 43 is a block diagram of a first example of a process scheduler 78$a$ according to the ninth embodiment. FIG. 42 is a diagram illustrating relationship between a block diagram of a conventional process scheduler 78' as a prerequisite of the process scheduler 78$a$ and the respective processor chips c1, c2 in the three-dimensional integrated circuit with two processor chips c1, c2 stacked.

First, a processing flow of process scheduling in the three-dimensional integrated circuit which is made of a plurality of processor chips stacked will be described by using FIG. 42. First, a plurality of processes are received on the operating system. These processes are subject to scheduling by a process schedule unit 80' and the processes are accumulated in a process queue units 84$a$, 84$b$, 84$c$, 84$d$ corresponding to the respective processor cores (the processor core 1-0, the processor core 1-1, the processor core 2-0, the processor core 2-1). The process schedule unit 80' performs scheduling based on the priority given to each process. However, in the multicore processor environment, the scheduling is performed based on the balance of the amounts of load to the respective processor cores. As a result, the process schedule unit 80' performs the scheduling by using the amounts of load to the respective processor cores acquired by a processor core load acquisition unit 82. The scheduling algorithm will not be described here.

In the process schedule unit 80$a$ in the process scheduler 78$a$ according to the ninth embodiment illustrated in FIG. 43, information on the amounts of load to the respective processor cores in the processor core load acquisition unit 82 is rewritten as required with a processor core load correction unit 86 which has the processor core position storage unit 88 and a processor core temperature acquisition unit 90.

The summary of the processing of the process schedule unit 80$a$ and the processor core load acquisition unit 82 according to the ninth embodiment will be described below. The process schedule unit 80$a$ assigns the processes to the process queue units 84$a$, 84$b$, 84$c$, 84$d$ according to the amounts of load to the respective processor cores held by the processor core load acquisition unit 82. That is, it assigns a lot of tasks (processes) to the processor cores of small amounts of load and a few tasks (processes) to the processor cores of large amounts of load.

By taking advantage of that, data in the processor core load acquisition unit 82 is rewritten so that, particularly, the amount of load to the processor core which is layered on the processor core of a temperature higher than a predetermined value as a result of stacking becomes virtually larger, i.e., becomes larger than the practical amount of load.

To realize the above, the processor core position storage unit 88 stores the position of each processor core in the three-dimensional integrated circuit. Further, the processor core temperature acquisition unit 90 is always acquiring the temperature of each processor core. Based on these two kinds of information, the data in the processor core load acquisition unit 82 is rewritten so that the amount of load to the processor core which is layered in the stacking direction on the processor core of a temperature higher than the predetermined value becomes larger than the practical amount of load. The rewriting processing is performed by the processor core load correction unit 86.

Here, it may rewrite only the amount of load to the processor core of a temperature higher than the predetermined value with a large value to operate the processor cores above and below the processor core. Further, information on the position of the heat sink may be stored in the processor core position storage unit 88. In that case, the embodiment may be adapted to cause the processor core load correction unit 86 to rewrite the amount of load to each processor core in the processor core load acquisition unit 82 so that not so much processes are assigned to the processor cores in the center of the stacking and, rather, the processes are preferentially assigned to the processor cores near to the heat sink.

Here, the processor core load correction unit 86 illustrated in FIG. 43 is for rewriting the amount of load to the objective processor core with the maximum value to suppress assignment of processes to the processor core. Here, the processor core load correction unit 86 illustrated in FIG. 43 may be for rewriting the amount of load to the objective processor core with a slightly higher value to decrease the number of processes to be assigned. In that manner, the load to the objective processor core can be reduced, therefore, the heat value can be suppressed. Further, it may be adapted to calculate a rather bigger value for information on the loading condition for rewriting based on data in the processor core temperature acquisition unit 90 and data in the processor core position storage unit 88 on that occasion. In that manner, the amount of load to the processor core which is layered on the processor core of high temperature as a result of stacking can be artificially made to appear high, therefore, since the amount of process assignment appears to be decreased, the heat value is reduced.

9.1. (2) Second Example

Figure 44:
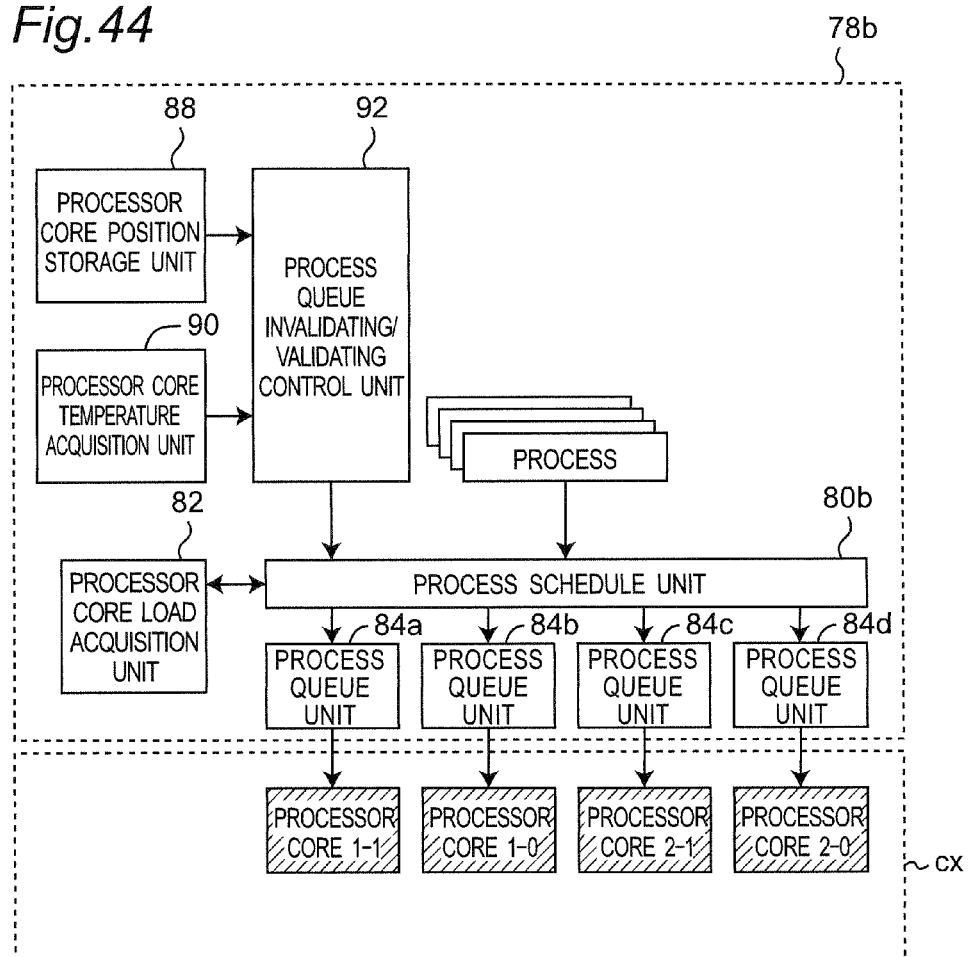
FIG. 44 is a block diagram of another example of the process scheduler according to the ninth embodiment.

FIG. 44 is a block diagram of a second example of a process scheduler 78b according to the ninth embodiment. To the process schedule unit 80b in the process scheduler 78b illustrated in FIG. 44, a process queue invalidating/validating control unit 92 which has the processor core position storage unit 88 and the processor core temperature acquisition unit 90 is connected. The process queue invalidating/validating control unit 92 invalidates/validates the process queue units 84a, 84b, 84c, 84d.

That is, in the configuration illustrated in FIG. 44, the process queue invalidating/validating control unit 92 invalidates (or validates) the process queue units 84a, 84b, 84c, 84d corresponding to the respective processor cores. The process queue invalidating/validating control unit 92 uses the position information of each processor core and the temperature information of each processor core for performing validation and invalidation.

The processor core temperature acquisition unit 90 may acquire the temperature information of each processor core from a circuit such as the thermal diode mounted on the processor chip or may estimate the temperature information of each processor core by a predetermined algorithm from the load condition, outside air temperature, and the like. The temperature information of each processor core acquired by the processor core temperature acquisition unit 90 is supplied to the process queue invalidating/validating control unit 92. Further, the process queue invalidating/validating control unit 92 judges the temperature of each processor core and the physical relationship between adjacent processor cores by using the position information of each processor core stored in the processor core position storage unit 88.

The process queue invalidating/validating control unit 92 decides the process queue unit to invalidate/validate from the temperature and the position information of each processor core. A decision procedure includes invalidating (stopping) the process queue units for the processor cores which are vertically layered on the processor core of a temperature higher than the predetermined value as a result of stacking, for example.

Further, any of control rules (1) to (11) below may be used as other decision procedures.

(1) Invalidating (stopping) the process queue units for the processor cores which are vertically layered on the processor core of the highest temperature among the currently operating processor cores as a result of stacking.

(2) Invalidating (stopping) the process queue units for the processor cores which are adjacent at top and bottom, left and right to the processor core of the highest temperature among the currently operating processor cores.

(3) Stopping the processor core of the highest temperature among the currently operating processor cores, and at the same time, validating the process queue units for the processor cores which are vertically layered on the processor core of the highest temperature among the currently operating processor cores as a result of stacking.

(4) Stopping the processor core of the highest temperature among the currently operating processor cores, and at the same time, validating the process queue units for the processor cores which are adjacent at top and bottom, left and right (including which are diagonally adjacent such as adjacent at upper left, upper right) to the processor core of the highest temperature among the currently operating processor cores.

(5) Invalidating (stopping) the process queue units for the processor cores which are vertically layered on the processor core of the temperature at a threshold value or more among the currently operating processor cores as a result of stacking.

(6) Invalidating (stopping) the process queue units for the processor cores which are adjacent at top and bottom, left and right to the processor core of the temperature at a threshold value or more among the currently operating processor cores.

(7) Stopping the processor core at the threshold value or more among the currently operating processor cores, and at the same time, validating the process queue units for the processor cores which are vertically layered on the processor core at the threshold value or more as a result of stacking.

(8) Stopping the processor core at the threshold value or more among the currently operating processor cores, and at the same time, validating the process queue units for the processor cores which are adjacent at top and bottom, left and right (including which are diagonally adjacent such as adjacent at upper left, upper right) to the processor core at the threshold value or more.

(9) Independently of the temperature, validating or invalidating the process queue units so that the processor cores adjacent to each other in the adjacent processor chips are not operating at the same time.

(10) Independently of the temperature, validating or invalidating the process queue units so that the processor cores adjacent at top and bottom, left and right to each other in the processor chips which are adjacent to each other are not operating at the same time.

(11) Making all of the processor cores available for (the first) processor chip adjacent to the heat sink, and performing the above described procedures (1) to (10) for the processor cores in the other processor chips.

According to the above described decision procedure, the process queue invalidating/validating control unit 92 controls invalidating/validating of each process queue unit. The above described processing (1) to (8) may be performed by the process schedule unit 80a illustrated in FIG. 43. In that case, validating/invalidating of the process queue unit is controlled by the processor core load acquisition unit 82.

Further, the process queue invalidating/validating control unit 92 may control to decrease the number of processes which can be executed by the processor core by changing the size of the queue without invalidating the process queue unit for the processor core. As a result, since the operation load to the processor core decreases, the temperature of the hot spot in the processor core can be suppressed.

Although the adjacent processor chip is only one (processor) chip in the examples illustrated in FIG. 43 and FIG. 44, the adjacent processor chips may be up to two chips or three chips. Further, the processor core adjacent to each other in the same processor chip may be adjacent two cores (for example, the processor core 0 and the processor core 2 are adjacent to the processor core 1) or adjacent three cores.

Further, in the three-dimensional integrated circuit with multiple processor chips stacked, the heat radiation performance (i.e., the degree of building up the heat) differs between the processor chips near to the heat sink and the other processor chips. Therefore, it is possible that all the processor cores are operated in the processor chips (the first to the third) near to the heat sink, the adjacent one processor core is stopped in each of the fourth to the fifth processor chips, the adjacent two processor cores are stopped in each of the fifth to the eighth processor chips, and the adjacent one processor core is stopped in each of the eighth to the tenth processor chips. However, the configuration does not have the eleventh processor chip but has a printed circuit board, which radiates the heat, therefore, the configuration is adapted to stop the adjacent one processor core in the last three processor chips. Incidentally, the number of processor chips "the first to the third", "the fourth to the fifth", "the fifth to the eighth", and "the eighth to the tenth" are merely examples.

Meanwhile, the heat sink not only includes the metal heat sink but also a water cooled heat sink which performs liquid cooling and an air cooled heat sink which flows air. In that case, the expression "adjacent to heat sink" would mean that the processor chip is in the part which adjacent to the coolant. For example, in the case of water cooled heat sink which flows a cooling liquid between the processor chips, the processor chip adjacent to the liquid path would be the processor chip adjacent to the heat sink.

Although it is assumed that the process scheduler 78 illustrated in FIG. 43 and FIG. 44 is implemented as a software program on the operating system for the CPU, it may be a hardware process scheduler with the same system. Also, what called the process in this description may be a task or a program.

9.1. Summarization

The ninth embodiment relates to the process scheduler for the three-dimensional integrated circuit with a plurality of processor chips stacked, in which input data to the process schedule unit is controlled where the process schedule unit controls scheduling of process to the process queue unit for each processor core. As a result, local generation of the hot spot by the processor core can be prevented.

Other Embodiments

In the description above, the parts described as the level 2 cache memory may be the level 3 cache memory or the level 4 cache memory, and do not depend on the hierarchy of the cache memory.

[Summary of an Aspect of the Invention]

(1) An integrated circuit apparatus of a first aspect of the present invention including:

a first circuit made of a memory circuit, a second circuit made of an arithmetic circuit, and a control circuit, characterized in that the first circuit is partitioned into a plurality of circuit blocks according to the distance from the arranged position of the second circuit, and the control circuit controls the partitioned respective circuit blocks separately.

(2) An integrated circuit apparatus of a second aspect of the present invention is the integrated circuit apparatus of the first aspect, characterized in that the first circuit exceeds the operable temperature range under the influence of the heat generated as a result of operation of the second circuit on the condition that the control circuit does not control.

(3) An integrated circuit apparatus of a third aspect of the present invention is the integrated circuit apparatus of the second aspect, characterized in that the memory circuit is a cache memory and the arithmetic circuit is a processor core.

(4) An integrated circuit apparatus of a fourth aspect of the present invention is the integrated circuit apparatus of the third aspect, characterized in that the control circuit controls supply and cutoff of power voltage for the partitioned respective circuit blocks separately.

(5) An integrated circuit apparatus of a fifth aspect of the present invention is the integrated circuit apparatus of the third aspect, characterized in that the control circuit controls change in power voltage for the partitioned respective circuit blocks separately.

(6) An integrated circuit apparatus of a sixth aspect of the present invention is the integrated circuit apparatus of the third aspect, characterized in that the control circuit controls clock gating for the partitioned respective circuit blocks separately.

(7) An integrated circuit apparatus of a seventh aspect of the present invention is the integrated circuit apparatus of the third aspect, characterized in that the control circuit controls change in frequency of memory clock for the partitioned respective circuit blocks separately.

(8) An integrated circuit apparatus of an eighth aspect of the present invention is the integrated circuit apparatus of the third aspect, characterized in that the control circuit controls change in duty cycle of the memory clock for the partitioned respective circuit blocks separately.

(9) An integrated circuit apparatus of a ninth aspect of the present invention is the integrated circuit apparatus of the third aspect, characterized in that the control circuit controls a chip select signal for a sub-array in the partitioned respective circuit blocks separately.

(10) An integrated circuit apparatus of a tenth aspect of the present invention is the integrated circuit apparatus of the third aspect, characterized in that the control circuit controls the partitioned respective circuit blocks separately based on the temperature in each of the circuit blocks.

(11) An integrated circuit apparatus of an eleventh aspect of the present invention is the integrated circuit apparatus of the third aspect, characterized in that the control circuit controls the partitioned respective circuit blocks separately based on a time measured by a timer provided for each of the circuit blocks.

(12) An integrated circuit apparatus of a twelfth aspect of the present invention is the integrated circuit apparatus of the third aspect, characterized in that the control circuit controls the partitioned respective circuit blocks separately based on the frequency of clock supplied to the second circuit.

(13) An integrated circuit apparatus of a thirteenth aspect of the present invention is the integrated circuit apparatus of the third aspect, characterized in that the control circuit controls the partitioned respective circuit blocks separately based on the rate of operation of the arithmetic circuit in the second circuit.

(14) An integrated circuit apparatus of a fourteenth aspect of the present invention is the integrated circuit apparatus of the third aspect, characterized in that the control circuit controls the partitioned respective circuit blocks separately based on the cache miss rate of the cache memory.

(15) An integrated circuit apparatus of a fifteenth aspect of the present invention is the integrated circuit apparatus of the third aspect, characterized in that the control circuit is arranged in the position adjacent to the first circuit which is farthest from the second circuit.

(16) An integrated circuit apparatus of a sixteenth aspect of the present invention is the integrated circuit apparatus of the third aspect, characterized in that the control circuit is arranged in a different chip.

(17) An integrated circuit apparatus of a seventeenth aspect of the present invention is the integrated circuit apparatus of the third aspect, characterized in that the control circuit is arranged on the periphery of the same chip on the side farthest from the second circuit.

(18) An integrated circuit apparatus of an eighteenth aspect of the present invention is the integrated circuit apparatus of the third aspect, further including a heat sink, characterized in that the control circuit is arranged in the layer of the chip nearest to the heat sink.

(19) A three-dimensional integrated circuit of a nineteenth aspect of the present invention including a first chip and a second chip which is directly stacked on the first chip, characterized in that the first chip includes a circuit block with a relatively large heat value and a circuit block with a relatively small heat value, the second chip includes a circuit block with a relatively large heat value and a circuit block with a relatively small heat value, and the first chip and the second chip are arranged to each other and stacked so that the overlapping layered area of the circuit block with a relatively large heat value in the first chip and the circuit block with a relatively large heat value in the second chip is minimized.

(20) A three-dimensional integrated circuit of a twentieth aspect of the present invention made of two or more chips stacked, wherein at least two chips among the stacked chips have the same circuit block layout, and the at least two chips are arranged in different orientation among layers.

(21) A three-dimensional integrated circuit of a twenty-first aspect of the present invention is the three-dimensional integrated circuit of the twentieth aspect, characterized in that in the at least two chips with the same circuit block layout one of the chips is stacked in the different orientations by 90 degrees or 180 degrees from the other chip.

(22) A three-dimensional integrated circuit of a twenty-second aspect of the present invention is the three-dimensional integrated circuit of the twentieth aspect, characterized in that the at least two chips with the same circuit block layout are processor chips forming a multi-core system.

(23) A three-dimensional integrated circuit of a twenty-third aspect of the present invention is the three-dimensional integrated circuit of the twenty-second aspect, characterized in that in the at least two processor chips one of the processor chips is stacked in the different orientations by 90 degrees or 180 degrees from the other chip.

(24) A three-dimensional integrated circuit of a twenty-fourth aspect of the present invention is the three-dimensional integrated circuit of the twenty-third aspect, characterized in that a first area in which level 2 cache memories which are vertically adjacent to each other in stacking is partitioned in each of the at least two processor chips, and the partitioned first area is separately controlled in each of the processor chips.

(25) A three-dimensional integrated circuit of a twenty-fifth aspect of the present invention is the three-dimensional integrated circuit of the twenty-fourth aspect, characterized in that the partitioned first area is made of a level 3 cache memory.

(26) A three-dimensional integrated circuit of a twenty-sixth aspect of the present invention is the three-dimensional integrated circuit of the twenty-fifth aspect, characterized in that the partitioned first area is made of a high-speed cache memory.

(27) A three-dimensional integrated circuit of a twenty-seventh aspect of the present invention is the three-dimensional integrated circuit of the twenty-fourth aspect, characterized in that in each of the at least two processor chips the second area vertically adjacent to the processor core in stacking is made of a cache memory of low power consumption.

(28) A three-dimensional integrated circuit of a twenty-eighth aspect of the present invention is the three-dimensional integrated circuit of the twenty-fifth aspect, further including a control circuit, characterized in that the control circuit is arranged in the first area.

(29) A three-dimensional integrated circuit of a twenty-ninth aspect of the present invention including a first chip and a second chip which is directly stacked on the first chip, characterized in that the first chip includes a circuit block with a relatively large heat value and a circuit block with a relatively small heat value, the second chip includes a circuit block with a relatively large heat value and a circuit block with a relatively small heat value, and the first chip and the second chip are arranged to each other and stacked so that the circuit block with a relatively large heat value in the first chip and the circuit block with a relatively large heat value in the second chip are not vertically layered.

(30) A three-dimensional processor device of a thirtieth aspect of the present invention including
a plurality of stacked processor chips and an assignment control unit, characterized in that
each processor chip has one or more processor cores,
the assignment control unit includes a processor core position storage unit which stores data on a position of each processor core in the three-dimensional processor device, and
the assignment control unit controls assignment of a program to each processor core based on the data on the position of each processor core stored in the processor core position storage unit.

(31) A three-dimensional processor device of a thirty-first aspect of the present invention is the three-dimensional processor device of the thirtieth aspect, characterized in that
the assignment control unit controls the assignment of the program to each processor core so that the processor cores adjacently arranged in the vertical direction in the stacked processor chips do not execute the program at the same time.

(32) A three-dimensional processor device of a thirty-second aspect of the present invention is the three-dimensional processor device of the thirtieth aspect, characterized in that
the assignment control unit controls the assignment of the program to each processor core so that the processor cores adjacently arranged in the right-left direction in the stacked processor chips do not execute the program at the same time.

(33) A three-dimensional processor device of a thirty-third aspect of the present invention is the three-dimensional processor device of the thirtieth aspect, characterized in that
the assignment control unit controls the assignment of the program to each processor core so that the processor cores adjacently arranged in the right-left direction in the stacked processor chips do not execute the program at the same time.

(34) A three-dimensional processor device of a thirty-fourth aspect of the present invention is the three-dimensional processor device of the thirtieth aspect, characterized in that
the assignment control unit controls the assignment of the program to each processor core so that, when one processor core is executing the program, the processor core farthest from the processor core which is executing the program executes the program subsequently to the processor core which is executing the program.

(35) A three-dimensional processor device of a thirty-fifth aspect of the present invention is the three-dimensional processor device of the thirtieth aspect, further including
a heat sink, characterized in that
the assignment control unit controls the assignment of the program to each processor core so that the processor cores near to the heat sink take priority of executing the program.

(36) A three-dimensional processor device of a thirty-sixth aspect of the present invention is the three-dimensional processor device of the thirtieth aspect, characterized in that
the assignment control unit is included in one of the processor cores, and
the assignment control unit controls the assignment of the program to each processor core so that the processor cores other than the processor core including the assignment control unit execute the program by avoiding the processor core including the assignment control unit.

(37) A three-dimensional processor device of a thirty-seventh aspect of the present invention is the three-dimensional processor device of the thirtieth aspect, characterized in that
the plurality of processor chips have the same circuit block layout.

(38) A process scheduler of a thirty-eighth aspect of the present invention for
a plurality of processor cores in a three-dimensional multicore processor device with a plurality of processor chips stacked, including:
a load acquisition unit which acquires an amount of load in each processor core;
a schedule unit which schedules a process in each process queue unit corresponding to each processor core in the three-dimensional multicore processor device based on the amount of load to each processor core;
a load correction unit which corrects the amount of load to each processor core in the processor core load acquisition unit;
a position storage unit which stores the position of each processor core; and
a temperature acquisition unit which acquires the temperature of each processor core,
wherein
the load correction unit corrects the amount of load to each processor core in acquiring the amount of load, by using the position information of each processor core stored in the position storage unit and the temperature information of each processor core acquired by the temperature acquisition unit.

(39) A process scheduler of a thirty-ninth aspect of the present invention is the process scheduler of the thirty-eighth aspect, characterized in that
the load correction unit corrects the amount of load to a processor core which is vertically adjacent to the processor core of the temperature higher than a predetermined value to cause the schedule unit to stop scheduling, by using the position information of each processor core stored in the position storage unit and the temperature information of each processor core acquired by the temperature acquisition unit.

(40) A process scheduler of a fortieth aspect of the present invention for
a plurality of processor cores in a three-dimensional multicore processor device with a plurality of processor chips stacked, including:
a process queue unit which performs process queue to each processor core to cause each processor core to execute a process in order;
a queue invalidating/validating control unit which controls each invalidation/validation of the process queue unit;
a position storage unit which stores the position of each processor core; and
a temperature acquisition unit which acquires the temperature of each processor core,
wherein
the queue invalidating/validating control unit controls invalidation/validation of the process queue unit by using the position information of each processor core stored in the position storage unit and the temperature information of each processor core acquired by the temperature acquisition unit.

(41) A process scheduler of a forty-first aspect of the present invention is the process scheduler of the fortieth aspect, characterized in that
the queue invalidating/validating control unit invalidates the process queue unit for a processor core which is vertically adjacent to the processor core of the temperature higher than a predetermined value, by using the position information of each processor core stored in the position storage unit and the temperature information of each processor core acquired by the temperature acquisition unit.

INDUSTRIAL APPLICABILITY

It is preferable that a circuit structure and a control method for cooling a high temperature part of a processor chip, a chip layout and a circuit layout in which heat generating circuits are arranged so as not to be layered on each other in different layers of chips, and a method of limiting operations and process assignment of each circuit so as not to generate a hot spot on a chip according to the present disclosure are used for a three-dimensional integrated circuit.

DESCRIPTION OF REFERENCE CHARACTERS 4 peripheral circuit
6 operation control circuit
12 tag mask circuit
14 sub-array of SRAM
16 SRAM array
66 heat sink
78a, 78b process scheduler
80a, 80b process schedule unit
82 processor core load acquisition unit
86 processor core load correction unit
88 processor core position storage unit
90 processor core temperature acquisition unit
92 process queue invalidating/validating control unit
c1, c2, c3 processor chip

What is claimed is:

1. An integrated circuit apparatus, comprising:
a first circuit made of a memory circuit, a second circuit made of an arithmetic circuit, and a control circuit,
wherein the first circuit is partitioned into a plurality of circuit blocks according to the direction of conduction by the heat generated as a result of operation of the second circuit,
wherein the control circuit controls the partitioned respective circuit blocks separately, and
wherein the control circuit controls each of said plurality of circuit blocks independently for the first circuit not to exceed an operable temperature range under influence of heat generated as a result of operation of the second circuit.

2. The integrated circuit apparatus according to claim 1, wherein
the control circuit controls supply, cutoff and/or change of power voltage for the partitioned respective circuit blocks separately.

3. The integrated circuit apparatus according to claim 2, wherein
the control circuit controls each of said plurality of circuit blocks independently, based on a temperature inside each circuit block, a time period measured by a timer included in each circuit block, a frequency of a clock signal supplied to said second circuit, and/or a rate of operation of the arithmetic circuit in said second circuit.

4. The integrated circuit apparatus according to claim 1, wherein
said integrated circuit apparatus is a three-dimensional integrated circuit which is made of more than two chips stacked, and further comprises a heat sink, and
the control circuit is arranged in the chip at the stacked position nearest to said heat sink.

5. The integrated circuit apparatus according to claim 1, wherein
the memory circuit is made of cache memory,
the cache memory in the same layer is partitioned to the plurality of circuit blocks, and
the arithmetic circuit is a processor core.

* * * * *